United States Patent
Ikeda

(10) Patent No.: US 9,876,946 B2
(45) Date of Patent: Jan. 23, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventor: Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/220,486

(22) Filed: Jul. 27, 2016

(65) Prior Publication Data

US 2017/0041517 A1    Feb. 9, 2017

(30) Foreign Application Priority Data

Aug. 3, 2015    (JP) .................. 2015-153120

(51) Int. Cl.
*H04N 3/14*    (2006.01)
*H04N 5/335*    (2011.01)
(Continued)

(52) U.S. Cl.
CPC ....... *H04N 5/2253* (2013.01); *H01L 27/1225* (2013.01); *H01L 27/14607* (2013.01);
(Continued)

(58) Field of Classification Search
CPC .. H04N 5/2253; H04N 5/369; H01L 27/1225; H01L 29/78648; H01L 27/14636; H01L 29/7869; H01L 27/14616; H01L 27/14607
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — Yogesh Aggarwal
(74) *Attorney, Agent, or Firm* — Fish & Richardson P.C.

(57) ABSTRACT

An imaging device with low power consumption is provided. A pixel circuit has a configuration of detecting difference data between data of a reference frame and data of a target frame in a pixel, and a peripheral circuit has a configuration of efficiently converting the difference data by A/D conversion so as to obtain high compressibility. Difference data which is encoded by compression is written into a memory element and read sequentially. At this time, the frequency of a clock signal can be lowered in accordance with the amount of data. The read data is expanded and the expanded data is added to the reference frame to constitute an image.

20 Claims, 50 Drawing Sheets

(51) Int. Cl.
    *H04N 5/225* (2006.01)
    *H01L 27/146* (2006.01)
    *H01L 29/786* (2006.01)
    *H04N 5/369* (2011.01)
    *H01L 27/12* (2006.01)

(52) U.S. Cl.
    CPC .. *H01L 27/14616* (2013.01); *H01L 27/14636* (2013.01); *H01L 29/7869* (2013.01); *H01L 29/78648* (2013.01); *H04N 5/369* (2013.01)

(58) Field of Classification Search
    USPC ........ 348/294–324; 250/208.1; 257/290–292
    See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,818,933 B2* | 11/2004 | Henderson | H04N 5/3575 257/184 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,378,391 B2 | 2/2013 | Koyama et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,836,626 B2 | 9/2014 | Ikeda | |
| 8,916,869 B2 | 12/2014 | Koyama et al. | |
| 9,055,245 B2 | 6/2015 | Kozuma | |
| 9,099,562 B2 | 8/2015 | Akimoto et al. | |
| 9,111,824 B2 | 8/2015 | Ikeda | |
| 9,331,112 B2 | 5/2016 | Koyama et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308805 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0261235 A1* | 10/2009 | Lahav | H04N 5/35572 250/208.1 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0104851 A1 | 5/2011 | Akimoto et al. | |
| 2011/0121290 A1 | 5/2011 | Akimoto et al. | |
| 2015/0332568 A1 | 11/2015 | Kurokawa | |
| 2015/0340392 A1 | 11/2015 | Ikeda | |
| 2015/0340513 A1 | 11/2015 | Akimoto et al. | |
| 2015/0380451 A1 | 12/2015 | Kurokawa | |
| 2016/0021314 A1 | 1/2016 | Kurokawa et al. | |
| 2016/0064443 A1 | 3/2016 | Inoue et al. | |
| 2016/0064444 A1 | 3/2016 | Inoue et al. | |
| 2016/0133660 A1 | 5/2016 | Inoue et al. | |
| 2016/0134789 A1 | 5/2016 | Inoue et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-119711 A | 6/2011 |
| JP | 2013-042482 A | 2/2013 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Apply. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178, Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "SPINEL,YbFe2O4, and Yb2Fe3O7 Types of Structures for Compounds in the In2O3 and Sc2O3-A2O3-BO Systems [A; Fe, Ga, Or Al; B: Mg, Mn, Fe, Ni, Cu,Or Zn] at Temperatures over 1000° C.", Journal of Solid State Chemistry, 1985, vol. 60, pp. 383-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-cryst. Solids (Journal of Non-crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers", J. Electrochem. Soc. (Journal of Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Funatsu.R et al., "133Mpixel 60fps CMOS Image Sensor with 32-Column Shared High-Speed Column-Parallel SAR ADCs", ISSCC 2015 (Digest of Technical Papers. IEEE International Solid-State Circuits Conference), Feb. 23, 2015, pp. 112-113.

* cited by examiner

FIG. 31A1
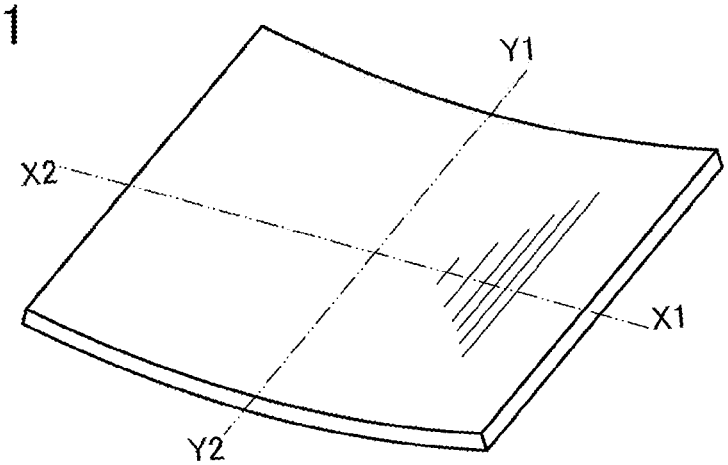
FIG. 31A2
FIG. 31A3
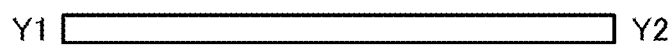
FIG. 31B1
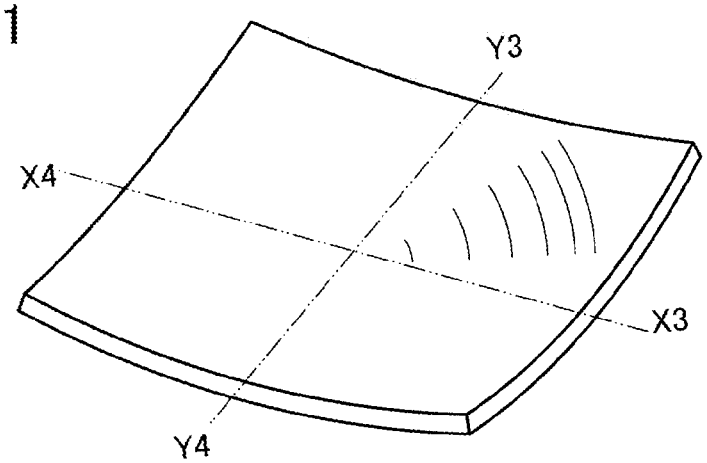
FIG. 31B2
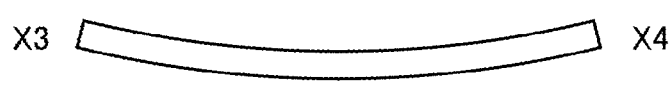
FIG. 31B3

FIG. 41A
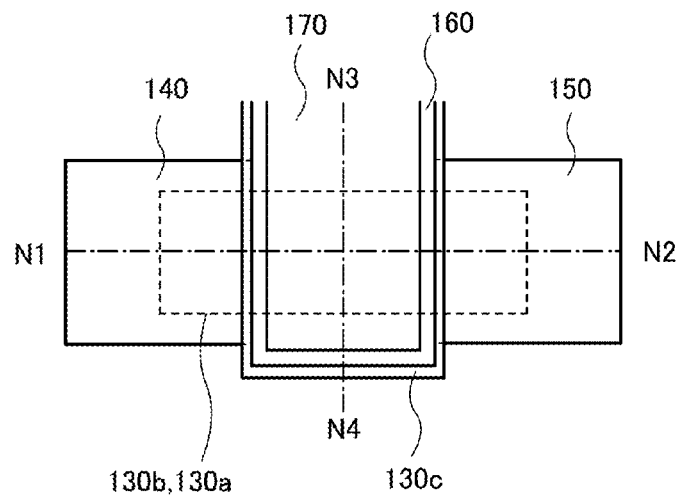
FIG. 41B
FIG. 41C
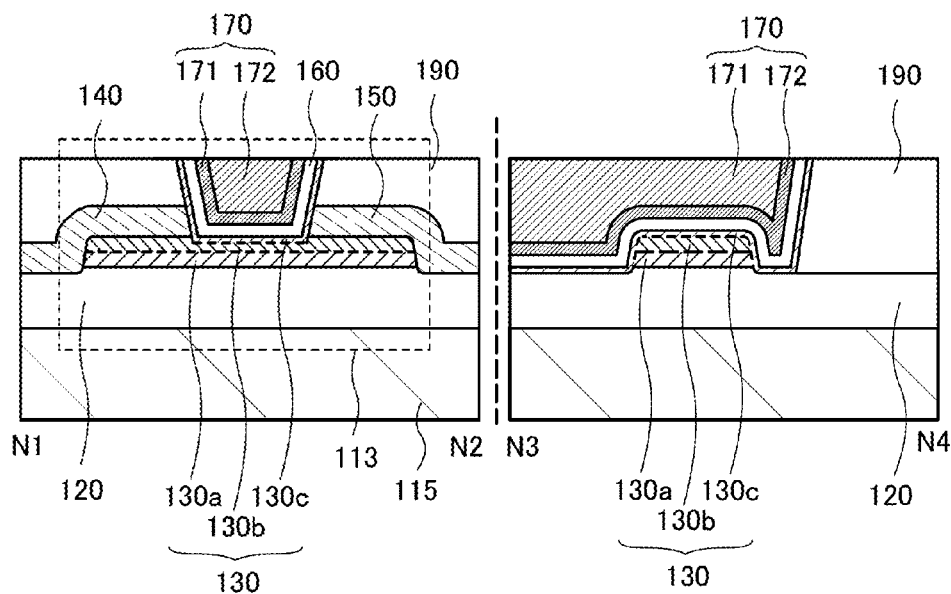

Derived from substrate
out-of-plane method CAAC-OS
(009)

in-plane method φ scan CAAC-OS in-plane method φ scan Single crystal OS (009)

FIG. 46A
FIG. 46B
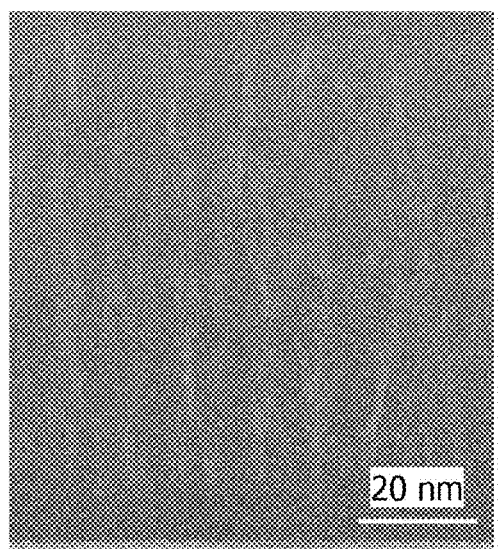
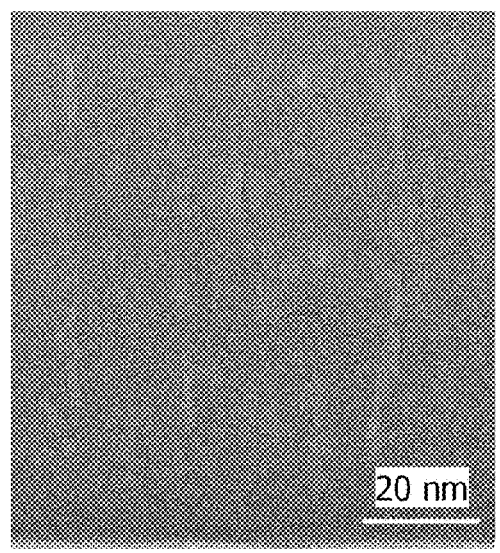

US 9,876,946 B2

IMAGING DEVICE AND ELECTRONIC DEVICE

BACKGROUND OF THE INVENTION

1. Field of the Invention

One embodiment of the present invention relates to an imaging device and an operation method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

As a semiconductor material applicable to a transistor, an oxide semiconductor has been attracting attention. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

Non-Patent Document 1 discloses a technique relating to a complementary metal oxide semiconductor (CMOS) image sensor with one hundred and thirty-three million pixels corresponding to 8K4K imaging.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119711

Non-Patent Document

[Non-Patent Document 1] R. Funatsu, et al., 133 *Mpixel 60 fps CMOS Image Sensor with 32-Column Shared High-Speed Column-Parallel SAR ADCs*, IEEE ISSCC Dig. Tech. Papers, 2015

SUMMARY OF THE INVENTION

The amount of data in a high-definition image such as an image with 8K4K resolution is enormous, and it is preferable to compress the data so that the amount of data transmission can be reduced.

The load in data transmission is reduced by the compression of data obtained in an imaging device; however, digital image processing that is needed for the compression of data consumes a large amount of power.

In view of the above, an object of one embodiment of the present invention is to provide an imaging device with low power consumption. Another object is to provide an imaging device in which difference data between consecutive frames is obtained. Another object is to provide an imaging device capable of compressing image data efficiently. Another object is to provide an imaging device capable of taking an image with little noise. Another object is to provide an imaging device that is suitable for a high-speed operation. Another object is to provide an imaging device with high resolution. Another object is to provide a highly integrated imaging device. Another object is to provide an imaging device capable of imaging under a low illuminance condition. Another object is to provide an imaging device with a wide dynamic range. Another object is to provide an imaging device that can be used in a wide temperature range. Another object is to provide an imaging device with a high aperture ratio. Another object is to provide an imaging device with high reliability. Another object is to provide a novel imaging device or the like. Another object is to provide a method for driving any of the imaging devices. Another object is to provide a novel semiconductor device or the like.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention relates to an imaging device capable of compressing imaging data by obtaining difference data between frames.

One embodiment of the present invention is an imaging device including a pixel, a first circuit, a second circuit, and a third circuit. The pixel is configured to output a first potential held in a charge accumulation portion. The pixel is configured to output a second potential held in the charge accumulation portion. The first potential corresponds to difference data between imaging data of a first frame and imaging data of a second frame. The second potential corresponds to data when the charge accumulation portion is initialized. The first circuit is configured to output a third potential that is obtained by adding or subtracting, to or from a reference potential, an absolute value of a difference between the first potential and the second potential. The second circuit is configured to convert the third potential into n (n is a natural number of 1 or more)-bit first digital data. The second circuit is configured to convert a magnitude of the third potential with respect to the reference potential into 1-bit second digital data. The second circuit is configured to output n+1-bit digital data that is a combination of the first digital data and the second digital data. The third circuit is configured to store the n+1-bit digital data by compression.

The pixel includes a first transistor, a second transistor, a third transistor, a fourth transistor, a fifth transistor, a first capacitor, a second capacitor, a third capacitor, and a photoelectric conversion element. One electrode of the photoelectric conversion element is electrically connected to one of a source and a drain of the first transistor. The other of the source and the drain of the first transistor is electrically connected to one of a source and a drain of the second transistor. The other of the source and the drain of the first transistor is electrically connected to one electrode of the first capacitor. The other of the source and the drain of the first transistor is electrically connected to one electrode of the second capacitor. The other electrode of the second capacitor is electrically connected to one of a source and a drain of the third transistor. The other electrode of the second capacitor is electrically connected to a gate electrode of the fourth transistor. The other electrode of the second capacitor is electrically connected to one electrode of the third capacitor. One of a source and a drain of the fourth transistor is electrically connected to one of a source and a drain of the fifth transistor.

Each of the first to third transistors may contain an oxide semiconductor in a region where a channel is formed. The oxide semiconductor preferably contains In, Zn, and M (M is Al, Ti, Ga, Sn, Y, Zr, La, Ce, Nd, or Hf).

The first circuit includes a sixth transistor, a seventh transistor, a fourth capacitor, and a fifth capacitor. One of a source and a drain of the sixth transistor is electrically connected to one of a source and a drain of the seventh transistor. The one of the source and the drain of the sixth transistor is electrically connected to one electrode of the fourth capacitor. The other of the source and the drain of the seventh transistor is electrically connected to one electrode of the fifth capacitor. The other electrode of the fourth capacitor is electrically connected to the pixel.

The second circuit includes a first comparator circuit, a second comparator circuit, an OR circuit, a first latch circuit, a second latch circuit, a counter circuit, a first wiring, a second wiring, a third wiring, and first to (n+1)-th (n is a natural number of 1 or more) buffer circuits. The first comparator circuit includes a first input terminal, a second input terminal, and a first output terminal. The second comparator circuit includes a third input terminal, a fourth input terminal, and a second output terminal. The OR circuit includes a fifth input terminal, a sixth input terminal, and a third output terminal. The first latch circuit includes a seventh input terminal, an eighth input terminal, and a fourth output terminal. The second latch circuit includes a ninth input terminal, a tenth input terminal, and a fifth output terminal. The counter circuit includes an eleventh input terminal, a twelfth input terminal, and n sixth output terminals. The first wiring is capable of supplying a first reference potential. The second wiring is capable of supplying a second reference potential. The third wiring is capable of supplying a clock signal. The first input terminal is electrically connected to the first circuit. The second input terminal is electrically connected to the first wiring. The third input terminal is electrically connected to the second wiring. The fourth input terminal is electrically connected to the first circuit. The first output terminal is electrically connected to the fifth input terminal. The first output terminal is electrically connected to the seventh input terminal. The second output terminal is electrically connected to the sixth input terminal. The eighth input terminal is electrically connected to the third wiring. The fourth output terminal is electrically connected to the ninth input terminal. The tenth input terminal is electrically connected to the third output terminal. The fifth output terminal is electrically connected to an input terminal of the (n+1)-th buffer circuit. The eleventh input terminal is electrically connected to the third output terminal. The twelfth input terminal is electrically connected to the third wiring. The n sixth output terminals are electrically connected to respective input terminals of the first to n-th buffer circuits.

The third circuit includes a memory element array, a fourth circuit, a fifth circuit, a sixth circuit, a seventh circuit, an eighth circuit, a ninth circuit, a tenth circuit, an eleventh circuit, a twelfth circuit, a thirteenth circuit, a fourteenth circuit, and a fifteenth circuit. The fourth circuit is configured to perform an encoding process on input digital data. The fifth circuit is configured to temporarily store encoded digital data. The sixth circuit is configured to divide digital data of plural bits to 1-bit digital data. The seventh circuit is configured as a writing row decoder. The eighth circuit is configured as a writing column decoder. The ninth circuit is configured as a reading row decoder. The tenth circuit is configured as a reading column decoder. The eleventh circuit is configured to control a writing address of the memory element array. The twelfth circuit is configured to control a reading address of the memory element array. The thirteenth circuit is configured to calculate digital data corresponding to a difference between the address specified by the fourth circuit and the address specified by the fifth circuit. The fourteenth circuit is configured to convert the digital data into analog data. The fifteenth circuit is configured to generate a clock signal having a different frequency based on the analog data.

Digital data stored in the third circuit is preferably subjected to Run-length compression or Huffman compression.

For a photoelectric conversion layer of the photoelectric conversion element, selenium or a compound containing selenium can be used. For example, amorphous selenium or crystalline selenium can be used as selenium.

According to one embodiment of the present invention, an imaging device with low power consumption can be provided. An imaging device in which difference data between consecutive frames is obtained can be provided. An imaging device capable of compressing image data efficiently can be provided. An imaging device capable of taking an image with little noise can be provided. An imaging device that is suitable for a high-speed operation can be provided. An imaging device with high resolution can be provided. A highly integrated imaging device can be provided. An imaging device capable of imaging under a low illuminance condition can be provided. An imaging device with a wide dynamic range can be provided. An imaging device that can be used in a wide temperature range can be provided. An imaging device with a high aperture ratio can be provided. An imaging device with high reliability can be provided. A novel imaging device or the like can be provided. A method for driving any of the imaging devices can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

FIGS. 31A1, 31A2, 31A3, 31B1, 31B2, and 31B3 illustrate bent imaging devices.

FIGS. 41A to 41C are a top view and cross-sectional views illustrating a transistor.

FIGS. 46A and 46B are cross-sectional TEM images of an a-like OS.

DETAILED DESCRIPTION OF THE INVENTION

Figure 1A:
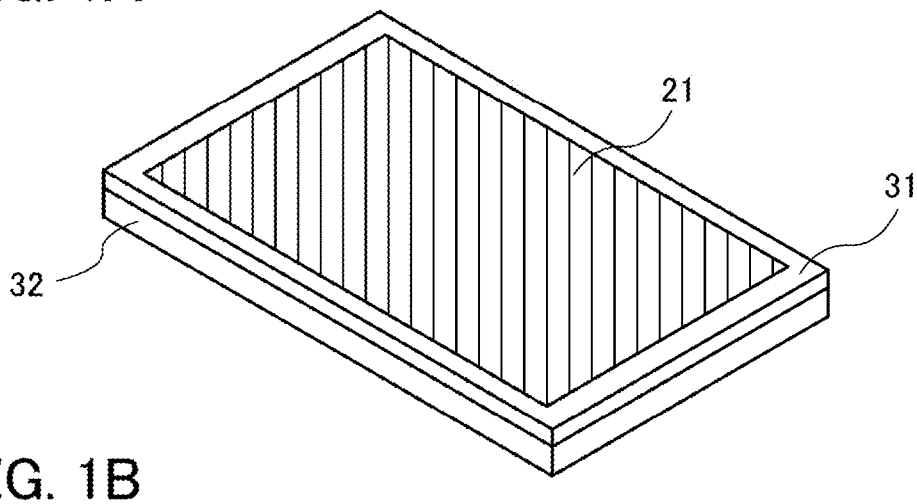
FIGS. 1A to 1C are a perspective view and top views illustrating an imaging device.

Embodiments are described in detail with reference to drawings. Note that the present invention is not limited to the following description and it is readily appreciated by those skilled in the art that modes and details can be modified in various ways without departing from the spirit and the scope of the present invention. Therefore, the present invention should not be construed as being limited to the description of the embodiments below. Note that in structures of the invention described below, the same portions or portions having similar functions are denoted by the same reference numerals in different drawings, and description thereof is not repeated in some cases. The same components are denoted by different hatching patterns in different drawings, or the hatching patterns are omitted in some cases.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers that specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention will be described with reference to drawings.

Embodiments of the present invention are a configuration of a pixel circuit capable of detecting difference data between data of a reference frame and data of a target frame in a pixel, a configuration of a peripheral circuit capable of efficiently converting the difference data by A/D conversion so as to obtain high compressibility, and operation methods thereof. Difference data which is encoded by compression is written into a memory element and read sequentially. At this time, the frequency of a clock signal can be lowered in accordance with the amount of data. The read data is expanded by an external circuit and the expanded data is added to the reference frame to constitute an image.

Therefore, power consumption of an imaging device of one embodiment of the present invention can be reduced because image data can be compressed efficiently and the clock frequency can be lowered as appropriate, for example. The peripheral circuit is provided with a circuit for reducing noise, which enables an image with little noise to be taken even under a low illuminance condition.

Figure 1B:
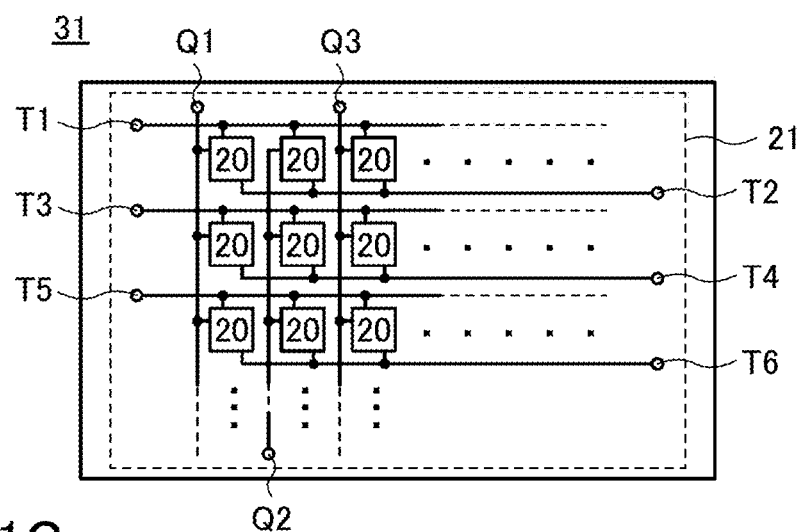
Figure 1C:
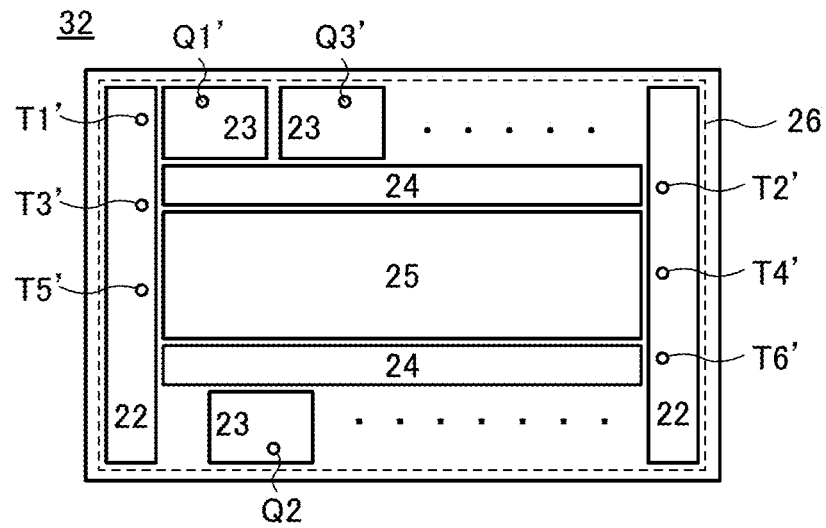

FIG. 1A is an external perspective view of an imaging device of one embodiment of the present invention. The imaging device has a stacked-layer structure including layers 31 and 32. FIG. 1B is a top view of the layer 31 and FIG. 1C is a top view of the layer 32.

The layer 31 includes a pixel array 21 in which a plurality of pixel circuits 20 arranged in a matrix. A terminal T is provided at one end portion of a row wiring connected to each pixel circuit 20. A terminal Q is provided at one end portion of a column wiring connected to each pixel circuit 20. That is, the number of terminals T corresponds to that of rows, and the number of terminals Q corresponds to that of columns. Note that T1 to T6 and Q1 to Q3 are illustrated as examples of the terminal T and the terminal Q, respectively, in FIGS. 1A to 1C and the like.

The layer 32 includes a peripheral circuit 26 (e.g., circuits 22, 23, 24, and 25) for driving the pixel array 21, converting data, reading data, and storing data. Here, the circuit 22 is provided with terminals T' whose number corresponds to that of rows. The number of circuits 23 corresponds to that of columns. That is, the number of terminals Q' corresponds to that of columns. Note that T1' to T6' and Q1' to Q3' are illustrated as examples of the terminal T and the terminal Q, respectively, in FIGS. 1A to 1C and the like.

Figure 2:
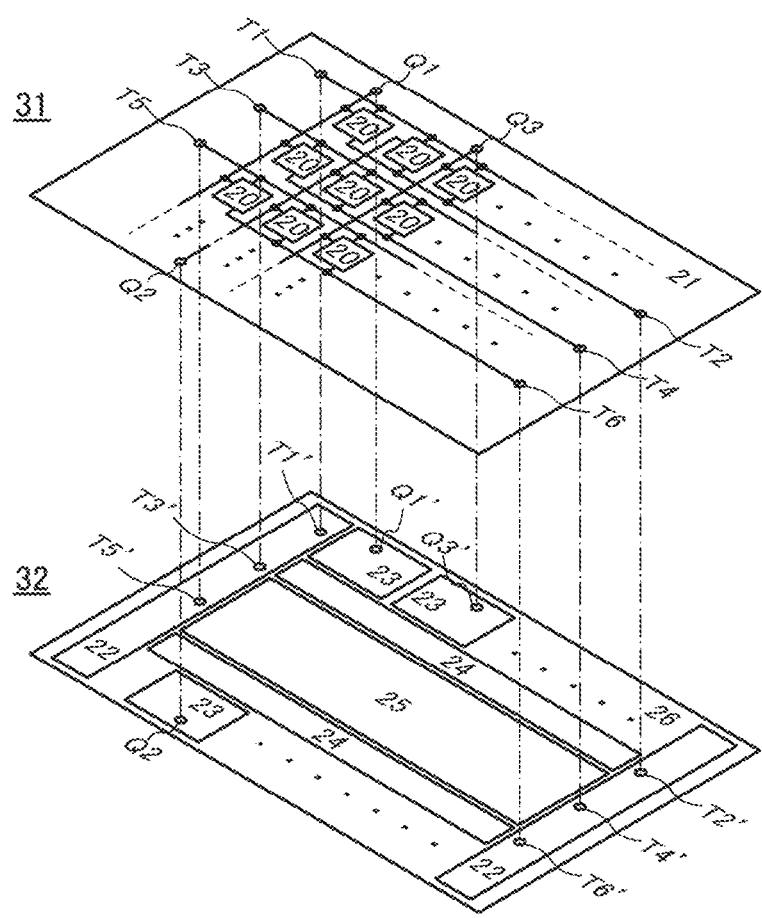
FIG. 2 illustrates a connection mode of a terminal.

The layers 31 and 32 are provided to overlap with each other. As illustrated in FIG. 2, the terminals T and T' are arranged to overlap with each other to have electrical connection therebetween, and the same applies to the terminals Q and Q'. With such a configuration, the wiring lengths can be shortened and influence of wiring resistance, parasitic capacitance, or the like can be reduced, so that a high-speed operation or power saving can be achieved. Moreover, the pixel circuits 20 and the wirings can be provided over the peripheral circuit 26; thus, the imaging device can be miniaturized. Note that part of the peripheral circuit 26 may be provided outside the layer 32.

To achieve both a high-speed operation and the configuration of a CMOS circuit, the circuits 22 to 25 are preferably formed using transistors including silicon (hereinafter referred to as Si transistors). For example, a silicon substrate is used as the layer 32, over which the above circuits are formed. The pixel array 21 is preferably formed using transistors including an oxide semiconductor (hereinafter referred to as OS transistors). Note that some of the transistors included in the circuits 22 to 25 may be provided on the same surface as the pixel array 21.

FIGS. 1A to 1C illustrate an example in which the peripheral circuit 26 for driving the pixel array 21 is not divided. In contrast, it is necessary to drive the peripheral circuit 26 at high speed to drive numerous pixels as in 8K4K resolution. In such a case, it is preferable to divide the peripheral circuit 26 into a plurality of peripheral circuits to be driven in parallel.

Figure 3A:
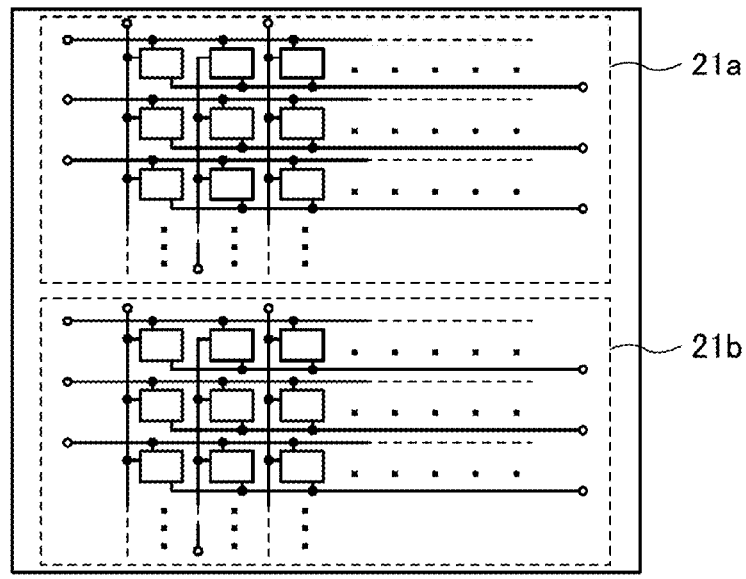
FIGS. 3A and 3B are top views illustrating an imaging device.
Figure 3B:
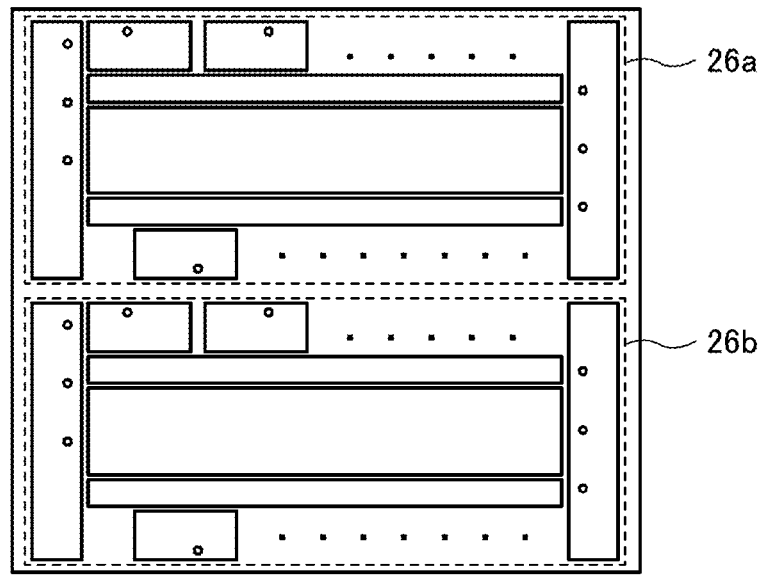

For example, as illustrated in FIG. 3A, the entire pixel array is divided into pixel arrays 21a and 21b. As illustrated in FIG. 3B, the layer 32 is provided with a peripheral circuit 26a corresponding to the pixel array 21a and a peripheral circuit 26b corresponding to the pixel array 21b. The peripheral circuit 26 is thus divided and operations of the divided peripheral circuits are performed in parallel, so that the clock frequency can be lowered.

Figure 4A:
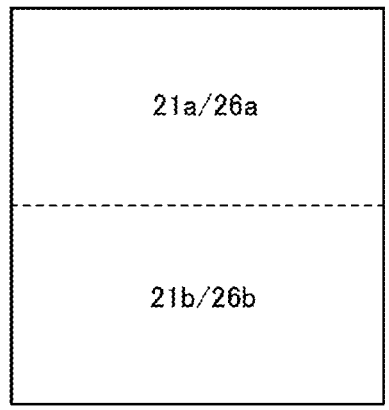
FIGS. 4A to 4E are top views each illustrating a dividing mode of a pixel array and a peripheral circuit.
Figure 4B:
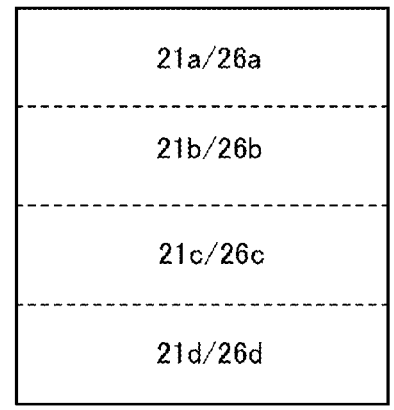
Figure 4C:
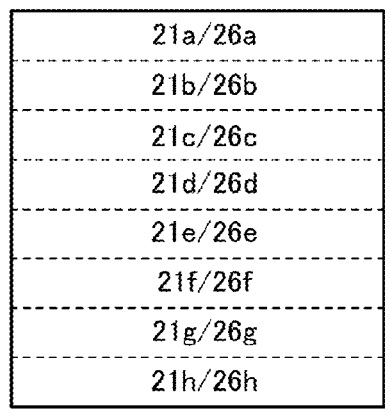
Figure 4D:
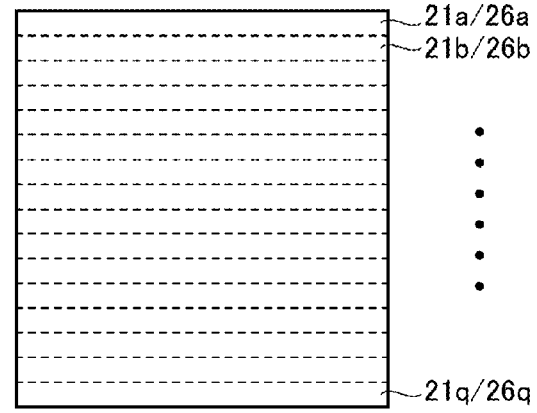
Figure 4E:
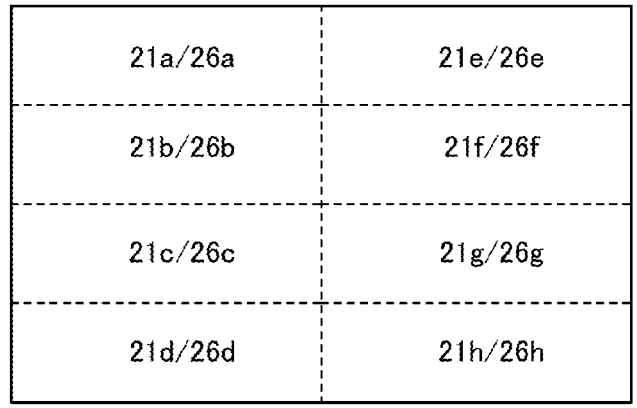

In FIGS. 3A and 3B, the pixel array 21 is divided into the two pixel arrays 21a and 21b and the peripheral circuit 26 is divided into the two peripheral circuits 26a and 26b as illustrated in FIG. 4A; however, the division number is not limited to two. For example, as illustrated in FIG. 4B, the pixel array 21 may be divided into four pixel arrays 21a to 21d and the peripheral circuit 26 may be divided into four peripheral circuits 26a to 26d. Alternatively, as illustrated in FIG. 4C, the pixel array 21 may be divided into eight pixel arrays 21a to 21h and the peripheral circuit 26 may be divided into eight peripheral circuits 26a to 26h. As illustrated in FIG. 4D, the pixel array 21 may be divided into 16 pixel arrays 21a to 21q and the peripheral circuit 26 may be divided into 16 peripheral circuits 26a to 26q. Alternatively, the pixel array 21 and the peripheral circuit 26 can be divided into, for example, 32 pixel arrays and 32 peripheral circuits by a given number which can equally divide the number of pixels in the perpendicular direction. Further alternatively, as illustrated in FIG. 4E, the pixel array 21 and the peripheral circuit 26 may be divided in the horizontal and perpendicular directions.

Figure 5A:
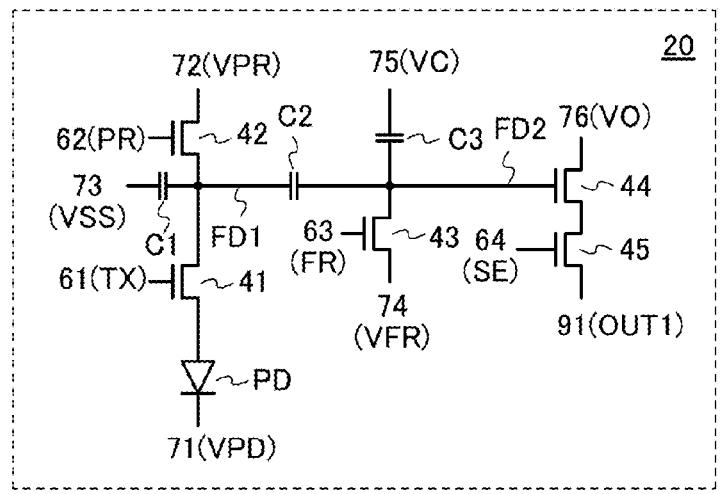
FIGS. 5A and 5B are a circuit diagram illustrating a pixel of an imaging device and a timing chart illustrating the operation of an imaging device.

FIG. 5A is a circuit diagram of the pixel circuit 20. In the pixel circuit 20, one electrode of a photoelectric conversion element PD is electrically connected to one of a source and a drain of a transistor 41. The other of the source and the drain of the transistor 41 is electrically connected to one of a source and a drain of a transistor 42. The other of the source and the drain of the transistor 41 is electrically connected to one electrode of a capacitor C1. The other of the source and the drain of the transistor 41 is electrically connected to one electrode of a capacitor C2. The other electrode of the capacitor C2 is electrically connected to one of a source and a drain of a transistor 43. The other electrode of the capacitor C2 is electrically connected to a gate electrode of a transistor 44. The other electrode of the capacitor C2 is electrically connected to one electrode of a capacitor C3. One of a source and a drain of the transistor 44 is electrically connected to one of a source and a drain of a transistor 45.

Here, a node FD1 to which the other of the source and the drain of the transistor 41, the one of the source and the drain of the transistor 42, the one electrode of the capacitor C1, and the one electrode of the capacitor C2 are connected is a first charge accumulation portion. Furthermore, a node FD2 to which the other electrode of the capacitor C2, the one of the source and the drain of the transistor 43, the gate electrode of the transistor 44, and the one electrode of the capacitor C3 are connected is a second charge accumulation portion.

The other electrode of the photoelectric conversion element PD is electrically connected to a wiring 71 (VPD). The other of the source and the drain of the transistor 42 is electrically connected to a wiring 72 (VPR). The other electrode of the capacitor C1 is electrically connected to a wiring 73 (VSS). The other of the source and the drain of the transistor 43 is electrically connected to a wiring 74 (VFR). The other electrode of the capacitor C3 is electrically connected to a wiring 75 (VC). The other of the source and the drain of the transistor 44 is electrically connected to a wiring 76 (VO). The other of the source and the drain of the transistor 45 is electrically connected to a wiring 91 (OUT1).

The wiring 71 (VPD), the wiring 72 (VPR), the wiring 73 (VSS), the wiring 74 (VFR), the wiring 75 (VC), and the wiring 76 (VO) can function as power supply lines. For example, the wiring 72 (VPR), the wiring 73 (VSS), the wiring 74 (VFR), and the wiring 75 (VC) can function as low-potential power supply lines, and the wiring 71 (VPD) and the wiring 76 (VO) can function as high-potential power supply lines.

A gate electrode of the transistor 41 is electrically connected to a wiring 61 (TX). A gate electrode of the transistor 42 is electrically connected to a wiring 62 (PR). A gate electrode of the transistor 43 is electrically connected to a wiring 63 (FR). A gate electrode of the transistor 45 is electrically connected to a wiring 64 (SE).

The wiring 61 (TX), the wiring 62 (PR), the wiring 63 (FR), and the wiring 64 (SE) can each function as a signal line that controls conduction of the transistor.

The transistor 41 functions as a transfer transistor for controlling the potential of the node FD1 in response to the output of the photoelectric conversion element PD. The transistor 42 can function as a reset transistor for initializing the potential of the node FD1. The transistor 43 can function as a reset transistor for initializing the potential of the node FD2. The transistor 44 can function as an amplifying transistor for outputting a signal corresponding to the potential of the node FD2. The transistor 45 can function as a selection transistor for selecting the pixel circuit 20.

Note that the above configuration of the pixel circuit 20 is just an example, and some of the transistors, some of the capacitors, some of the wirings, or the like are not included in some cases. Alternatively, a transistor, a capacitor, a wiring, or the like that is not included in the above configuration might be included. Alternatively, connection between some wirings might be different from the above connection.

Figure 5B:
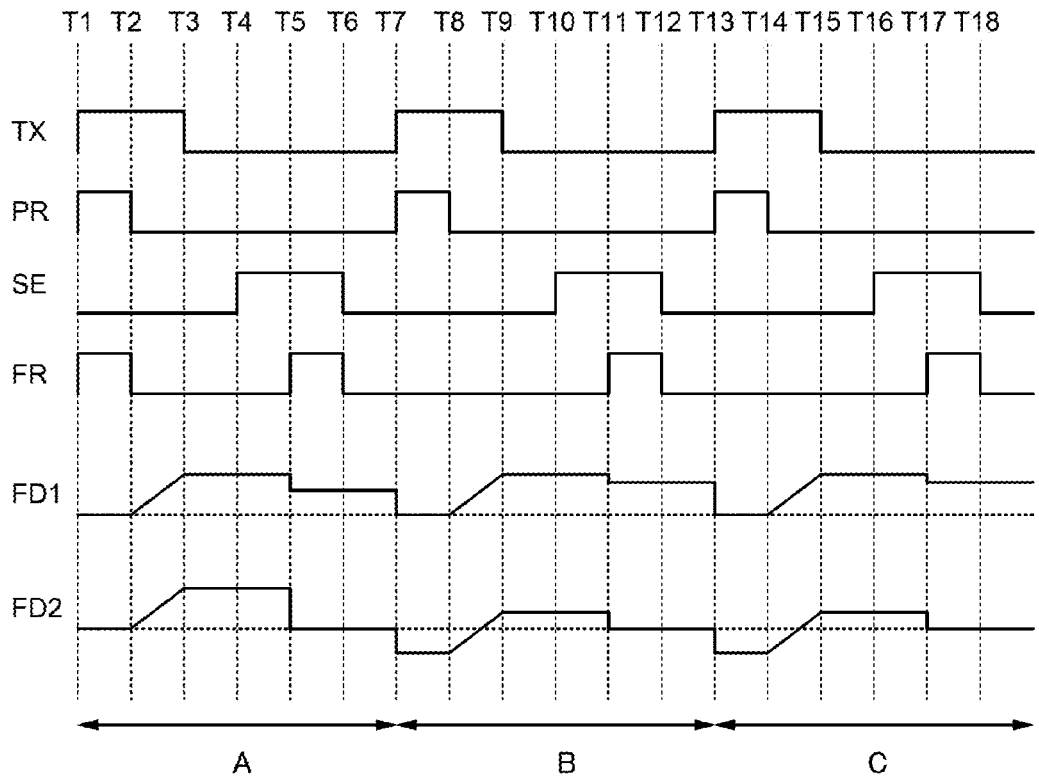

Next, an example of the operation of the pixel circuit 20 in FIG. 5A is described with reference to a timing chart in FIG. 5B. A period A (Time T1 to Time T6) corresponds to a period in which data of the reference frame is obtained, a period B (Time T7 to Time T12) corresponds to a period in which difference data of a first frame is obtained, and a period C (Time T13 to Time T18) corresponds to a period in which difference data of a second frame is obtained. Note that the wiring 71 (VPD) and the wiring 76 (VO) are each set to a high potential ("H"), and the wiring 72 (VPR), the wiring 73 (VSS), the wiring 74 (VFR), and the wiring 75 (VC) are each set to a low potential ("L").

First, the capturing operation of imaging data of the reference frame in the period A is described. At Time T1, when the potentials of the wiring 61 (TX), the wiring 62 (PR), and the wiring 63 (FR) are each set to "H", the node FD1 is reset to the potential of the wiring 72 (VPR) and the node FD2 is reset to the potential of the wiring 74 (VFR).

At Time T2, when the wiring 62 (PR) and the wiring 63 (FR) are each set to "L", the potential of the node FD1 starts to rise in accordance with illuminance. The potential of the node FD2 also starts to rise by capacitive coupling. At this time, a change of the potential of the node FD1 is assumed to be multiplied by a and transmitted to the node FD2.

At Time T3, when the wiring 61 (TX) is set to "L", the potentials of the node FD1 and the node FD2 are held. At this time, when the potential of the node FD1 is set to x, the potential of the node FD2 is ax. Table 1 shows the potentials of the node FD1 and the node FD2 in each time. Note that a reset potential is set to 0.

TABLE 1

| T1 T3 T5 | T7 | T9 | T11 | T13 | T15 |
|---|---|---|---|---|---|
| FD1 | 0 x (1 − ab)x | 0 | x | (1 − a²b²)x | 0 | x |
| FD2 | 0 ax 0 | (a²b − a)x | a²bx | 0 | (a³b² − a)x | a³b²x |

At Time T4, when the wiring 64 (SE) is set to "H", a signal (an image signal) which corresponds to the potential of the node FD2 is output to the wiring 91 (OUT1).

At Time T5, when the wiring 63 (FR) is set to "H", the node FD2 is reset to the potential of the wiring 74 (VFR), and a signal which corresponds to the reset potential (a reset signal) is output to the wiring 91 (OUT1).

A difference between the two signals output to the wiring 91 (OUT1) at Time T4 and Time T5 is obtained by operation of a circuit 28 described later. The difference corresponds to a net image signal from which noise in a pixel is removed. The above is the capturing operation of imaging data of the reference frame.

Note that at Time T5, when the potential of the node FD2 is reset to the potential of the wiring 74 (VFR), the potential of the node FD1 is also reduced by the capacitive coupling. At this time, when a change of the potential of the node FD2 is assumed to be multiplied by b and transmitted to the node FD1, the potential of the node FD1 is (1−ab)x.

Next, operation of obtaining difference data of the first frame in the period B is described. Note that the case where difference data of the first fame is 0, i.e., the same image as the reference frame is obtained is described here. At Time T7, when the wiring 61 (TX) and the wiring 62 (PR) are each set to "H", the node FD1 is reset to the potential of the wiring 72 (VPR) and thus the potential of the node FD2 is (a²b−a)x by the capacitive coupling.

At Time T8, when the wiring 62 (PR) is set to "L", the potential of the node FD1 starts to rise in accordance with illuminance. The potential of the node FD2 also starts to rise by the capacitive coupling.

At Time T9, when the wiring 61 (TX) is set to "L", the potentials of the node FD1 and the node FD2 are held. At this time, when the potential of the node FD1 is set to x, the potential of the node FD2 is $a^2bx$.

At Time T10, when the wiring 64 (SE) is set to "H", a signal (an image signal) which corresponds to the potential of the node FD2 is output to the wiring 91 (OUT1).

At Time T11, when the wiring 63 (FR) is set to "H", the node FD2 is reset to the potential of the wiring 74 (VFR), and a signal which corresponds to the reset potential (a reset signal) is output to the wiring 91 (OUT1). The above is the operation of obtaining difference data of the first frame.

Next, operation of obtaining difference data of the second frame in the period C is described. Note that the case where difference data of the second fame is 0 is described here. At Time T13, when the wiring 61 (TX) and the wiring 62 (PR) are each set to "H", the node FD1 is reset to the potential of the wiring 72 (VPR) and thus the potential of the node FD2 is $(a^2b^2-a)x$ by the capacitive coupling.

At Time T14, when the wiring 62 (PR) is set to "L", the potential of the node FD1 starts to rise in accordance with illuminance. The potential of the node FD2 also starts to rise by the capacitive coupling.

At Time T15, when the wiring 61 (TX) is set to "L", the potentials of the node FD1 and the node FD2 are held. At this time, when the potential of the node FD1 is set to x, the potential of the node FD2 is $a^2b^2x$.

At Time T16, when the wiring 64 (SE) is set to "H", a signal (an image signal) which corresponds to the potential of the node FD2 is output to the wiring 91 (OUT1).

At Time T17, when the wiring 63 (FR) is set to "H", the node FD2 is reset to the potential of the wiring 74 (VFR), and a signal which corresponds to the reset potential (a reset signal) is output to the wiring 91 (OUT1). The above is the operation of obtaining difference data of the second frame.

Through the above operation, difference data between the data of the reference frame and the data of the following frame can be detected. Note that in the case where the difference data is 0, the potential of the node FD2 at Time 9, Time 15, or the like is preferably close to a reset potential; however, the potential of the node FD2 differs from the reset potential owing to the capacitive coupling. Thus, it is preferable to capture net imaging data by correcting the potential of the node FD2. Such correction is preferably performed when the data of the reference frame and the difference data are combined by hardware processing, software processing, or the like of the external circuit.

Note that in some cases, the correction is not necessary when capacitance of the node FD1 is increased as much as possible. Also in the general design range, accumulation of potential change does not matter when b is much smaller than 1.

For example, when the capacitance of the capacitor C1 is 52 fF, the capacitance of the capacitor C2 is 29 fF, and the capacitance of the capacitor C3 is 2 fF, the following equations can be satisfied: $a=29/(29+2)=0.94$ and $b=29/(29+52)=0.36$. Therefore, the potential of the node FD2 at Time T9 is $a^2bx=0.32x$ and that at Time T15 is $a^3b^2x=0.11x$, and becomes closer to 0 every time difference data is obtained. When the imaging device can obtain 13-bit image data, it is not necessary to correct the potential of the node FD2 in an eighth frame when difference data is obtained at the eighth time because the gray level at that time is 1 or less. Similarly, correction is not necessary in a sixth frame in the imaging device that can obtain 10-bit image data and in a fifth frame in the imaging device that can obtain 8-bit image data. That is, although depending on the number of bits of image data, frame memories that require correction are limited.

In addition, when changes of the potentials of the node FD1 at Time T8 and Time T14 are assumed y and z, respectively, the potential of the node FD2 at Time T9 is $V_{FD2}=(a^2b-a)x+ay$. The following equation can be obtained because a and b are constants and x is a known value that is read in the reference frame: $y=(V_{FD2}-(a^2b-a)x)/a$. At Time T15, the potential of the node FD2 satisfies the equation of $V_{FD2}=(a^3b^2-a^2b)x+(a^2b-a)y+az$. The following equation can be obtained can be obtained because x and y are known numbers: $z=(V_{FD2}-(a^3b^2-a^2b)x-(a^2b-a)y)/a$. In this manner, the original value can be obtained in the external circuit by calculation. In the example where b is 0.36, calculation may be performed using data of 8 frames.

Figure 6A:
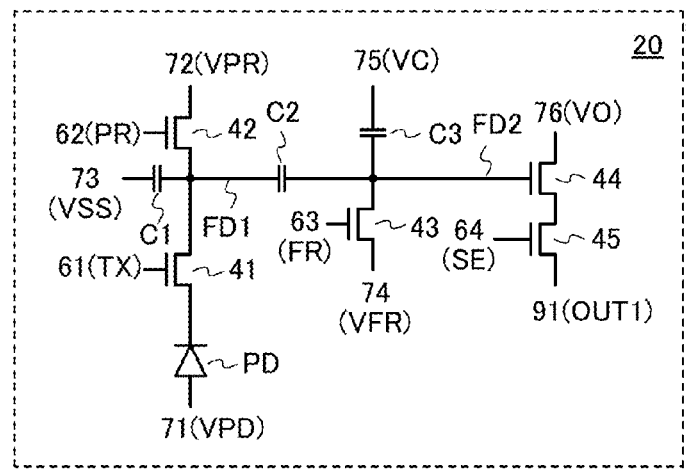
FIGS. 6A and 6B are a circuit diagram illustrating a pixel of an imaging device and a timing chart illustrating the operation of an imaging device.
Figure 6B:
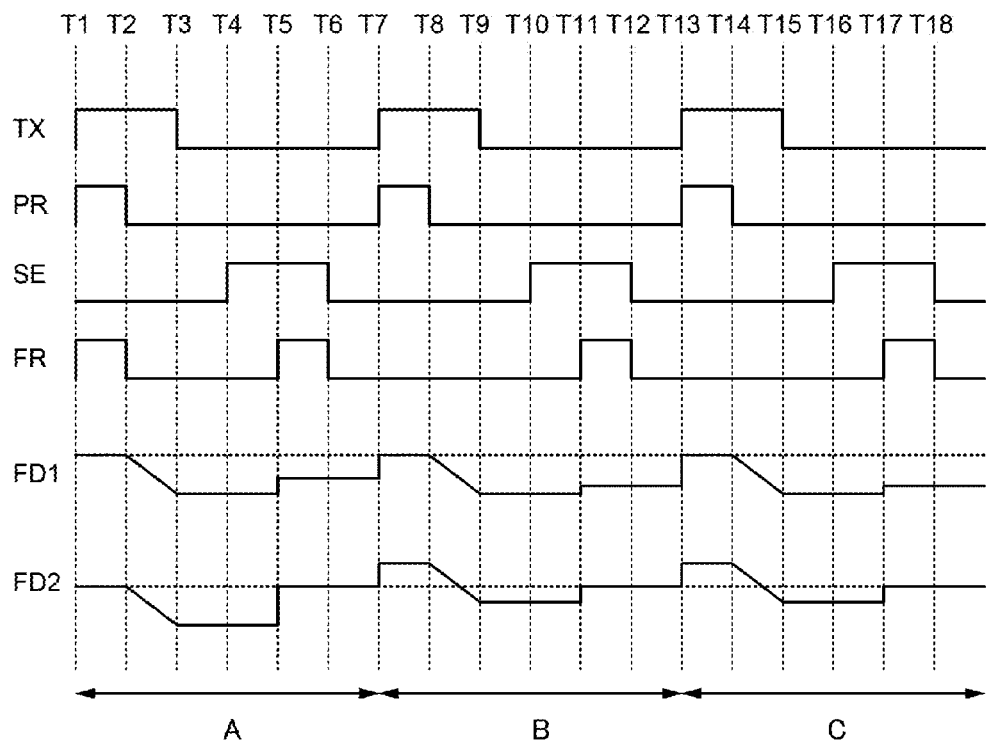

Further, the pixel circuit 20 may have a configuration illustrated in FIG. 6A. The connection direction of the photoelectric conversion element PD in the pixel circuit 20 in FIG. 6A is different from that in the pixel circuit 20 in FIG. 5A. In this case, the pixel circuit 20 can operate in accordance with the timing chart in FIG. 6B. Note that the wiring 72 (VPR), the wiring 74 (VFR), and the wiring 76 (VO) are each set to a high potential ("H"), and the wiring 71 (VPD), the wiring 73 (VSS), and the wiring 75 (VC) are each set to a low potential ("L").

The potentials of the node FD1 and the node FD2 at each time is as shown in Table 2. Note that the potentials of the node FD1 at Time T3, Time T9, and Time T15 are each set to −x, and it is assumed that a change of the potential of the node FD1 is multiplied by a and transmitted to the node FD2 and a change of the potential of the node FD2 is multiplied by b and transmitted to the node FD1. In this configuration, the original value of the node FD2 can be obtained by performing correction as necessary.

TABLE 2

|  | T1 | T3 | T5 | T7 | T9 | T11 | T13 | T15 |
|---|---|---|---|---|---|---|---|---|
| FD1 | 0 | −x | (ab − 1)x | 0 | −x | $(a^2b^2 − 1)x$ | 0 | −x |
| FD2 | 0 | −ax | 0 | $(a − a^2b)x$ | $−a^2bx$ | 0 | $(a − a^3b^2)x$ | $−a^3b^2x$ |

The peripheral circuit 26 includes the circuit 22 (row driver) having a function of driving the pixel circuits 20, the circuit 23 having a function of removing noise from analog data output from the pixel circuit 20 and converting the noise-free analog data into digital data, the circuit 24 (column driver) having a function of selecting a pixel column from which the digital data is read, and the circuit 25 having a function of storing the digital data (see FIG. 1C).

Figure 7:
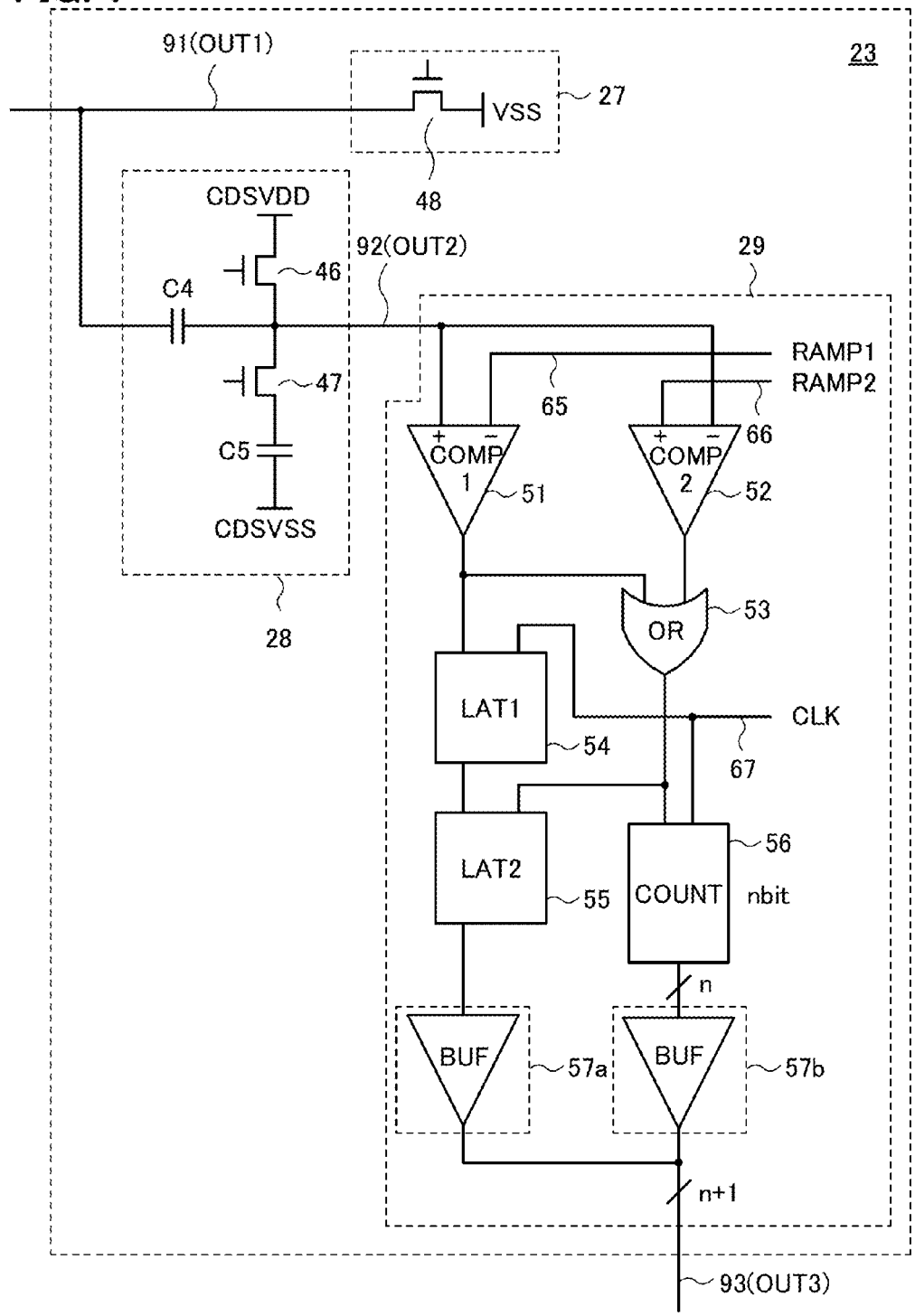
FIG. 7 is a circuit diagram illustrating a CDS circuit and a block diagram illustrating an A/D converter circuit.

FIG. 7 is a circuit diagram and a block diagram illustrating one embodiment of the circuit 23. The circuit 23 includes a circuit 27 serving as a current source that allows the pixel circuit 20 to output an appropriate signal potential to the wiring 91 (OUT1), the circuit 28 (CDS circuit) for performing correlated double sampling (CDS) on a signal output to the wiring 91 (OUT1), and a circuit 29 (an A/D converter circuit) having a function of converting analog data output from the circuit 28 into digital data. Note that a configuration not including the circuit 28 can also be employed.

The circuit 27 includes a transistor 48, and the wiring 91 (OUT1) is electrically connected to one of a source and a drain of the transistor 48 and a power supply line is electrically connected to the other of the source and the drain. As the power supply line, a low-potential power supply line can be used, for example.

The circuit 28 can have a configuration including transistors 46 and 47 and capacitors C4 and C5. One of a source and a drain of the transistor 46 is electrically connected to one of a source and a drain of a transistor 47. The one of the source and the drain of the transistor 46 is electrically connected to one electrode of the capacitor C4. The other of the source and the drain of the transistor 47 is electrically connected to one electrode of the capacitor C5. The other electrode of the capacitor C4 is electrically connected to the wiring 91 (OUT1). The other of the source and the drain of the transistor 46 is electrically connected to a high-potential power supply line (CDSVDD), for example. The other electrode of the capacitor C5 is electrically connected to a low-potential power supply line (CDSVSS), for example.

An operation example of the circuit 28 in the case where the pixel circuit 20 in FIG. 5A is used is described. First, the transistor 48 of the circuit 27 is turned on, and the transistors 46 and 47 of the circuit 28 are turned on. Then, the potential of imaging data is output from the pixel circuit 20 to the wiring 91 (OUT1) and the reference potential (CDSVDD) is held in a wiring 92 (OUT2). After that, the transistor 46 is turned off, and a reset potential (here, a potential lower than the potential of the imaging data, for example, a GND potential) is output from the pixel circuit 20 to the wiring 91 (OUT1). At this time, the wiring 92 (OUT2) has a potential obtained by subtracting, from the reference potential (CDSVDD), the absolute value of a difference between the potential of the imaging data and the reset potential. Thus, a potential signal with little noise that is obtained by subtracting the net potential of the imaging data from the reference potential (CDSVDD) can be supplied to the circuit 29.

Note that when the reset potential is higher than the potential of the imaging data (e.g., a VDD potential), the wiring 92 (OUT2) has a potential that is obtained by adding, to the reference potential (CDSVDD, the absolute value of the difference between the potential of the imaging data and the reset potential.

The circuit 29 includes a comparator circuit 51 (COMP1), a comparator circuit 52 (COMP2), an OR circuit 53 (OR), a latch circuit 54 (LAT1), a latch circuit 55 (LAT2), a counter circuit 56 (COUNT), a wiring 65 (RAMP1), a wiring 66 (RAMP2), a wiring 67 (CLK), a buffer circuit 57a (BUF), and a buffer circuit 57b (BUF). Note that the number of buffer circuits 57b (BUF) can be n (n is a natural number of 1 or more) when the number of bits of the counter circuit 56 (COUNT) is set to n. Therefore, digital data of n+1 bit can be output from the circuit 29.

The comparator circuit 51 (COMP1) includes a first input terminal (+), a second input terminal (−), and a first output terminal. The comparator circuit 52 (COMP2) includes a third input terminal (+), a fourth input terminal (−), and a second output terminal. The OR circuit 53 (OR) includes a fifth input terminal, a sixth input terminal, and a third output terminal. The latch circuit 54 (LAT1) includes a seventh input terminal, an eighth input terminal, and a fourth output terminal. The latch circuit 55 (LAT2) includes a ninth input terminal, a tenth input terminal, and a fifth output terminal. The counter circuit 56 (COUNT) includes an eleventh input terminal, a twelfth input terminal, and n sixth output terminals.

In the comparator circuit 51 (COMP1), the first input terminal (+) is electrically connected to the wiring 92 (OUT2), the second input terminal (−) is electrically connected to the wiring 65 (RAMP1), and the first output terminal is electrically connected to the fifth input terminal of the OR circuit 53 (OR) and the seventh input terminal of the latch circuit 54 (LAT1).

In the comparator circuit 52 (COMP2), the third input terminal (+) is electrically connected to the wiring 66 (RAMP2), the fourth input terminal (−) is electrically connected to the wiring 92 (OUT2), and the second output terminal is electrically connected to the sixth input terminal of the OR circuit 53 (OR).

In the OR circuit 53 (OR), the third output terminal is electrically connected to the tenth input terminal of the latch circuit 55 (LAT2) and the eleventh input terminal of the counter circuit 56 (COUNT).

In the latch circuit 54 (LAT1), the eighth input terminal is electrically connected to the wiring 67 (CLK) and the twelfth terminal of the counter circuit 56 (COUNT), and the fourth output terminal is electrically connected to the ninth input terminal of the latch circuit 55 (LAT2).

In the latch circuit 55 (LAT2), the fifth output terminal is electrically connected to an input terminal of the buffer circuit 57a (BUF).

In the counter circuit 56 (COUNT), the n sixth output terminals are electrically connected to respective input terminals of the n buffer circuits 57b.

Figure 8A:
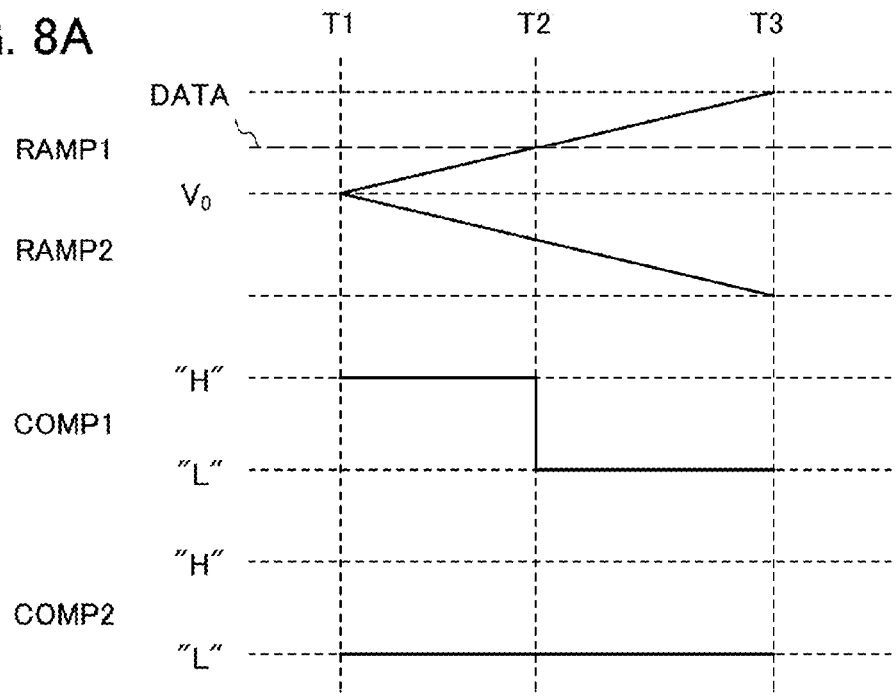
FIGS. 8A and 8B are timing charts each illustrating the operation of a comparator circuit.
Figure 8B:
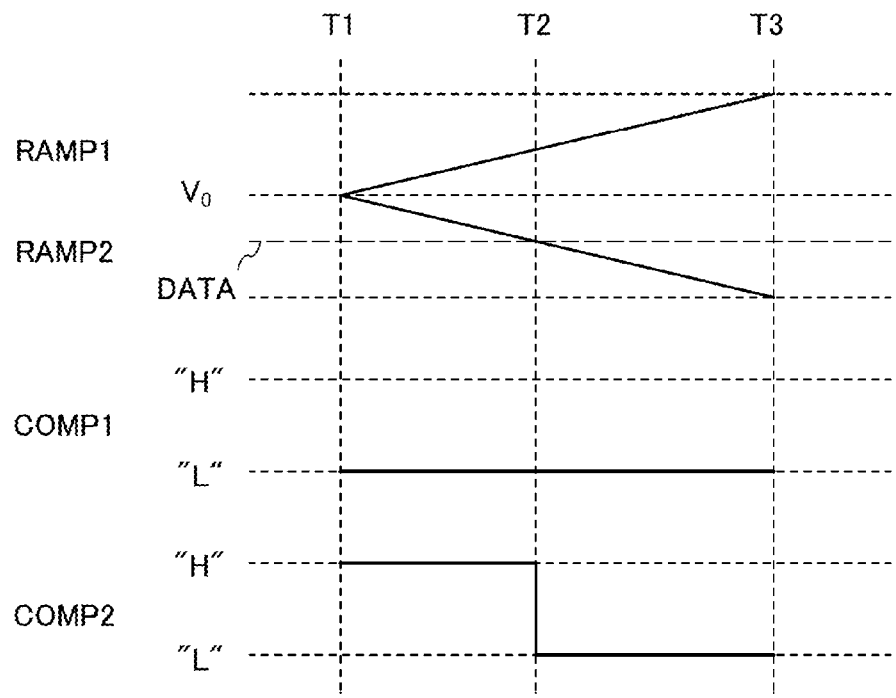

The operation of the circuit 29 is described with reference to FIGS. 8A and 8B, FIGS. 9A and 9B, and FIGS. 10A and 10B. FIGS. 8A and 8B are timing charts each showing output signals of RAMP1 and RAMP2 which are slope signals input into the circuit 29 and output signals of the comparator circuit 51 (COMP1) and the comparators circuit 52 (COMP2).

The RAMP1 is input into the comparator circuit 51 (COMP1), and the RAMP2 is input into the comparator circuit 52 (COMP2). Start potentials of the RAMP1 and RAMP2, which can be the reference potential (CDSVDD) input into the circuit 28, correspond to a potential in the case where difference data between the data of the reference frame and the data of the target frame is 0 (hereinafter the potential is referred to as $V_0$). Note that an end potential of the RAMP1 can be on a high-potential side of $V_0$ and an end potential of the RAMP2 can be on a low-potential side of $V_0$, and the RAMP1 and the RAMP2 may be intersected with each other at $V_0$ in the initial sweep stage.

In one embodiment of the present invention, an image is constituted with difference data between the data of the reference frame and the data of the target frame. In many cases, there are a large number of pixels without a change in output data between consecutive frames. That is, difference data in one pixel between the consecutive frames is "0" in many cases. It is preferable to use $V_0$ as the start potentials of the slope signals to obtain "0" efficiently. Moreover, compressibility of image data can be increased by an encoding process that can express "0" efficiently. Further, with the two slope signals swept at the same time, the clock frequency is lowered and power consumption can be reduced.

In contrast, in the case where data having a medium value is output from the counter circuit 56 (COUNT) when the difference data between the data of the reference frame and the data of the target frame is 0, all values of output bits might be inverted when there is a change of 1 gray level. Such a change frequently occurs in obtaining the difference data; therefore, compressibility of image data cannot be increased. It is preferable to use $V_0$ as the start potentials of the slope signals from such a point of view.

Next, the operation of the circuit 29 in the case where imaging data (DATA) output from the circuit 28 is on a high-potential side of $V_0$ (see FIG. 8A) is described.

At Time T1, when the slope signals start to sweep, the comparator circuit 51 (COMP1) outputs "H", and the comparator circuit 52 (COMP2) outputs "L".

Figure 9A:
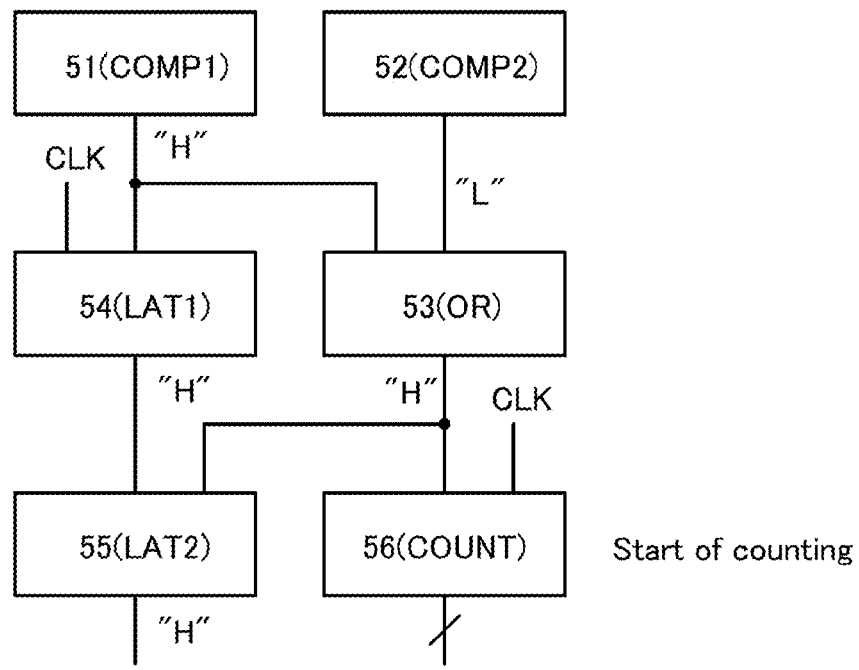
FIGS. 9A and 9B each illustrate the operation of an A/D converter circuit.

FIG. 9A illustrates a signal output from each circuit at Time Ti. When the OR circuit 53 (OR) outputs "H", the counter circuit 56 (COUNT) starts to count digital data. When the latch circuit 54 (LAT1) outputs "H", the latch circuit 55 (LAT2) outputs "H".

At Time T2, when the potential of the RAMP1 is higher than the potential of the imaging data (DATA), the output of the comparator circuit 51 (COMP1) is changed from "H" to "L", and the comparator circuit 52 (COMP2) outputs "L".

Figure 9B:
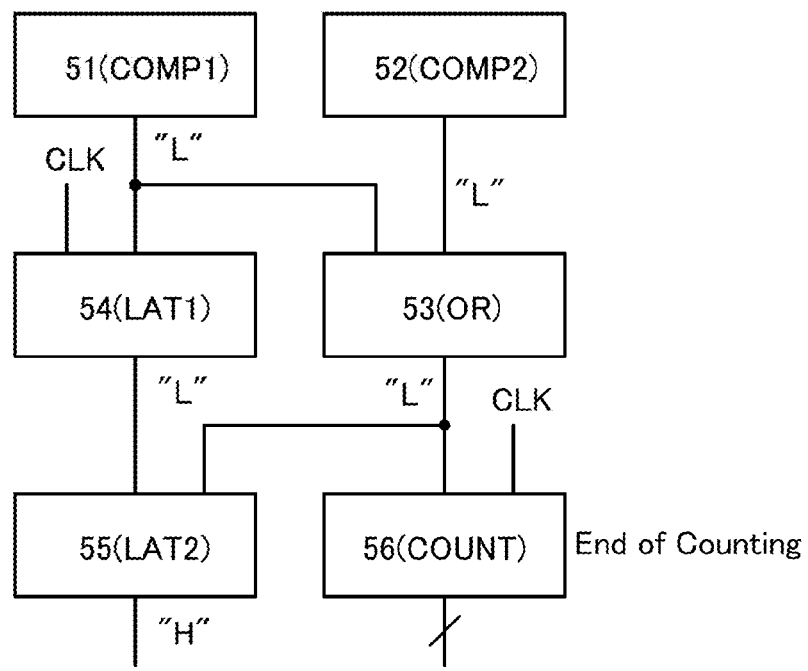

FIG. 9B illustrates a signal output from each circuit at Time T2. When the OR circuit 53 (OR) outputs "L", the counter circuit 56 (COUNT) terminates to count the digital data and holds the digital data. When the latch circuit 54 (LAT1) outputs "L", the latch circuit 55 (LAT2) holds "H". Thus, "H" which is the potential immediately before Time T2 is held in the fifth output terminal of the latch circuit 55 (LAT2).

After Time T3, n-bit data output from the counter circuit 56 (COUNT) and 1-bit data ("H"="1") held in the fifth output terminal of the latch circuit 55 (LAT2) are output to a wiring 93 (OUT3) through the buffer circuit 57*a* or 57*b*.

Next, the operation of the circuit 29 in the case where imaging data (DATA) output from the circuit 28 is on a low-potential side of $V_0$ (see FIG. 8B) is described.

At Time T1, when the slope signals start to sweep, the comparator circuit 51 (COMP1) outputs "L", and the comparator circuit 52 (COMP2) outputs "H".

Figure 10A:
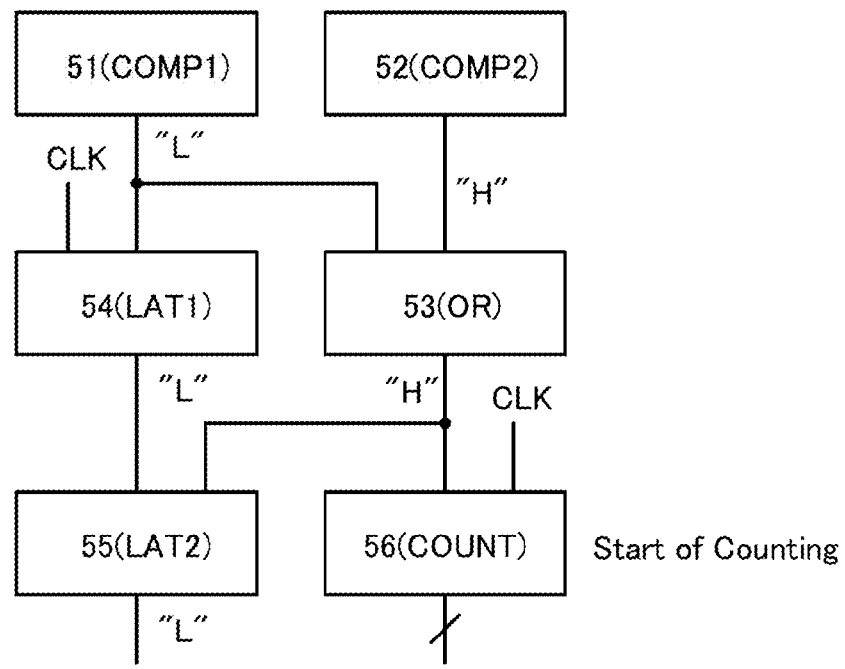
FIGS. 10A and 10B each illustrate the operation of an A/D converter circuit.

FIG. 10A illustrates a signal output from each circuit at Time Ti. When the OR circuit 53 (OR) outputs "H", the counter circuit 56 (COUNT) starts to count digital data. When the latch circuit 54 (LAT1) outputs "L", the latch circuit 55 (LAT2) outputs "L".

At Time T2, when the potential of the RAMP2 is lower than the potential of the imaging data (DATA), the comparator circuit 51 (COMP1) outputs "L", and the output of the comparator circuit 52 (COMP2) is changed from "H" to "L".

Figure 10B:
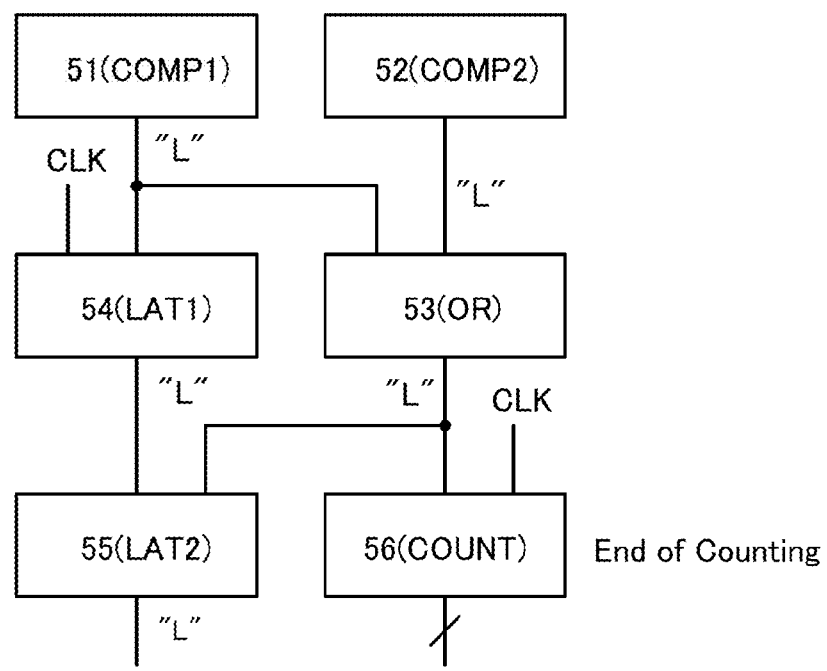

FIG. 10B illustrates a signal output from each circuit at Time T2. When the OR circuit 53 (OR) outputs "L", the counter circuit 56 (COUNT) terminates to count the digital data and holds the digital data. When the latch circuit 54 (LAT1) outputs "L", the latch circuit 55 (LAT2) holds "L". Thus, "L" which is the potential immediately before Time T2 is held in the fifth output terminal of the latch circuit 55 (LAT2).

After Time T3, n-bit data output from the counter circuit 56 (COUNT) and 1-bit data ("L"="0") held in the fifth output terminal of the latch circuit 55 (LAT2) are output to the wiring 93 (OUT3) through the buffer circuit 57*a* or 57*b*.

The 1-bit data held in the fifth output terminal has information whether the imaging data (DATA) output from the circuit 28 is on the high-potential side or the low-potential side of $V_0$. That is, the 1-bit data has positive and negative data of the difference data. Therefore, it is preferable that the 1-bit data be used as the most significant bit or the least significant bit for convenience; however, the 1-bit data may be used as another bit. Through the above operation, a large amount of data with a small change can be output; thus, compressibility can be increased at encoding of the digital data.

Figure 11:
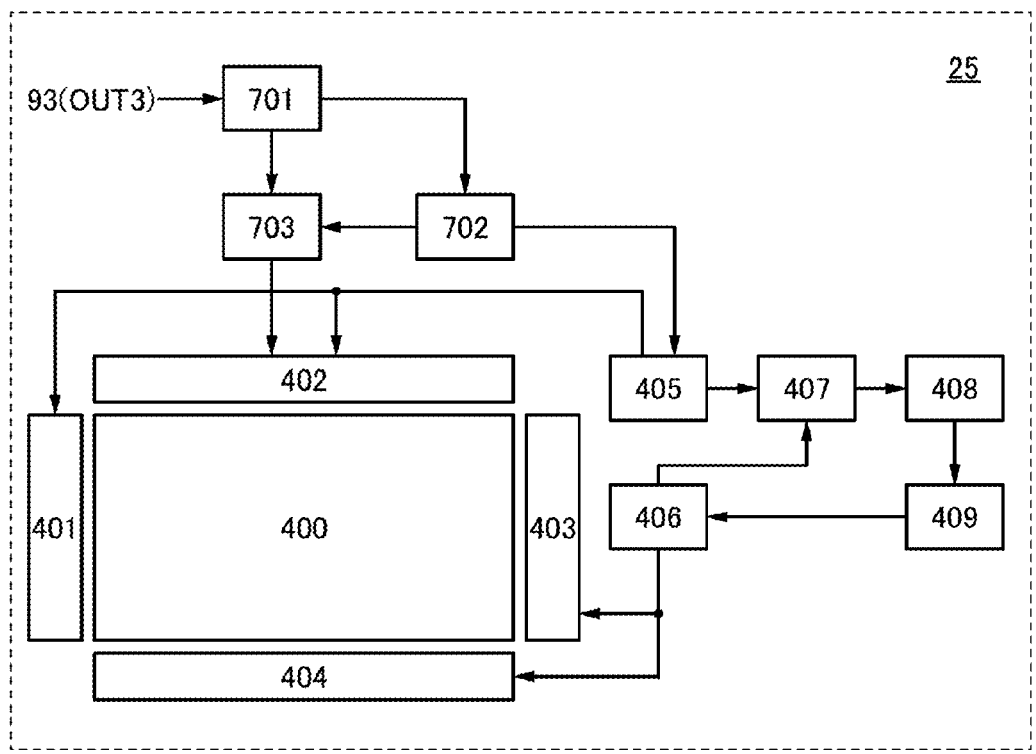
FIG. 11 is a block diagram of a circuit having a function of storing digital data.

FIG. 11 is a block diagram illustrating one embodiment of the circuit 25. The circuit 25 includes the following: a circuit 701 having a function of performing an encoding process on input digital data, a circuit 702 (a register) having a function of temporarily storing the encoded digital data, a circuit 703 (a parallel serial converter circuit) having a function of dividing digital data of plural bits to 1-bit digital data, a memory element array 400 having a function of storing the digital data, a circuit 401 having a function as a writing row decoder, a circuit 402 having a function as a writing column decoder, a circuit 403 having a function as a reading row decoder, a circuit 404 having a function as a reading column decoder, a circuit 405 having a function of controlling a writing memory address, a circuit 406 having a function of controlling a reading memory address, a circuit 407 having a function of calculating a difference between the writing address and the reading address which are specified by the circuit 405 and the circuit 406, respectively, a circuit 408 (a D/A converter circuit) having a function of converting the difference between the addresses into analog data, and a circuit 409 (a voltage controlled oscillator circuit) having a function of generating a clock signal based on the analog data. Note that a multiport SRAM can be used for the memory element array 400.

Here, Huffman compression is described as an example of an encoding process. For example, when difference data is 0, 2-bit data "10" is output, when difference data is +1, 3-bit data "110" is output, and when difference data is −1, 3-bit data "111" is output. In another difference data, 1-bit data "0" and original image data are output. In the case of 14-bit original data, 15-bit data is output, and in the case of 8-bit original data, 9-bit data is output.

Note that when this compression is applied to image data of each pixel in an 8-bit natural image, it is estimated that the amount of data is increased to 112%. This is largely because the image data contains a small amount of data "0" or "1" and the number of bits is increased from 8 to 9. Therefore, to read an image of the reference frame with application of this compression to one embodiment of the present invention, image data may be output directly without compression.

In contrast, when this compression is applied to difference data of each pixel in consecutive 8-bit natural images, it is estimated that the amount of data is compressed to about 60%. At this time, data "0" and "±1" occupy 30% and 35% of the difference data, respectively. When the difference data is expanded to data "±2" to assign a next value, it is further estimated that the amount of data is compressed to about 55%.

Moreover, Run-length compression is described as an example of another encoding process. It is assumed that image data is 8-bit data and that the most significant bit has information whether difference data is positive or negative. That is, 0 is assumed to be "00000000", +1 is assumed to be "00000001", +2 is assumed to be "00000010", −1 is assumed to be "10000000", and −2 is assumed to be "10000001"

Run-length conversion is performed for each bit. When data "0", "+1", "0", and "−1" are obtained sequentially, the least significant bit (in a zeroth bit position) is "0", "1", "0", and "0" and a first bit position is "0", "0", "0", and "0". The most significant bit (in a seventh bit position) is "0", "0", "0", and "1". Since difference image data is used, a change in a sixth bit position is the smallest. Data in a first frame when difference data is obtained at the first time is assumed to be "0" and a number with consecutive values of "0" or a number with consecutive values of "1" in the following frame is counted. When the value of a bit is changed, the counted value is output and a counter circuit is reset. When the counter circuit is saturated, the external circuit can determine whether the output is due to saturation or a change by outputting "0", for example.

When the bit width of the counter circuit is set to 8 bit in a difference image of a natural image, it is estimated that the amount of data is about 117%. In the bit position such as the zeroth bit position or the seventh bit position with a frequent change, the amount of data is increased because a small counted value is output frequently. When the bit width of the above bit position is set to 2 bit, it is estimated that the amount of data is 79%. When "0" continues as in the sixth bit position, there is an increase in an output due to saturation of the counter circuit. Thus, when the bit widths from the seventh bit position to the zeroth bit position are sequentially set to "2", "11", "8", "7", "6", "4", "2", and "2", it is estimated that the amount of data is 54%. Although compressibility depends on original data, it is effective to use counter circuits with a different bit width for each bit.

An operation example in the case where encoding using the above Huffman compression is applied to the circuit 25 is described.

The data output to the wiring 93 (OUT3) is input to the circuit 701. Here, the input data is 8-bit data. The circuit 701 performs comparative determination whether data is "0", "+1" or "−1" or another value, and determines an output value. In the case where the data input to the circuit 701 is "0", data "2" is output to the circuit 702 and data "10xxxxxxx" is output to the circuit 703. Here, x is "0" or "1".

When data input to the circuit 701 is "+1", data "3" is output to the circuit 702 and data "110xxxxxx" is output to the circuit 703. When data input to the circuit 701 is "−1", data "3" is output to the circuit 702 and data "111xxxxxx" is output to the circuit 703. When data input to the circuit 701 is data other than above, i.e., "dddddddd", data "9" is output to the circuit 702 and data "0dddddddd" is output to the circuit 703.

The circuit 702 is decremented repeatedly until data "0" is output before next data is input to the circuit 701. The value of the circuit 405 is incremented every time the value of the circuit 702 is reduced by 1. The circuit 703 shifts 1-bit data to the left to output the high-order 1 bit to the circuit 402. The circuits 401 and 402 each decode an address value of the circuit 405 and write the 1-bit data input from the circuit 703 to the memory element array 400.

The circuits 403 and 404 read the written data, and the circuit 407 calculates a difference between the written address and the read address which are specified by the circuit 405 and the circuit 406, respectively. The digital data output from the circuit 407 is converted into analog data in the circuit 408 and output to the circuit 409. A clock signal is generated based on the analog data in the circuit 409 and supplied to the circuit 406. With such a circuit configuration, the frequency of the clock signal supplied to the circuit 406 can be adjusted in accordance with the amount of data and thus power consumption can be reduced. Moreover, the digital data (compressed difference data) read from the memory element array 400 is expanded by the external circuit and the expanded data is added to the reference frame to constitute an image of the target frame.

Figure 12A:
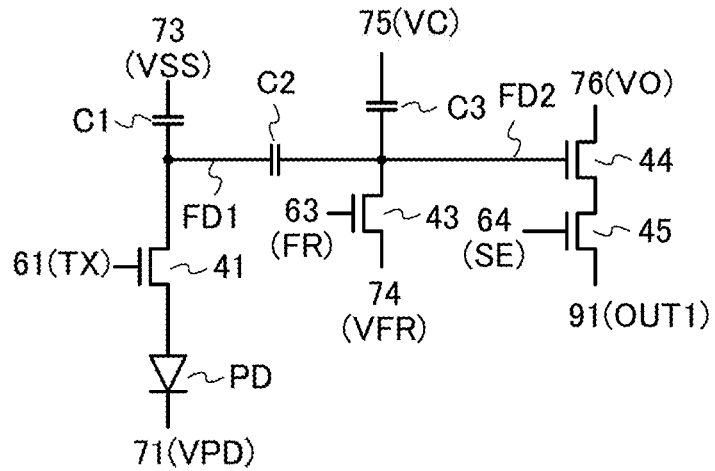
FIGS. 12A to 12C each illustrate a pixel circuit.
Figure 12B:
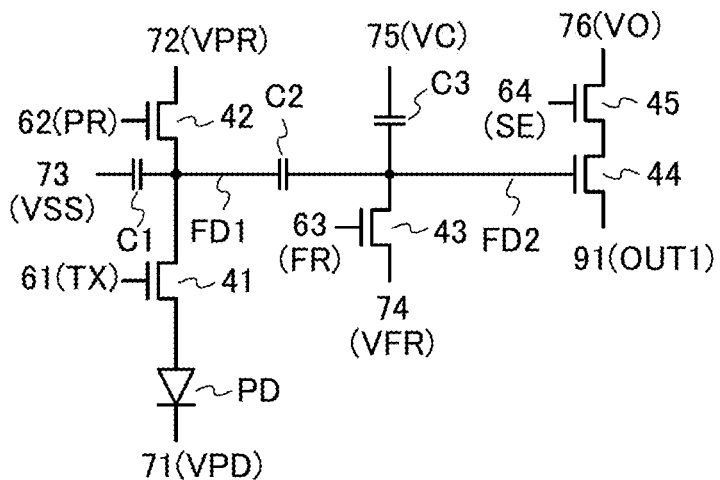
Figure 12C:
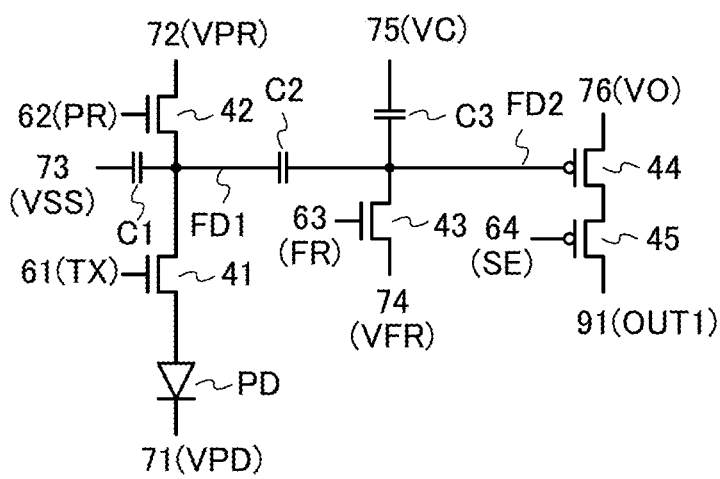

The pixel circuit 20 may have a configuration illustrated in FIGS. 12A to 12C. In the configuration of FIG. 12A, the transistor 42 is not provided. In this configuration, the wiring 71 (VPD) is set to a low potential, whereby the potential of the node FD1 can be reset. In the configuration of FIG. 12B, one of the source and the drain of the transistor 44 is connected to the wiring 91 (OUT). As in FIG. 12C, the transistors included in the pixel circuit 20 may include a p-channel transistor.

Figure 13A:
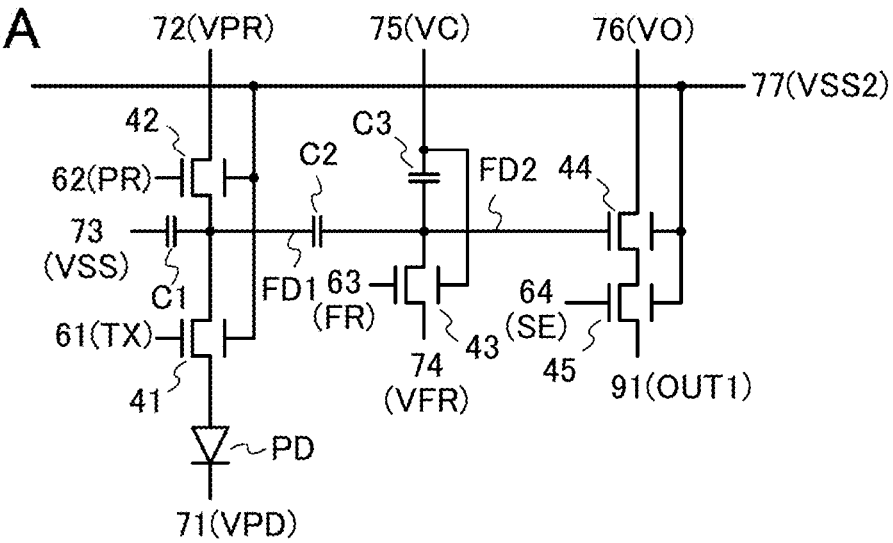
FIGS. 13A to 13C each illustrate a pixel circuit.
Figure 13B:
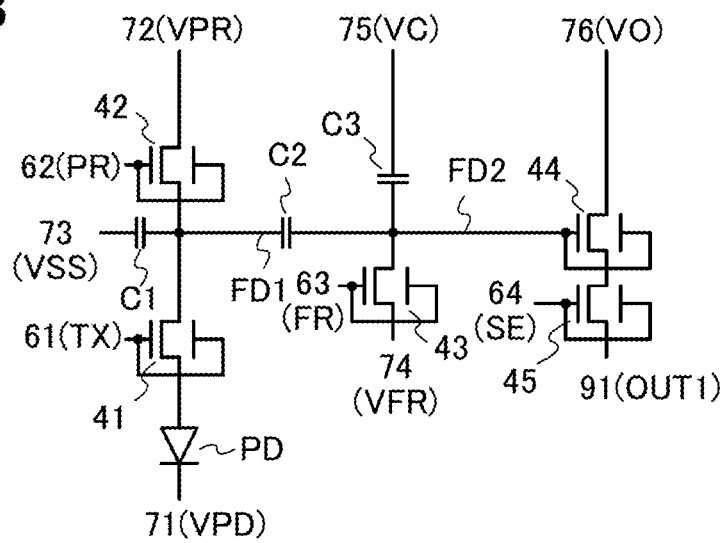
Figure 13C:
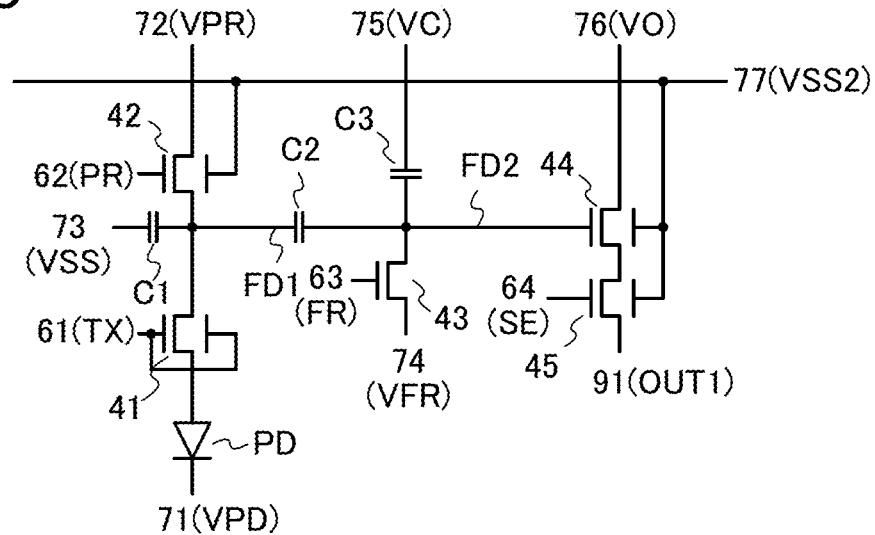

The transistors 41 to 45 in the pixel circuit 20 may each have a back gate as illustrated in FIGS. 13A to 13C. FIG. 13A illustrates a configuration in which a constant potential is applied to the back gates, which enables control of the threshold voltages. The back gates are connected to the wiring 75 (VC) and a wiring 77 (VSS2) that supply a low potential in the example of FIG. 13A, but may be connected to one of the wirings. FIG. 13B illustrates a configuration in which the same potential is applied to the front gate and the back gate, which enables an increase in on-state current and a decrease in off-state current. The configuration of FIG. 13C is obtained by combining the configurations of FIGS. 13A and 13B and the like such that desired transistors can have appropriate electrical characteristics. Note that a transistor without a back gate may be provided. Note that any of the configurations of FIG. 5A, FIG. 6A, FIGS. 12A to 12C, and FIGS. 13A to 13C can be combined as necessary.

Figure 14:
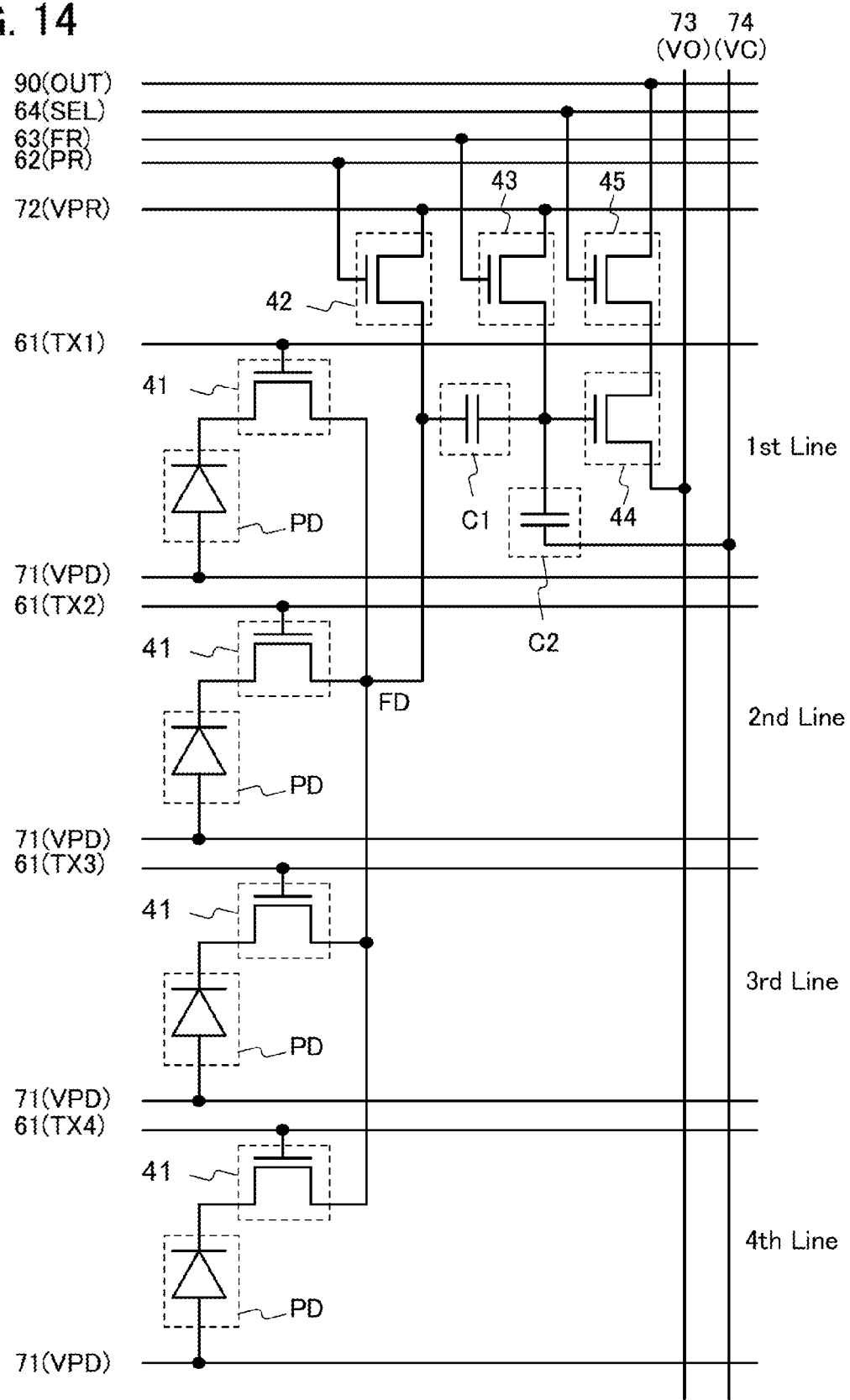
FIG. 14 illustrates a pixel circuit.

The pixel circuit 20 may have a configuration in which the transistors 42 to 45 are shared among a plurality of pixels as illustrated in FIG. 14. FIG. 14 illustrates a configuration in which the transistors 42 to 45 are shared among a plurality of pixels in the perpendicular direction; however, the transistors 42 to 45 may be shared among a plurality of pixels in the horizontal direction or in the horizontal and perpendicular directions. With such a configuration, the number of transistors included in one pixel can be reduced.

Although FIG. 14 illustrates a configuration in which the transistors 42 to 45 are shared among four pixels, the transistors 42 to 45 may be shared among two pixels, three pixels, or five or more pixels. Note that this configuration can be optionally combined with any of the configurations in FIG. 5A, FIG. 6A, FIGS. 12A to 12C, and FIGS. 13A to 13C.

Figure 15A:
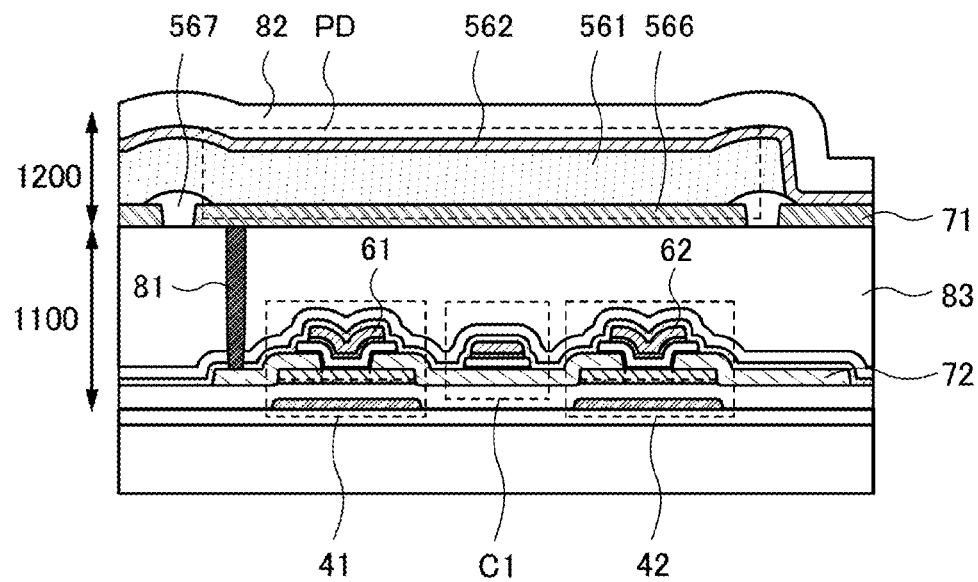
FIGS. 15A to 15C are cross-sectional views each illustrating a structure of an imaging device.

Next, specific structure examples of an imaging device of one embodiment of the present invention are described with reference to drawings. FIG. 15A illustrates an example of specific connection between the photoelectric conversion element PD, the transistors 41 and 42, and the capacitor C1 that are included in the pixel circuit 20 in FIG. 5A. Note that the transistors 43, 44, and 45 are not illustrated in FIG. 15A. The transistors 41 to 45 and the capacitor C1 can be provided in a layer 1100, and the photoelectric conversion element PD can be provided in a layer 1200.

Although the wirings, the electrodes, and contact plugs (conductors 81) are illustrated as independent components in cross-sectional views in this embodiment, some of them are provided as one component in some cases when they are electrically connected to each other. In addition, a structure in which the wiring is connected to the electrode through the conductor 81 is only an example, and the wiring may be directly connected to the electrode.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, some of the wirings and the like illustrated in the drawing are not provided or a wiring, a transistor, or the like that is not illustrated in the drawing is included in each layer. In addition, a layer that is not illustrated in the drawing might be included. Furthermore, some of the layers illustrated in the drawing are not included in some cases.

It is preferable that OS transistors with a low off-state current be used for the transistors 41 to 45 that are components of the pixel circuit 20. An extremely low off-state current of the OS transistor can expand the dynamic range of imaging. In the circuit configuration of the pixel circuit 20 illustrated in FIG. 5A, when the intensity of light entering the photoelectric conversion element PD is small, the potentials of the nodes AN and FD are reduced. Since the OS transistor has an extremely low off-state current, a current based on a gate potential can be accurately output even when the gate potential is extremely low. Thus, it is possible to expand the detection range of illuminance, i.e., the dynamic range.

A period during which charge can be held in the nodes FD1 and FD2 can be extremely long owing to the low off-state current of the transistors 41 and 43. Therefore, a global shutter system in which an accumulation operation is simultaneously performed in all the pixels can be used without a complicated circuit structure or a complicated operation method. Note that the imaging device of one embodiment of the present invention can be operated in a rolling shutter system.

The operation method of the imaging device is described with reference to FIGS. 16A and 16B. Note that in FIGS. 16A and 16B, "E" represents an exposure period and "R" represents a reading period. Furthermore, n represents an n-th frame (n is a given natural number of two or more). Moreover, n−1 represents a frame previous to the n-th frame, and n+1 represents a frame following the n-th frame. Line[1] represents a first row of the pixel array 21, and Line[M] represents an M-th row of the pixel array 21 (M is a natural number of four or more in FIGS. 16A and 16B).

Figure 16A:
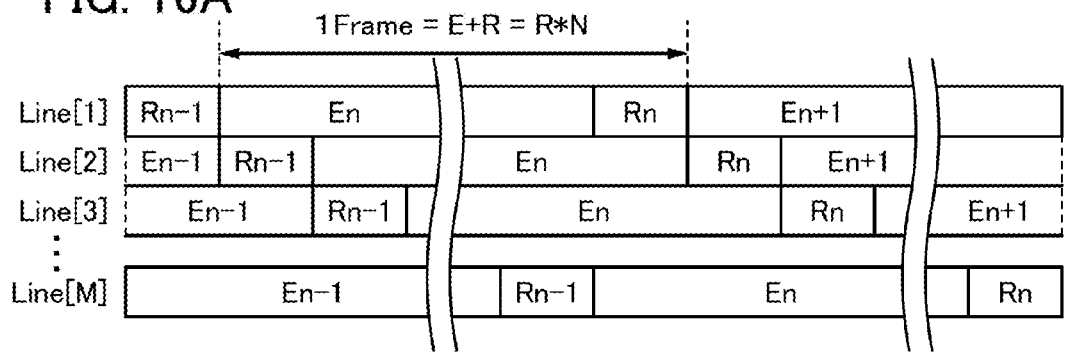
FIGS. 16A and 16B illustrate the operations of an imaging device.

FIG. 16A is a schematic view illustrating the operation method of a rolling shutter system. In the rolling shutter system, exposure and data reading are performed row by row. Imaging cannot be simultaneously performed on all pixels; therefore, distortion is caused to an image when a moving object is imaged.

Figure 16B:
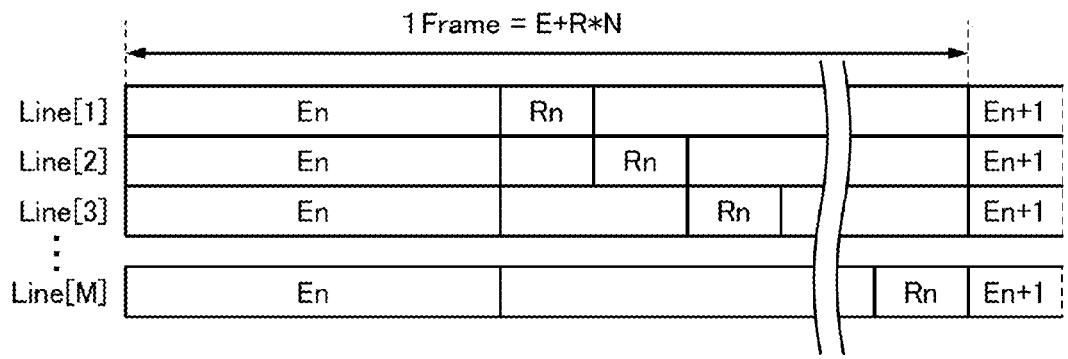

FIG. 16B is a schematic view illustrating the operation method of a global shutter system. In the global shutter system, exposure is simultaneously performed on all pixels, and then data reading is performed row by row. Thus, an image without distortion can be obtained even when a moving object is imaged.

In addition, the OS transistor has lower temperature dependence of change in electrical characteristics than a transistor including silicon in an active region or an active layer, and thus can be used in an extremely wide range of temperatures. Therefore, an imaging device and a semiconductor device that include OS transistors are suitable for use in automobiles, aircrafts, spacecrafts, and the like.

Moreover, the OS transistor has higher drain breakdown voltage than the Si transistor. To utilize avalanche multiplication, a photoelectric conversion element including a selenium-based material in a photoelectric conversion layer is preferably operated while a relatively high voltage (e.g., 10 V or more) is applied. Therefore, by combination of the OS transistor and the photoelectric conversion element including a selenium-based material in the photoelectric conversion layer, a highly reliable imaging device can be obtained.

Figure 15B:
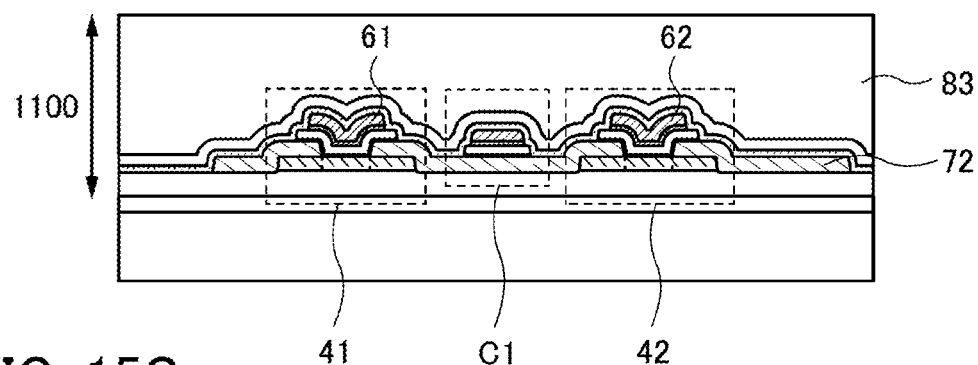
Figure 15C:
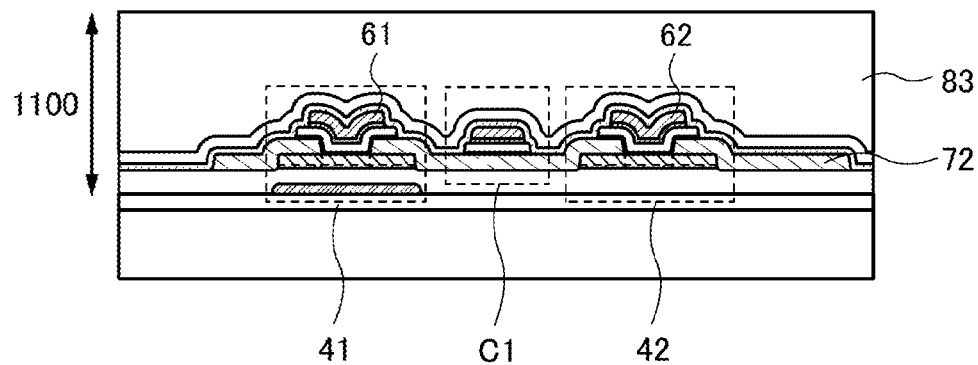

Note that although each transistor includes a back gate in FIG. 15A, each transistor does not necessarily include a back gate as illustrated in FIG. 15B. Alternatively, as illustrated in FIG. 15C, some of the transistors, for example, only the transistor 41 may include a back gate. The back gate might be electrically connected to a front gate of the transistor, which is provided to face the back gate. Alternatively, different fixed potentials might be supplied to the back gate and the front gate. Note that these descriptions on the presence or absence of the back gate can also be applied to other configurations of a pixel described in this embodiment.

A variety of elements can be used as the photoelectric conversion element PD provided in the layer 1200. FIG. 15A illustrates the photoelectric conversion element PD including a selenium-based material for a photoelectric conversion layer 561. The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons with respect to the amount of incident light is large because of an avalanche phenomenon. In other words, the use of a selenium-based material for the photoelectric conversion layer 561 allows a sufficient amount of photocurrent to be obtained even when the pixel area is reduced. Thus, the photoelectric conversion element PD including a selenium-based material is also suitable for imaging in a low-illuminance environment.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

Figure 17A:
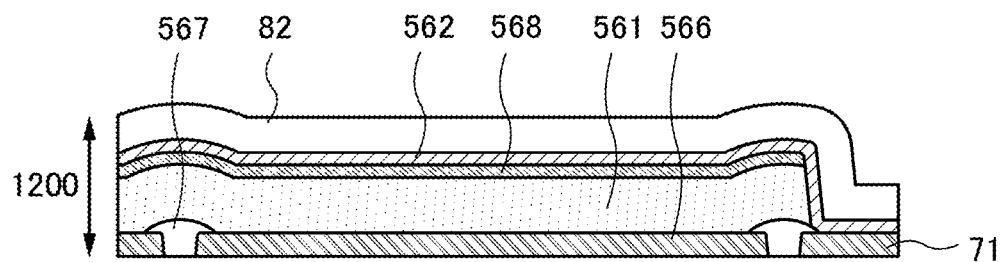
FIGS. 17A to 17C are cross-sectional views each illustrating a structure of a photoelectric conversion element.
Figure 17B:
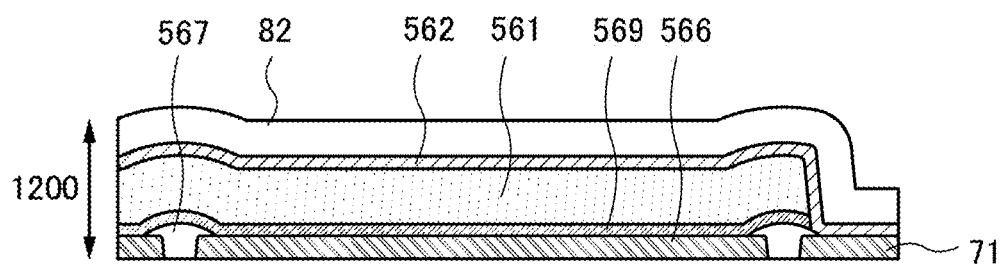
Figure 17C:
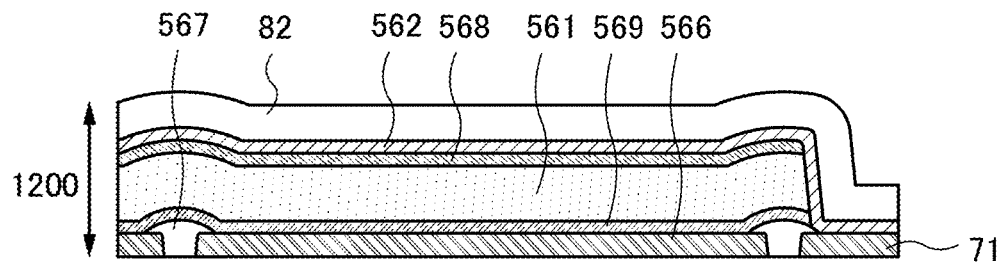

Although the photoelectric conversion layer 561 is a single layer in FIG. 15A, a layer of gallium oxide, cerium oxide, an In—Ga—Zn oxide, or the like may be provided as a hole injection blocking layer 568 on a light-receiving surface side as illustrated in FIG. 17A. Alternatively, as illustrated in FIG. 17B, a layer of nickel oxide, antimony sulfide, or the like may be provided as an electron injection blocking layer 569 on an electrode 566 side. Further alternatively, as illustrated in FIG. 17C, the hole injection blocking layer 568 and the electron injection blocking layer 569 may be provided. Note that as illustrated in FIG. 5A and FIG. 6A, the pixel circuit 20 can have configurations that differ from each other in the direction of connection of the photoelectric conversion element PD. Thus, the hole injection blocking layer 568 and the electron injection blocking layer 569 in FIGS. 17A to 17C may be replaced with each other.

The photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including selenium alone.

In the photoelectric conversion element PD using the selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 18A:
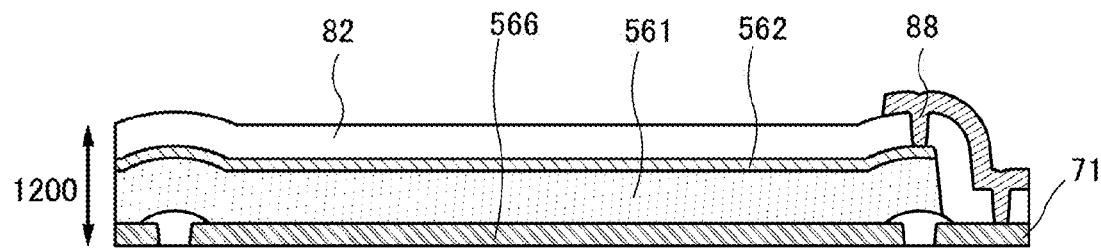
FIGS. 18A to 18D are cross-sectional views each illustrating a connection mode of a photoelectric conversion element.
Figure 18B:
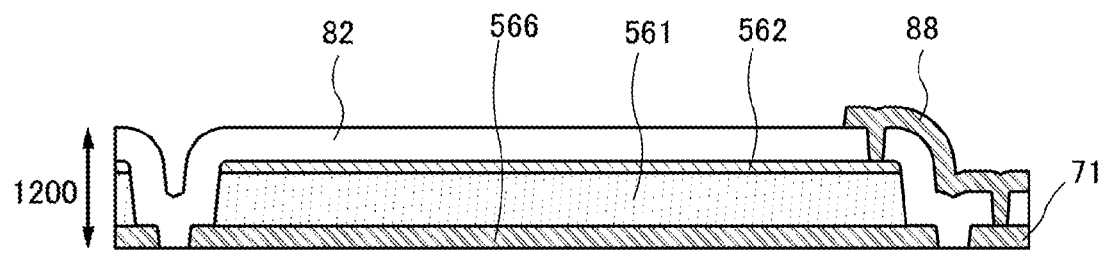
Figure 18C:
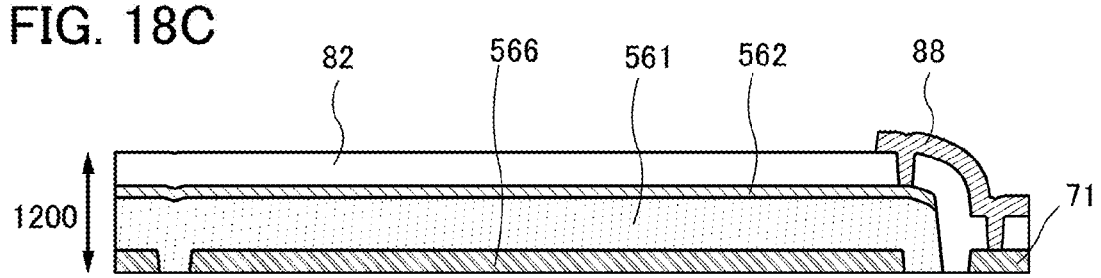
Figure 18D:
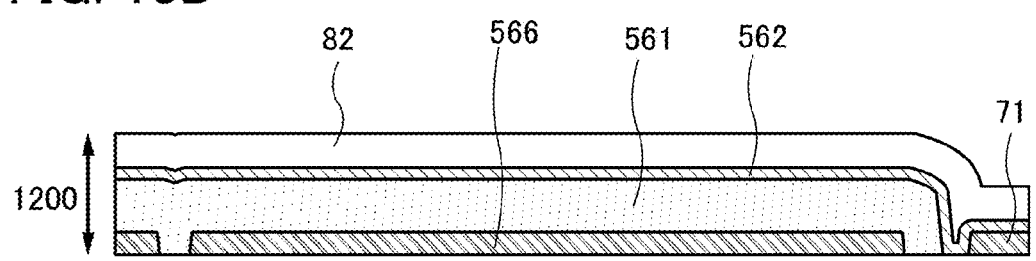

Although the light-transmitting conductive layer 562 is directly in contact with the wiring 71 in FIG. 15A, the light-transmitting conductive layer 562 may be in contact with the wiring 71 through a wiring 88 as illustrated in FIG. 18A. Although the photoelectric conversion layer 561 and the light-transmitting conductive layer 562 are not divided between pixel circuits in FIG. 15A, they may be divided between circuits as illustrated in FIG. 18B. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 18C and 18D.

Figure 19A:
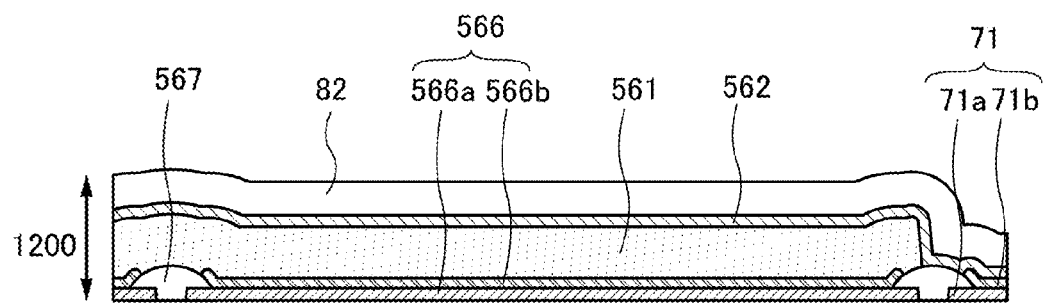
FIGS. 19A and 19B are cross-sectional views each illustrating a connection mode of a photoelectric conversion element.

The electrode 566, the wiring 71, and the like may each be a multilayer. For example, as illustrated in FIG. 19A, the electrode 566 can include two conductive layers 566a and 566b and the wiring 71 can include two conductive layers 71a and 71b. In the structure in FIG. 19A, for example, the conductive layers 566a and 71a may be made of a low-resistance metal or the like, and the conductive layers 566b and 71b may be made of a metal or the like that exhibits an excellent contact property with the photoelectric conversion layer 561. Such a structure improves the electrical characteristics of the photoelectric conversion element PD. Furthermore, even when the conductive layer 71a contains a metal that causes electrolytic corrosion by being in contact with the light-transmitting conductive layer 562, the electrolytic corrosion can be prevented because the conductive layer 71b is between the conductive layer 71a and the light-transmitting conductive layer 562.

The conductive layers 566b and 71b can be formed using, for example, molybdenum, tungsten, or the like. The conductive layers 566a and 71a can be formed using, for example, aluminum, titanium, or a stack of titanium, aluminum, and titanium that are layered in that order.

Figure 19B:
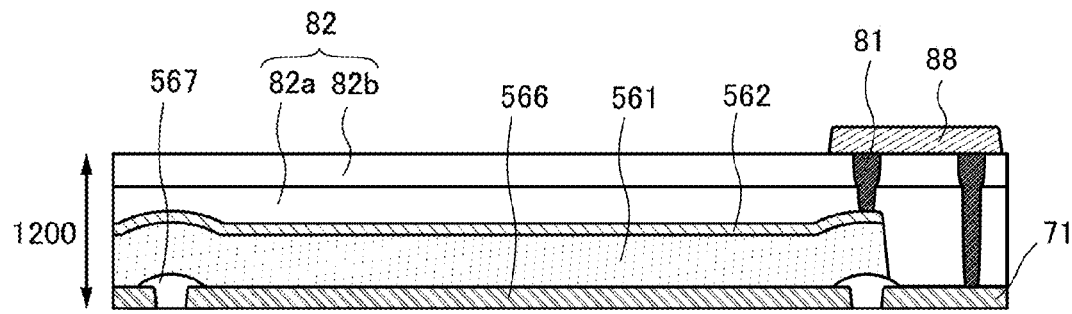

As illustrated in FIG. 19B, the light-transmitting conductive layer 562 may be connected to the wiring 71 through the conductor 81 and the wiring 88. The insulating layer 82 and the like may each be a multilayer. For example, as illustrated in FIG. 19B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a PIN diode element formed using an amorphous silicon film, a microcrystalline silicon film, or the like may be used as the photoelectric conversion element PD.

Figure 20:
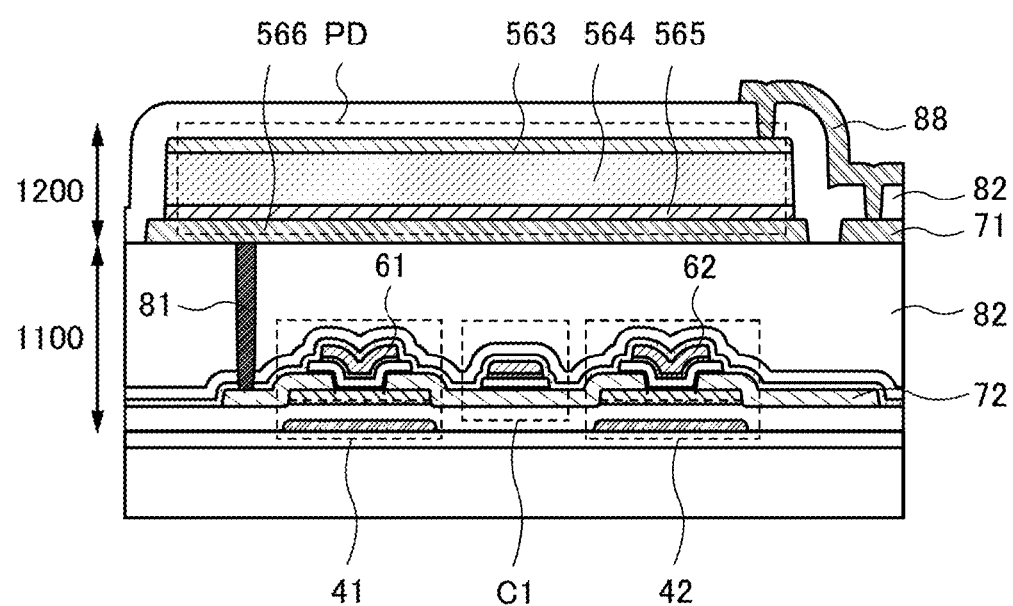
FIG. 20 is a cross-sectional view illustrating an imaging device.

FIG. 20 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 20, the n-type semiconductor layer 565 functioning as a cathode is in contact with the electrode 566 that is electrically connected to the transistor 41. Furthermore, the p-type semiconductor layer 563 functioning as an anode is electrically connected to the wiring 71 through the wiring 88. That is, FIG. 20 is a structural example corresponding to the circuit diagram in FIG. 6A.

Note that when the anode and the cathode of the photoelectric conversion element PD are oppositely connected to the electrode layer and the wiring, a structure corresponding to the circuit diagram in FIG. 5A can also be used.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

Figure 21A:
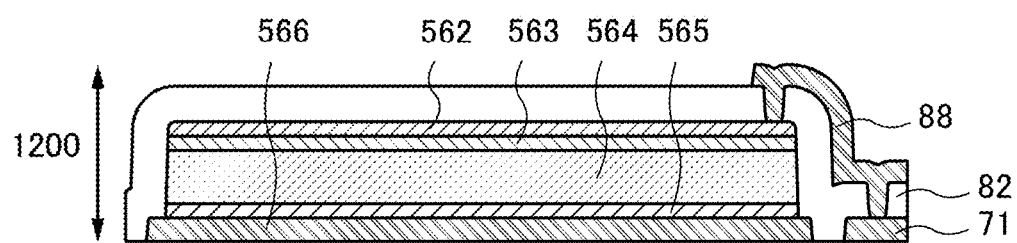
FIGS. 21A to 21C are cross-sectional views each illustrating a connection mode of a photoelectric conversion element.
Figure 21B:
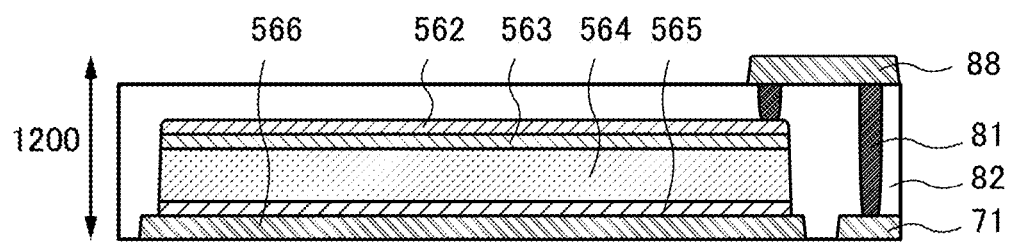
Figure 21C:
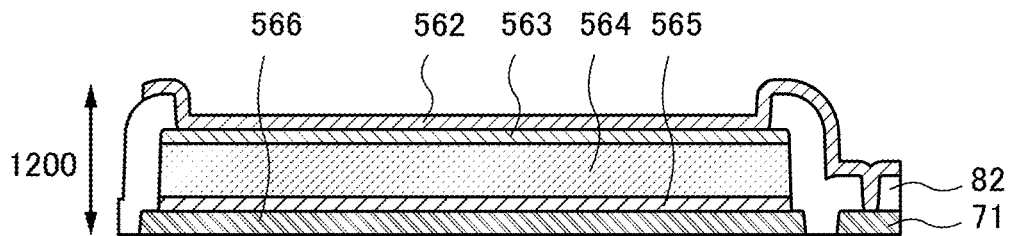

FIGS. 21A to 21C show other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

FIG. 21A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In the configuration of FIG. 21B, the light-transmitting conductive layer 562 and the wiring 71 are connected to each other through the conductor 81 and the wiring 88. Note that the p-type semiconductor layer 563 of the photoelectric conversion element PD and the wiring 71 may be connected to each other through the conductor 81 and the wiring 88. In the configuration of FIG. 21B, the light-transmitting conductive layer 562 is not necessarily provided.

FIG. 21C illustrates a structure in which an opening exposing the p-type semiconductor layer 563 is provided in an insulating layer covering the photoelectric conversion element PD, and the light-transmitting conductive layer 562 that covers the opening is electrically connected to the wiring 71.

Figure 22:
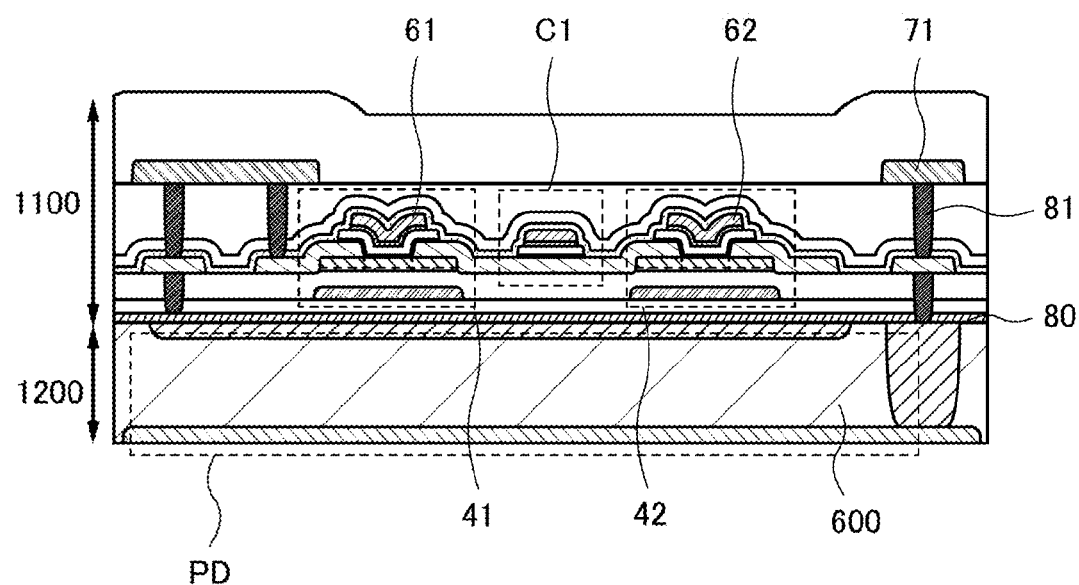
FIG. 22 is a cross-sectional view illustrating an imaging device.

Alternatively, as illustrated in FIG. 22, the photoelectric conversion element PD may be a photodiode including a silicon substrate 600 as a photoelectric conversion layer.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 15A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 23A:
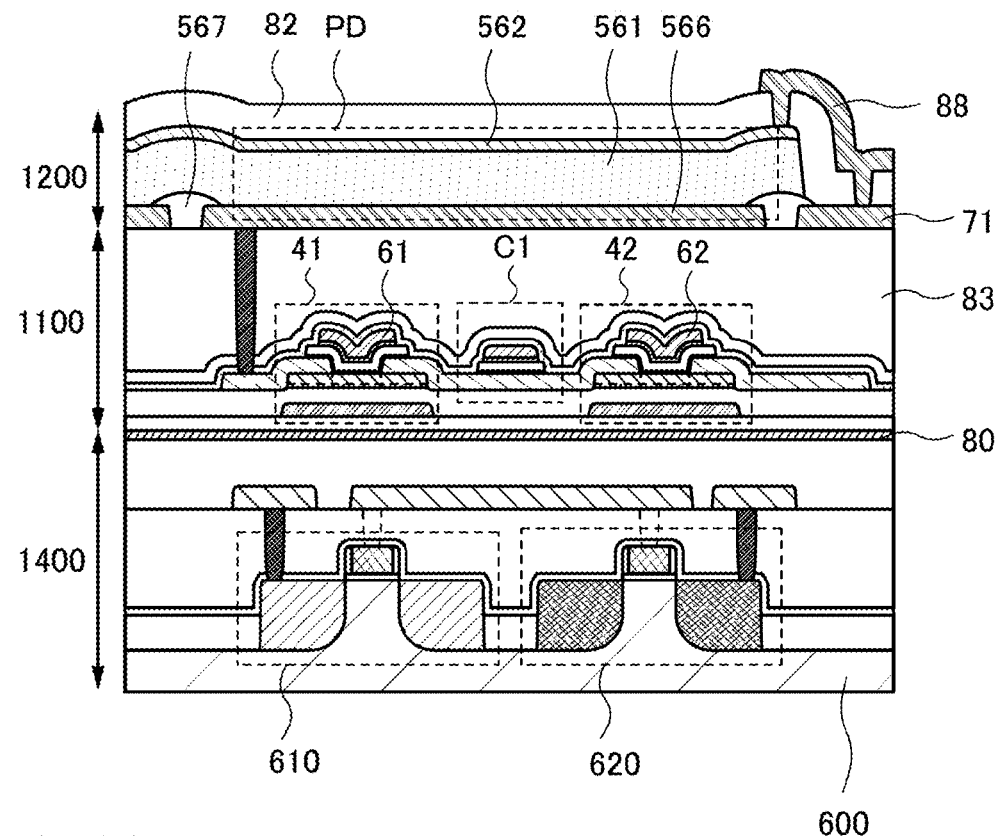
FIGS. 23A and 23B are cross-sectional views illustrating an imaging device.
Figure 23B:
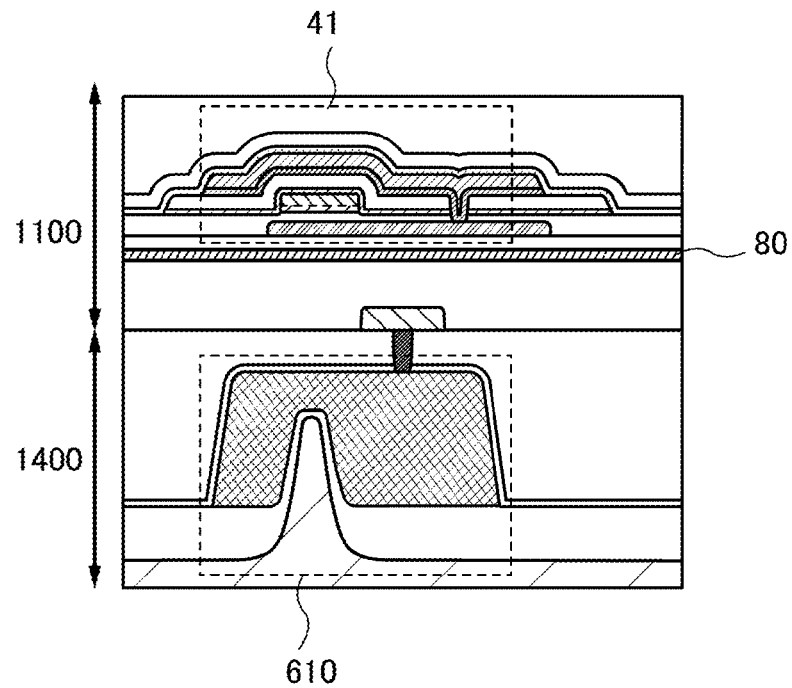

Furthermore, in the imaging device of one embodiment of the present invention, a stack including the silicon substrate 600 in which a circuit is formed may be used. For example, as illustrated in FIG. 23A, the pixel circuit may overlap with a layer 1400 that includes transistors 610 and 620 whose active regions are formed in the silicon substrate 600. FIG. 23B is a cross-sectional view illustrating the transistors in the channel width direction.

Figure 24A:
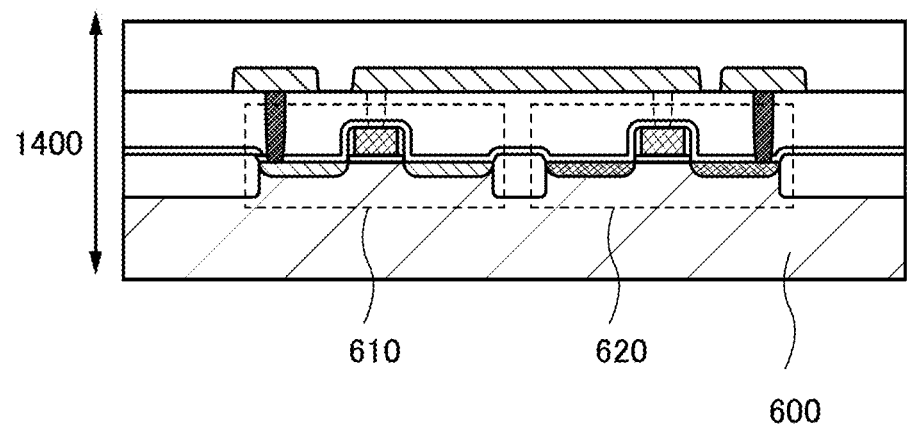
FIGS. 24A to 24C are cross-sectional views and a circuit diagram illustrating imaging devices.
Figure 24B:
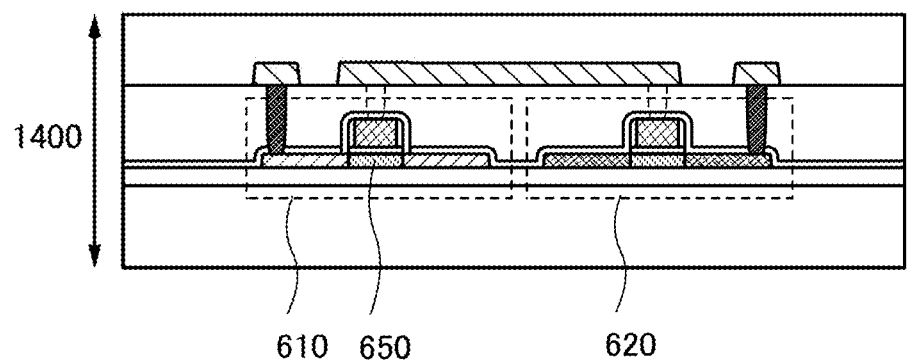

Although FIGS. 23A and 23B show the Si transistors of a fin type, the transistors may be of a planar type as illustrated in FIG. 24A. Alternatively, as illustrated in FIG. 24B, they may be transistors each including an active layer 650 formed using a silicon thin film. The active layer 650 can be formed using polycrystalline silicon or single crystal silicon of a silicon-on-insulator (SOI) structure.

Figure 24C:
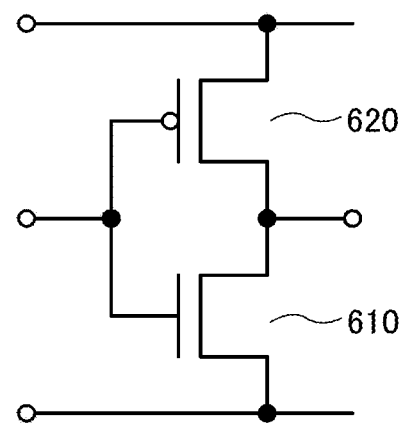

The circuit formed on the silicon substrate 600 is capable of reading a signal output from the pixel circuit and converting the signal; for example, the circuit may include a CMOS inverter as illustrated in the circuit diagram in FIG. 24C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor is electrically connected to a wiring and the other of the source and the drain of the other transistor is electrically connected to another wiring.

The circuit formed on the silicon substrate 600 corresponds to each of the circuits 22, 23, 24, and 25 illustrated in FIG. 1C, for example.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 22 and FIGS. 23A and 23B, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers provided in the vicinity of the oxide semiconductor layer that is the active layer of the transistor 41 or the like causes generation of carriers in the oxide semiconductor layer, and therefore may reduce the reliability of the transistor 41 or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 41 or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

As illustrated in FIGS. 23A and 23B, a circuit (e.g., a driver circuit) formed on the silicon substrate 600, the transistor 41 or the like, and the photoelectric conversion element PD can overlap with each other; thus, the integration degree of pixels can be increased. In other words, the resolution of the imaging device can be increased. Such a structure is suitable for an imaging device with, for example, 4K2K resolution, 8K4K resolution, or 16K8K resolution. Note that a structure may be employed in which a Si transistor is formed as the transistors 44 and 45 included in the pixel circuit 20 so as to overlap with the transistors 41, 42, and 43, the photoelectric conversion element PD, and the like.

Figure 25:
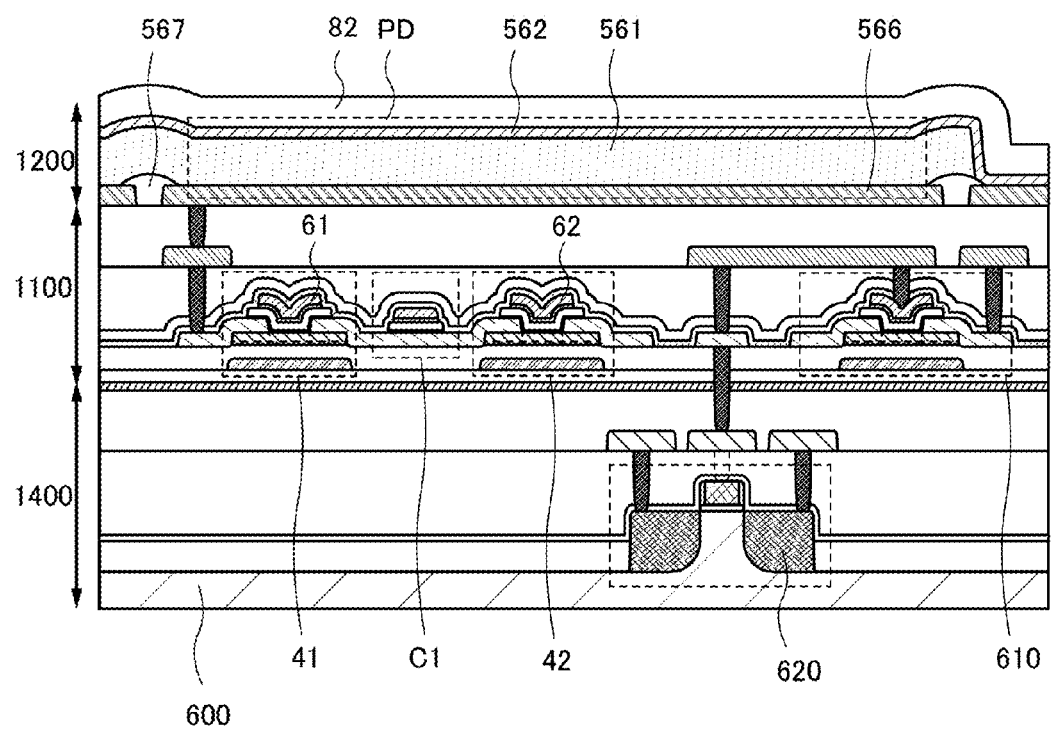
FIG. 25 is a cross-sectional view illustrating an imaging device.

An imaging device of one embodiment of the present invention can also have a structure in FIG. 25. The imaging device in FIG. 25 is a modification example of the imaging device in FIG. 23A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium or the like is used for the photoelectric conversion element PD in the imaging device in FIG. 25, a PIN thin film photodiode may be used as in FIG. 20.

In the imaging device in FIG. 25, the transistor 610 can be formed through the same process as transistors 41 and 42 formed in the layer 1100. Thus, the manufacturing process of the imaging device can be simplified.

Figure 26:
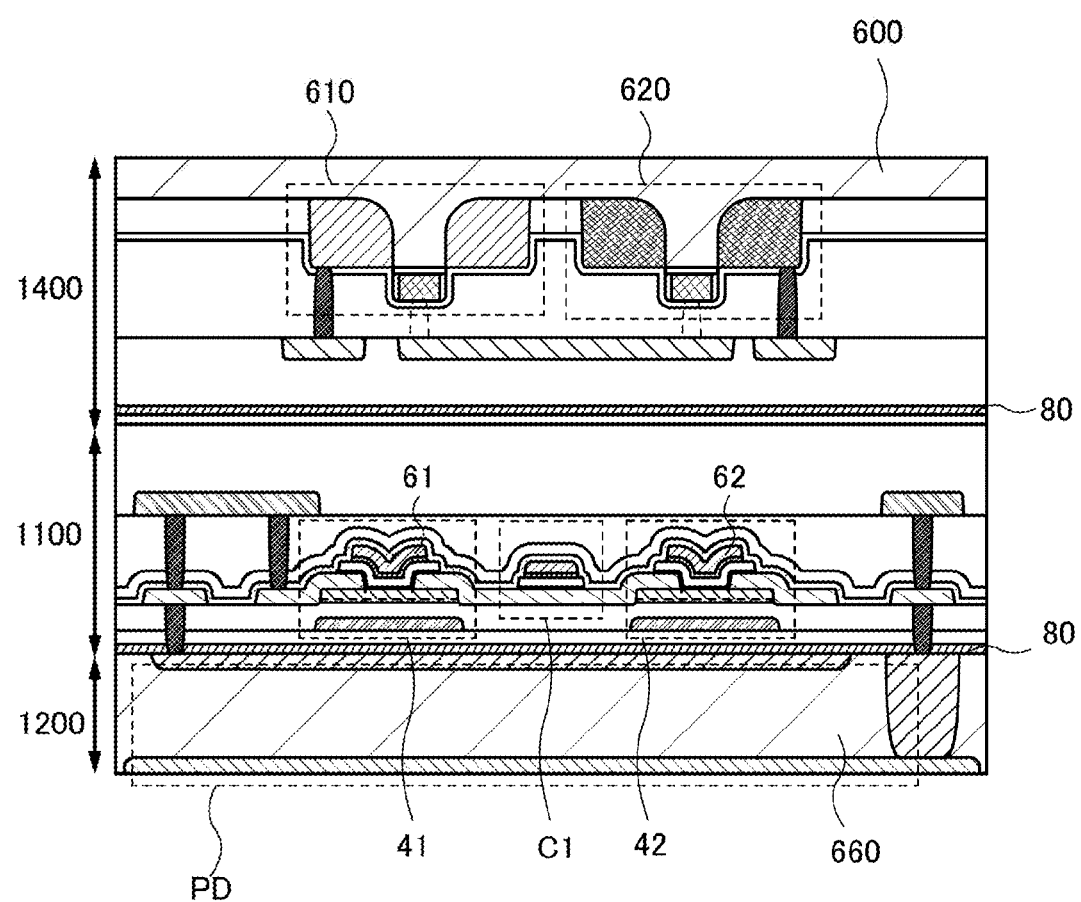
FIG. 26 is a cross-sectional view illustrating an imaging device.

As illustrated in FIG. 26, an imaging device of one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

Figure 27:
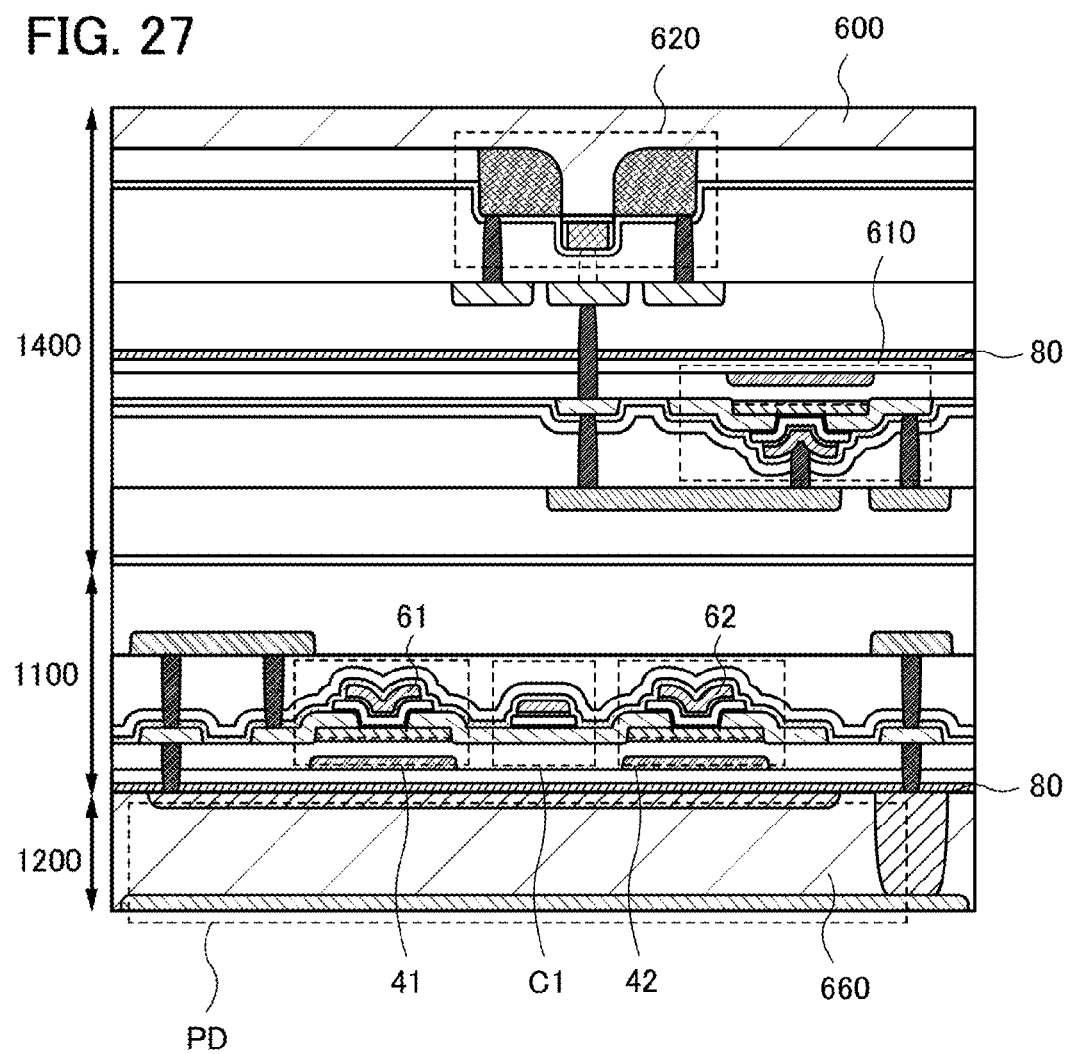
FIG. 27 is a cross-sectional view illustrating an imaging device.

FIG. 27 shows a modification example of FIG. 26, in which a circuit includes an OS transistor and a Si transistor.

Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

In the case of the structure illustrated in FIG. 27, a CMOS circuit can be formed using the Si transistor on the silicon substrate 600 and the OS transistor thereon. Since the off-state current of the OS transistor is extremely low, the static leakage current of the CMOS circuit can be extremely low.

Note that the structure of the transistor and the photoelectric conversion element included in each of the imaging devices described in this embodiment is only an example. Therefore, for example, one or more of the transistors 41 to 45 may include silicon or the like in an active region or an active layer. Furthermore, one of or both the transistors 610 and 620 may include an oxide semiconductor layer as an active layer.

Figure 28A:
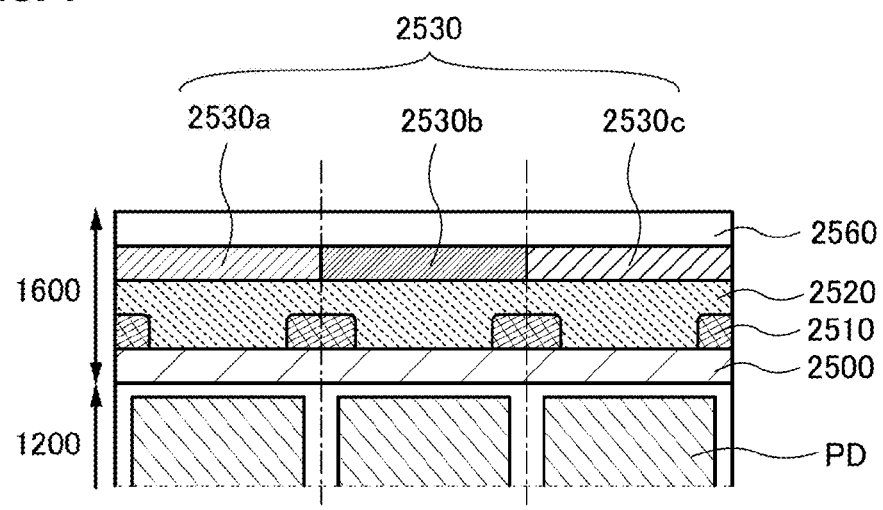
FIGS. 28A to 28C are cross-sectional views each illustrating a structure of an imaging device.

FIG. 28A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the upper color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (color filters 2530a, 2530b, and 2530c) is formed in each pixel. For example, the color filters 2530a, 2530b, and 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 28B:
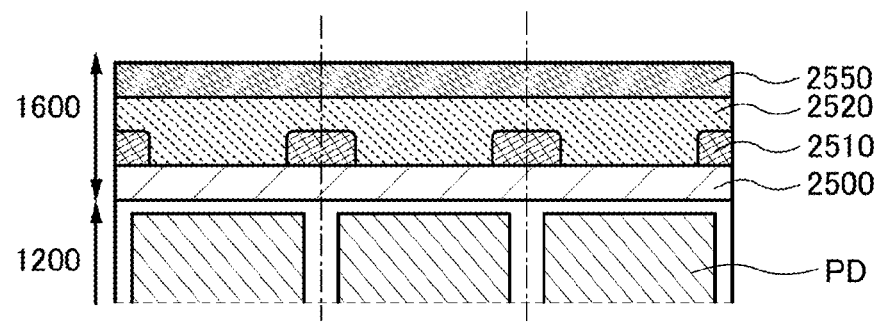

As illustrated in FIG. 28B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiations and is used for an X-ray imaging device or the like can be obtained. Radiations such as X-rays pass through a subject to enter a scintillator, and then are converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator includes a substance that, when irradiated with radiations such as X-rays or gamma-rays, absorbs energy of the radiations to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element PD using a selenium-based material, radiations such as X-rays can be directly converted into charge; thus, the scintillator is not necessarily used.

Figure 28C:
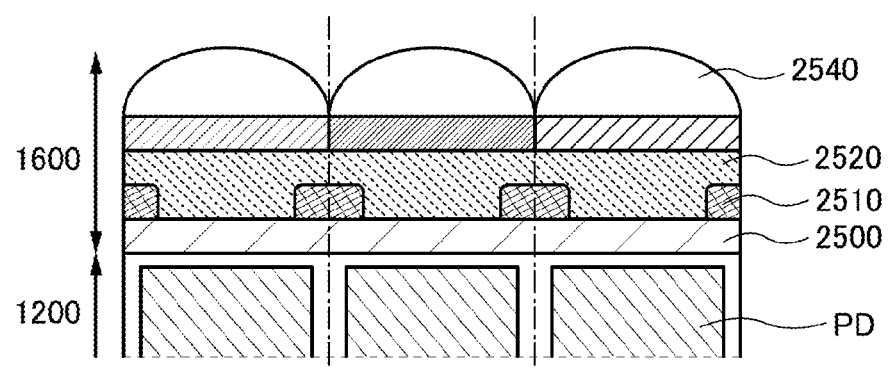

Alternatively, as illustrated in FIG. 28C, a microlens array 2540 may be provided over the color filters 2530a, 2530b, and 2530c. Light penetrating lenses included in the microlens array 2540 goes through the color filters positioned thereunder to reach the photoelectric conversion element PD. Note that a region other than the layer 1200 in FIGS. 28A to 28C is referred to as a layer 1600.

Figure 29:
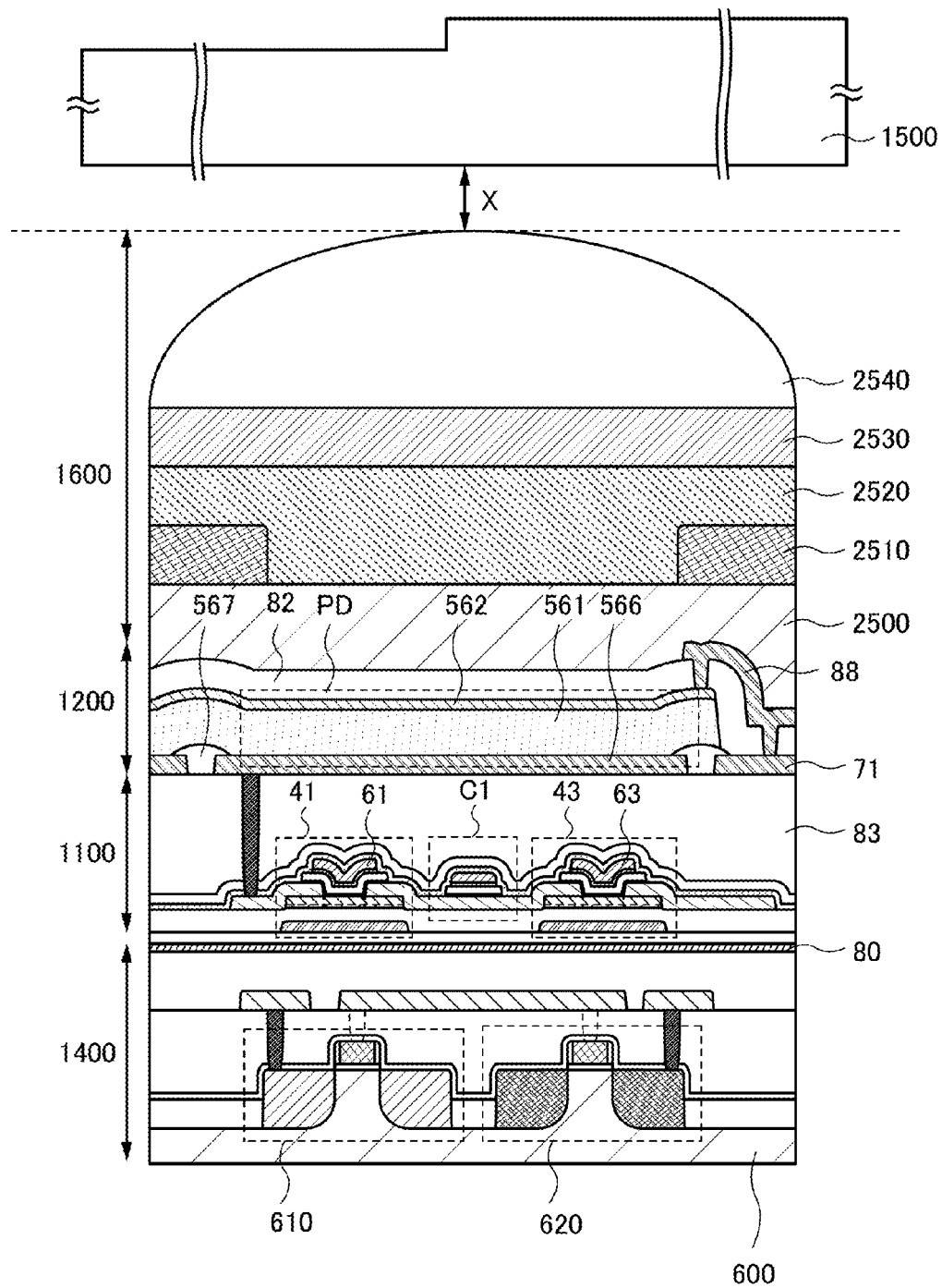
FIG. 29 is a cross-sectional view illustrating a structure of an imaging device.

FIG. 29 illustrates a specific example of a layered structure including the pixel circuit 20 of one embodiment of the present invention, the microlens array 2540 illustrated in FIG. 28C, and the like. In the example illustrated in FIG. 29, the structure of the pixel illustrated in FIG. 23A is used. In the case of using the pixel illustrated in FIG. 27, a structure illustrated in FIG. 30 is employed.

The photoelectric conversion element PD, the circuit of the pixel circuit 20, and the driver circuit can be positioned so as to overlap with each other in this manner, leading to a reduction in the size of the imaging device.

Figure 30:
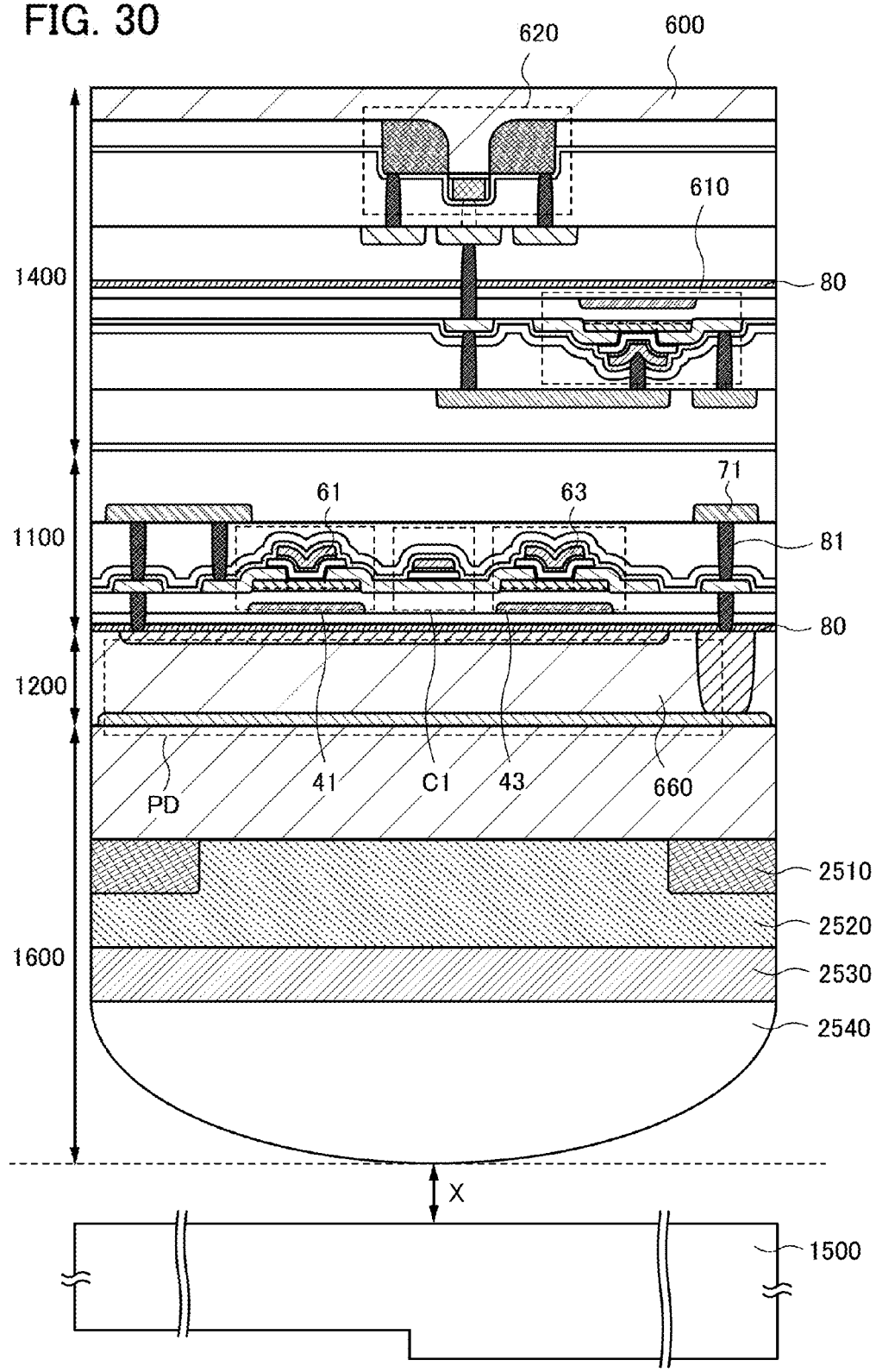
FIG. 30 is a cross-sectional view illustrating a structure of an imaging device.

As illustrated in FIG. 29 and FIG. 30, a diffraction grating 1500 may be provided. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 μm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 31A1 and 31B1, the imaging device may be bent. FIG. 31A1 illustrates a state in which the imaging device is bent along dashed-two dotted line Y1-Y2. FIG. 31A2 is a cross-sectional view illustrating a portion indicated by dashed-two dotted line X1-X2 in FIG. 31A1. FIG. 31A3 is a cross-sectional view illustrating a portion indicated by dashed-two dotted line Y1-Y2 in FIG. 31A1.

FIG. 31B1 illustrates a state where the imaging device is bent along dashed-two dotted line X3-X4 and along dashed-two dotted line Y3-Y4. FIG. 31B2 is a cross-sectional view illustrating a portion indicated by dashed-two dotted line X3-X4 in FIG. 31B1. FIG. 31B3 is a cross-sectional view illustrating a portion indicated by dashed-two dotted line Y3-Y4 in FIG. 31B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of the imaging device can be easily reduced. In addition, the quality of a captured image can be improved.

In Embodiment 1, one embodiment of the present invention has been described. Other embodiments of the present invention are described in Embodiments 2 to 6. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, a transistor including an oxide semiconductor that can be used in one embodiment of the present invention will be described with reference to drawings. In the drawings in this embodiment, some components are enlarged, reduced in size, or omitted for easy understanding.

Figure 32A:
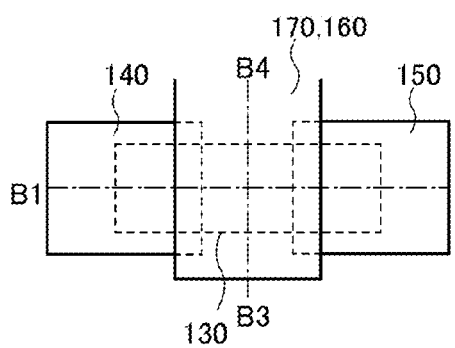
FIGS. 32A to 32F are top views and cross-sectional views illustrating transistors.
Figure 32B:
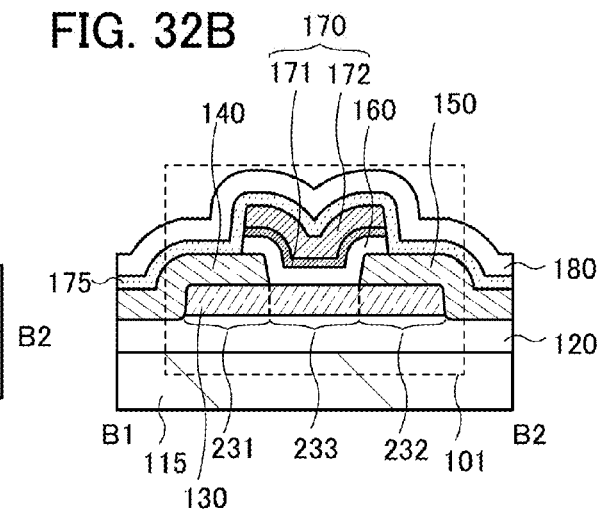
Figure 34A:
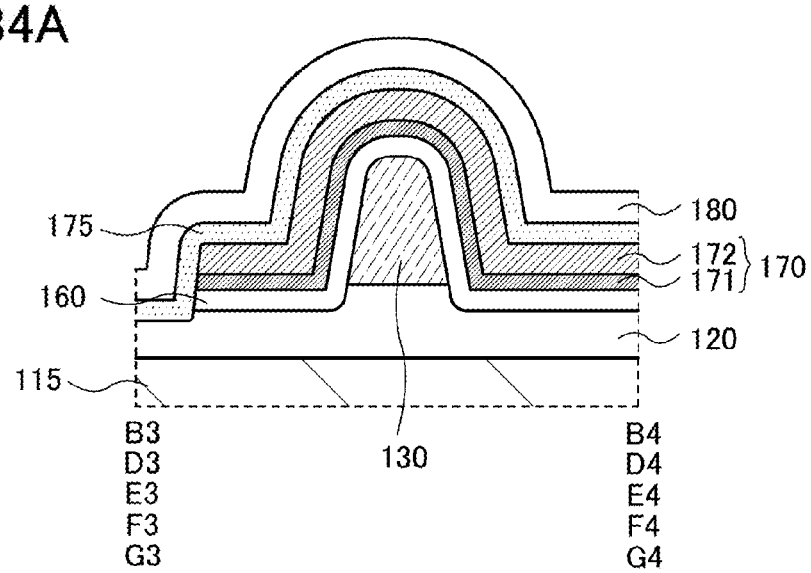
FIGS. 34A to 34D each illustrate a cross section of a transistor in a channel width direction.
Figure 34B:
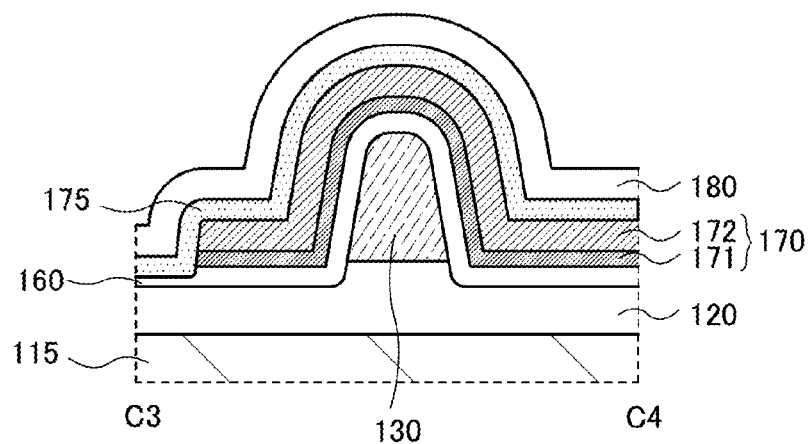

FIGS. 32A and 32B are a top view and a cross-sectional view illustrating a transistor 101 of one embodiment of the present invention. FIG. 32A is the top view, and FIG. 32B illustrates a cross section in the direction of dashed-dotted line B1-B2 in FIG. 32A. A cross section in the direction of dashed-dotted line B3-B4 in FIG. 32A is illustrated in FIG. 34A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 32B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in a circuit operation, for example. Therefore, the terms "source" and "drain" can be interchanged with each other in this specification. In addition, the term "electrode layer" can be replaced with the term "wiring".

The conductive layer 170 includes two layers, conductive layers 171 and 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 32C:
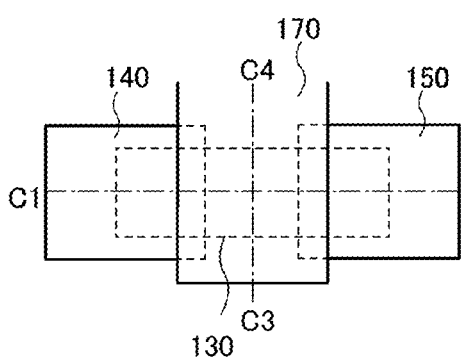
Figure 32D:
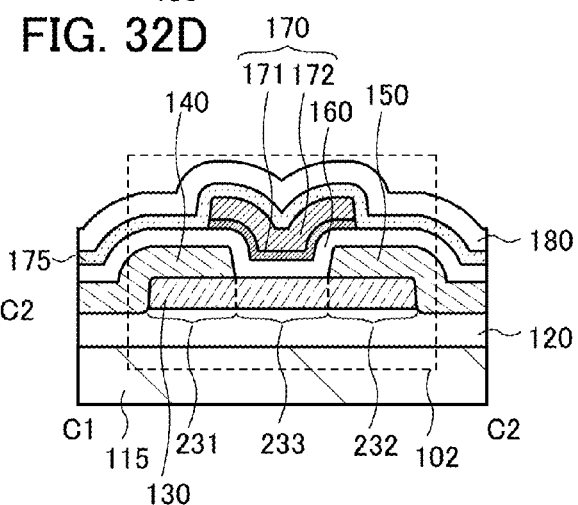

The transistor in one embodiment of the present invention may have a structure illustrated in FIGS. 32C and 32D. FIG. 32C is a top view of a transistor 102. A cross section in the direction of dashed-dotted line C1-C2 in FIG. 32C is illustrated in FIG. 32D. A cross section in the direction of dashed-dotted line C3-C4 in FIG. 32C is illustrated in FIG.

34B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 32E:
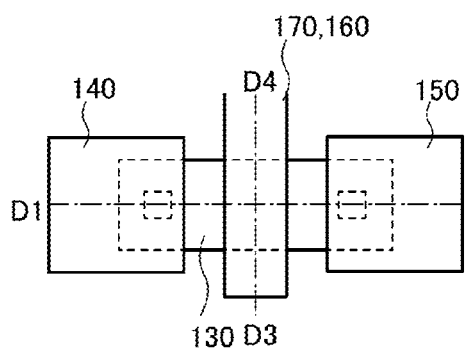
Figure 32F:
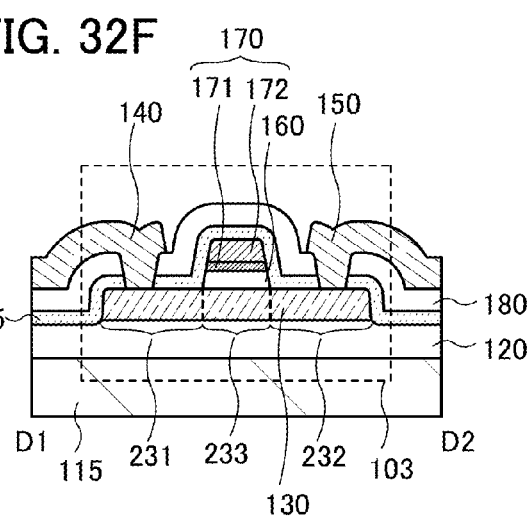

The transistor in one embodiment of the present invention may have a structure illustrated in FIGS. 32E and 32F. FIG. 32E is a top view of a transistor 103. A cross section in the direction of dashed-dotted line D1-D2 in FIG. 32E is illustrated in FIG. 32F. A cross section in the direction of dashed-dotted line D3-D4 in FIG. 32E is illustrated in FIG. 34A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 32F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 33A:
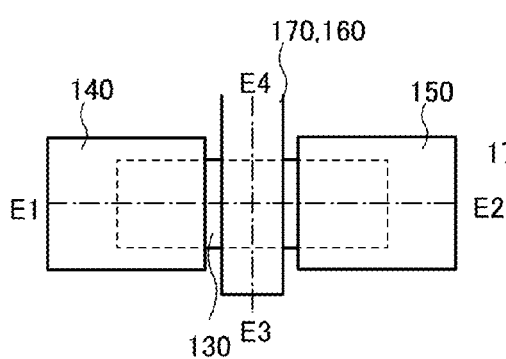
FIGS. 33A to 33F are top views and cross-sectional views illustrating transistors.
Figure 33B:
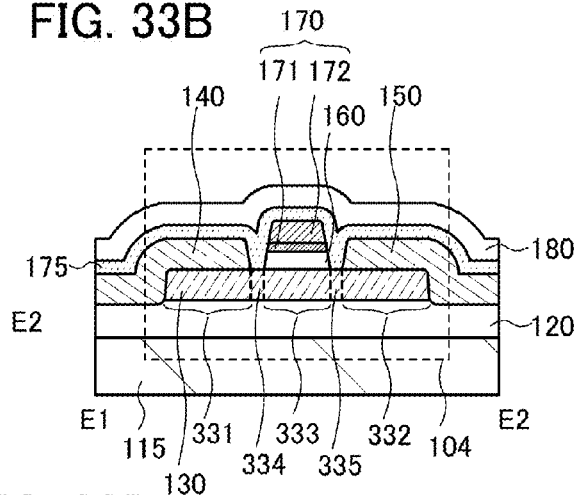

The transistor in one embodiment of the present invention may have a structure illustrated in FIGS. 33A and 33B. FIG. 33A is a top view of a transistor 104. A cross section in the direction of dashed-dotted line E1-E2 in FIG. 33A is illustrated in FIG. 33B. A cross section in the direction of dashed-dotted line E3-E4 in FIG. 33A is illustrated in FIG. 34A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 33B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require a high-speed operation.

Figure 33C:
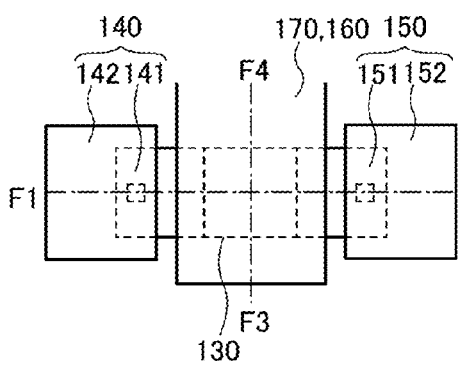
Figure 33D:
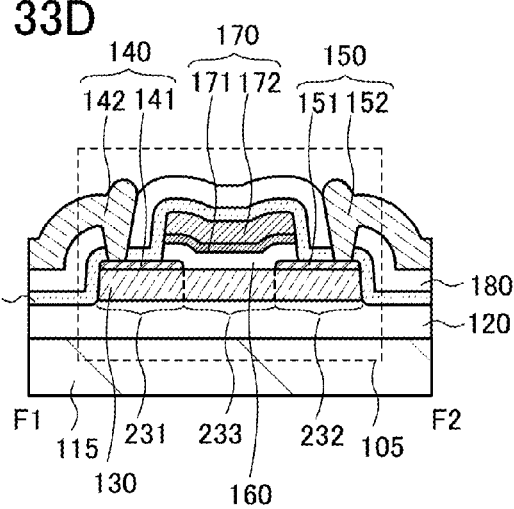

The transistor in one embodiment of the present invention may have a structure illustrated in FIGS. 33C and 33D. FIG. 33C is a top view of a transistor 105. A cross section in the direction of dashed-dotted line F1-F2 in FIG. 33C is illustrated in FIG. 33D. A cross section in the direction of dashed-dotted line F3-F4 in FIG. 33C is illustrated in FIG. 34A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 33E:
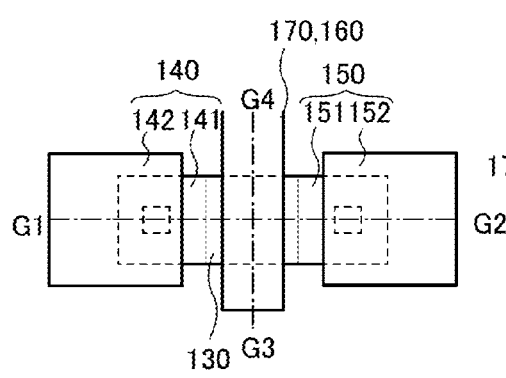
Figure 33F:
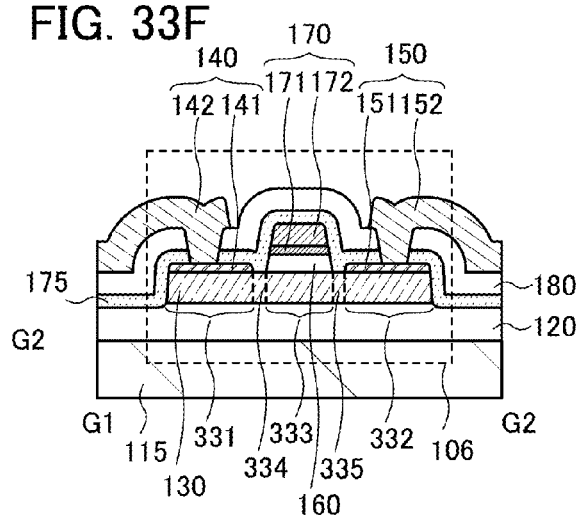

The transistor in one embodiment of the present invention may have a structure illustrated in FIGS. 33E and 33F. FIG. 33E is a top view of a transistor 106. A cross section in the direction of dashed-dotted line G1-G2 in FIG. 33E is illustrated in FIG. 33F. A cross section in the direction of dashed-dotted line G3-G4 in FIG. 33A is illustrated in FIG. 34A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as source and drain electrode layers; thus, contact resistance between the oxide conductor layer and the conductive layers functioning as source and drain electrode layers can be reduced.

Figure 34C:
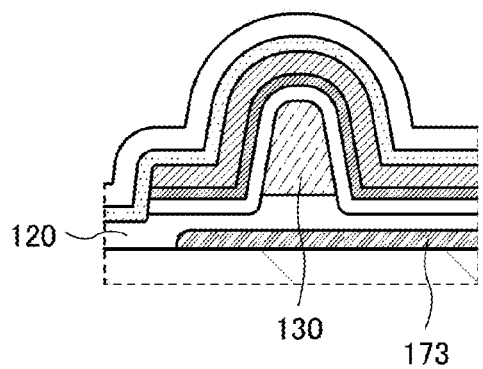
Figure 34D:
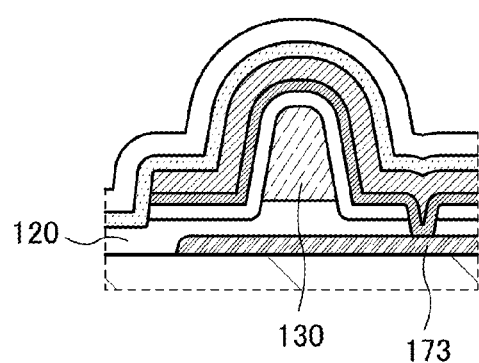
Figure 35A:
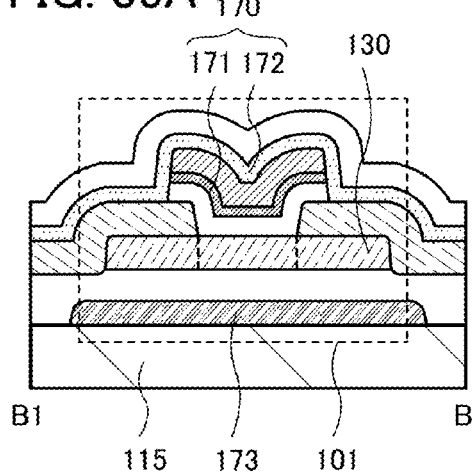
FIGS. 35A to 35F each illustrate a cross section of a transistor in a channel length direction.
Figure 35B:
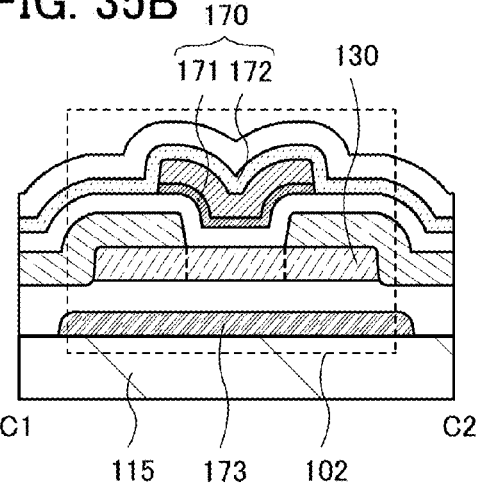
Figure 35C:
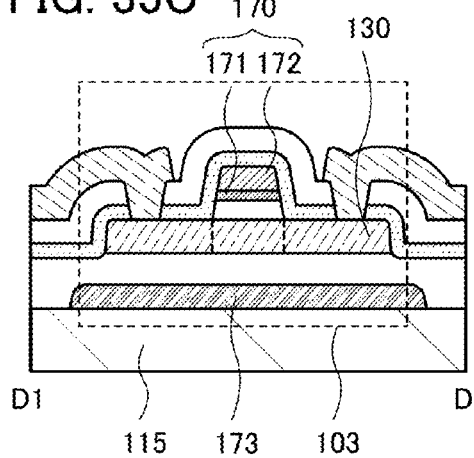
Figure 35D:
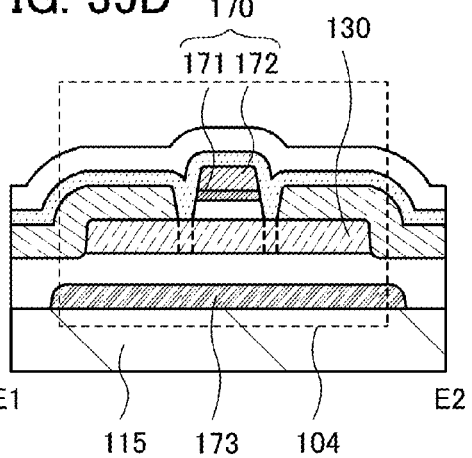
Figure 35E:
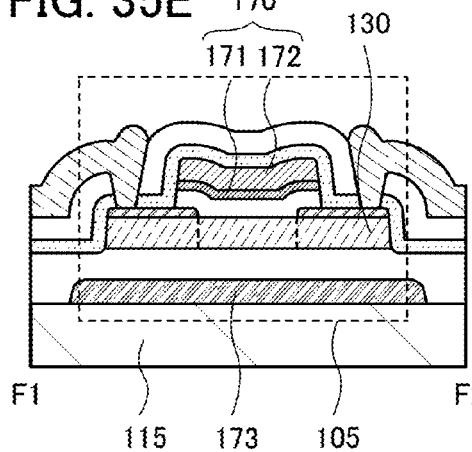
Figure 35F:
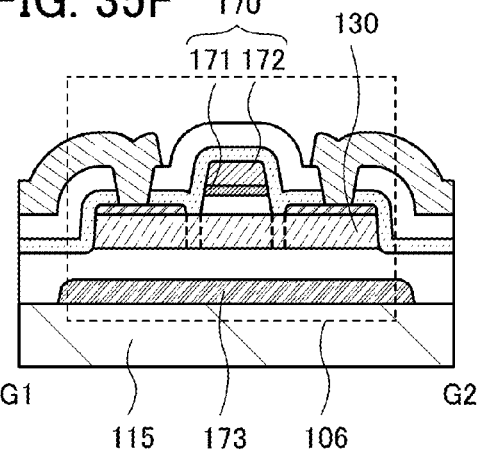

The transistor in one embodiment of the present invention may include a conductive layer 173 between the oxide semiconductor layer 130 and the substrate 115 as illustrated in cross-sectional views in the channel length direction in FIGS. 35A to 35F and cross-sectional views in the channel width direction in FIGS. 34C and 34D. When the conductive layer 173 is used as a second gate electrode layer (back gate), the on-state current can be increased or the threshold voltage can be controlled. In the cross-sectional views in FIGS. 35A to 35F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 34D, the conductive layers 170 and 173 may be electrically connected to each other through a contact hole.

Although the transistors 101 to 106 in FIGS. 32A to 32F and FIGS. 33A to 33F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 36B and 36C or FIGS. 36D and 36E.

Figure 36A:
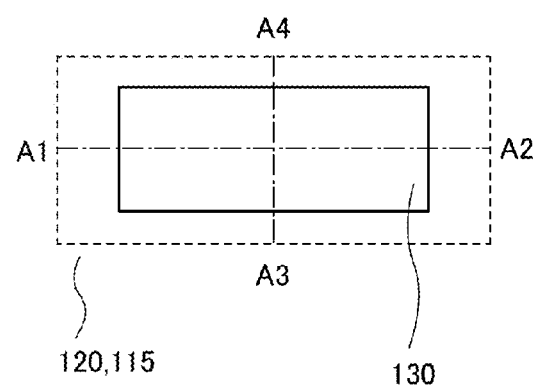
FIGS. 36A to 36E are a top view and cross-sectional views illustrating a semiconductor layer.
Figure 36B:
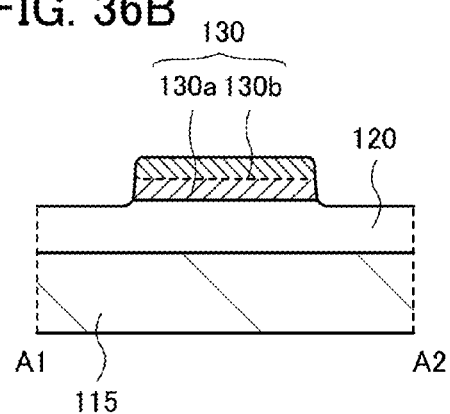
Figure 36D:
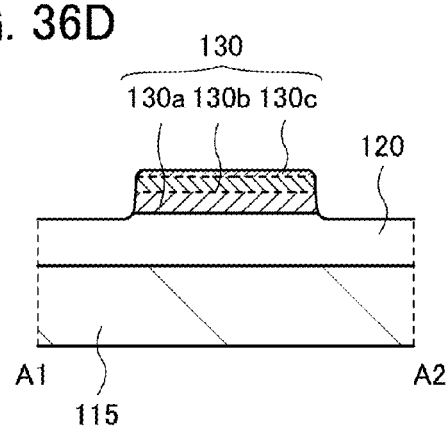
Figure 36C:
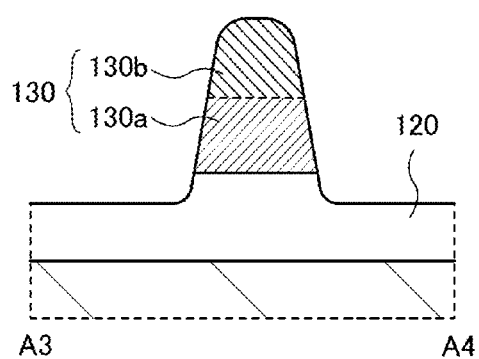
Figure 36E:
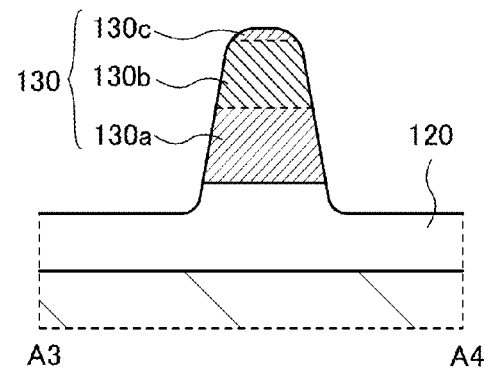

FIG. 36A is a top view of the oxide semiconductor layer 130, and FIGS. 36B and 36C are cross-sectional views of the oxide semiconductor layer 130 with a two-layer structure. FIGS. 36D and 36E are cross-sectional views of the oxide semiconductor layer 130 with a three-layer structure.

Oxide semiconductor layers with different compositions, for example, can be used as oxide semiconductor layers 130a, 130b, and 130c.

Figure 37A:
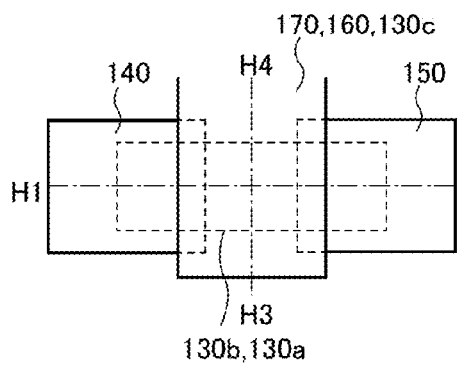
FIGS. 37A to 37F are top views and cross-sectional views illustrating transistors.
Figure 37B:
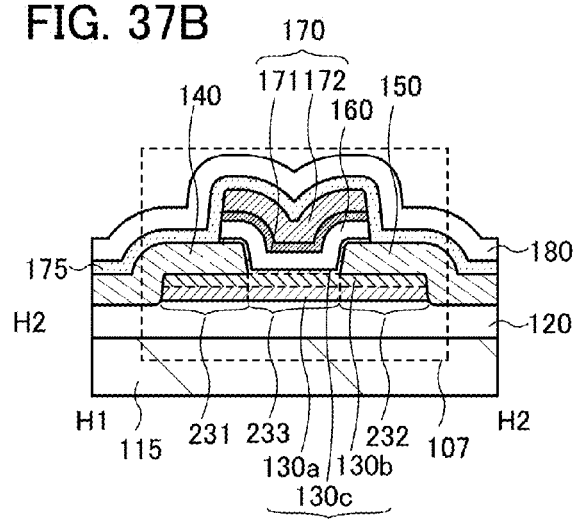
Figure 39A:
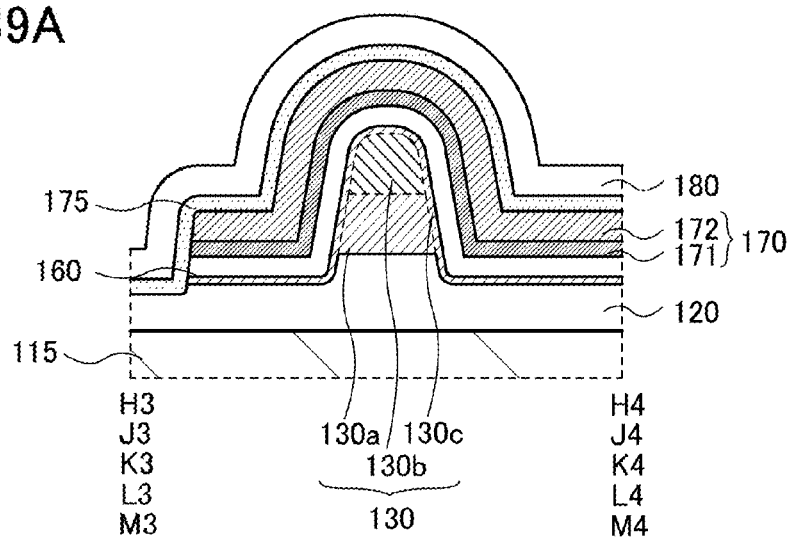
FIGS. 39A to 39D each illustrate a cross section of a transistor in a channel width direction.

The transistor in one embodiment of the present invention may have a structure illustrated in FIGS. 37A and 37B. FIG. 37A is a top view of a transistor 107. A cross section in the direction of dashed-dotted line H1-H2 in FIG. 37A is illustrated in FIG. 37B. A cross section in the direction of dashed-dotted line H3-H4 in FIG. 37A is illustrated in FIG. 39A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 37C:
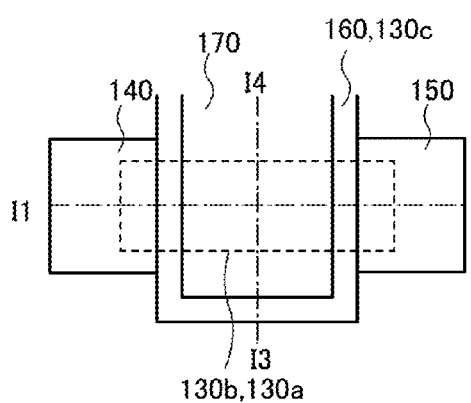
Figure 37D:
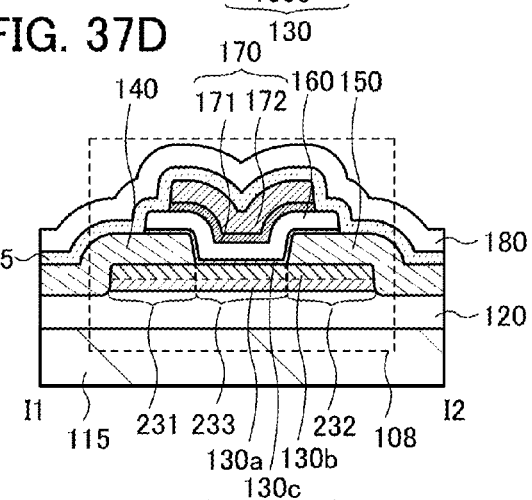
Figure 39B:
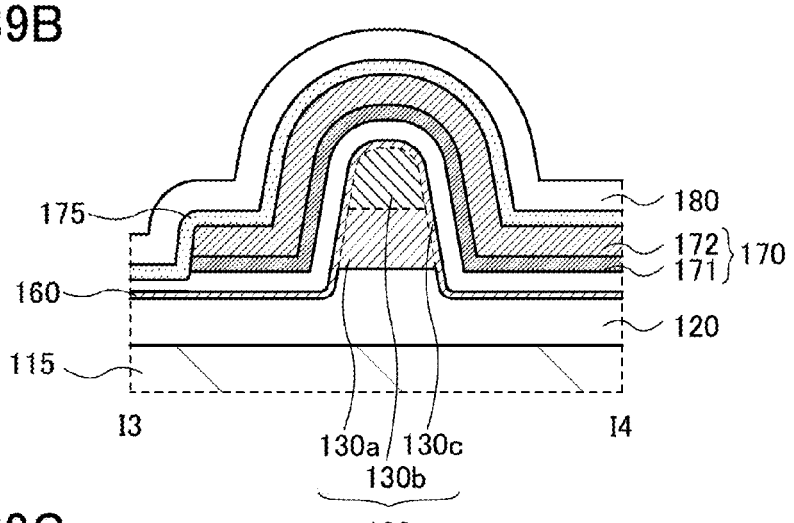

The transistor in one embodiment of the present invention may have a structure illustrated in FIGS. 37C and 37D. FIG. 37C is a top view of a transistor 108. A cross section in the direction of dashed-dotted line 11-12 in FIG. 37C is illustrated in FIG. 37D. A cross section in the direction of dashed-dotted line 13-14 in FIG. 37C is illustrated in FIG. 39B. The direction of dashed-dotted line 11-12 is referred to as a channel length direction, and the direction of dashed-dotted line 13-14 is referred to as a channel width direction.

The transistor 108 differs from the transistor 107 in that end portions of the insulating layer 160 and the oxide semiconductor layer 130c are not aligned with the end portion of the conductive layer 170.

Figure 37E:
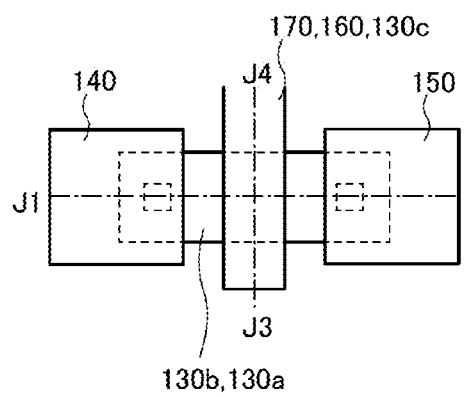
Figure 37F:
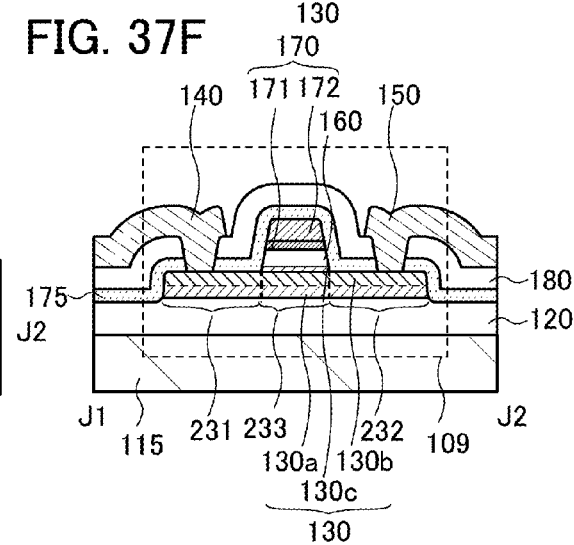

The transistor in one embodiment of the present invention may have a structure illustrated in FIGS. 37E and 37F. FIG. 37E is a top view of a transistor 109. A cross section in the direction of dashed-dotted line J1-J2 in FIG. 37E is illustrated in FIG. 37F. A cross section in the direction of dashed-dotted line J3-J4 in FIG. 37E is illustrated in FIG. 39A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 38A:
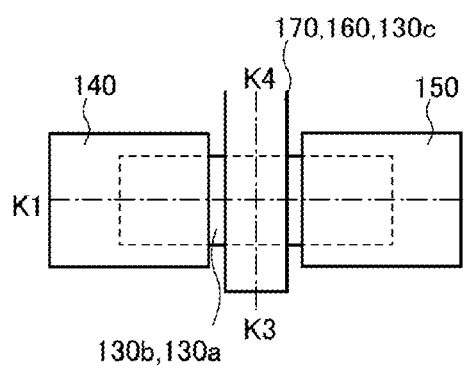
FIGS. 38A to 38F are top views and cross-sectional views illustrating transistors.
Figure 38B:
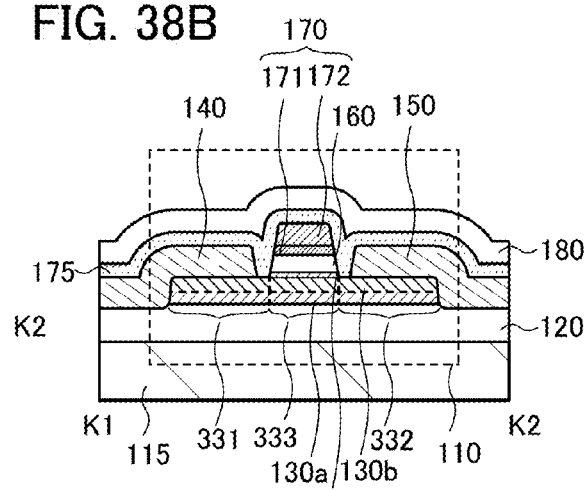

The transistor in one embodiment of the present invention may have a structure illustrated in FIGS. 38A and 38B. FIG. 38A is a top view of a transistor 110. A cross section in the direction of dashed-dotted line K1-K2 in FIG. 38A is illustrated in FIG. 38B. A cross section in the direction of dashed-dotted line K3-K4 in FIG. 38A is illustrated in FIG. 39A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 38C:
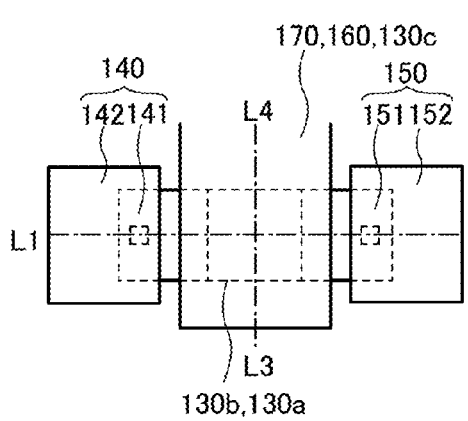
Figure 38D:
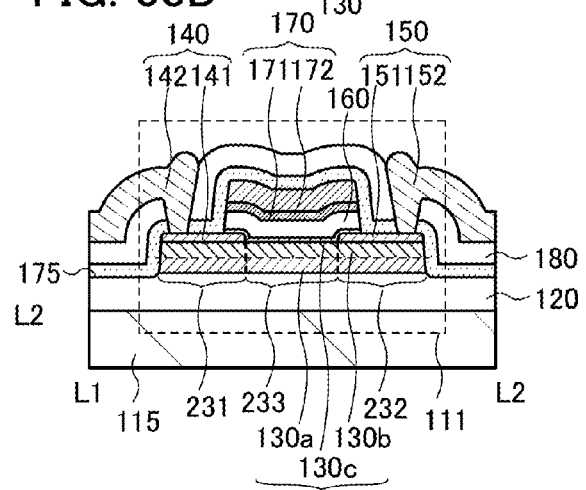

The transistor in one embodiment of the present invention may have a structure illustrated in FIGS. 38C and 38D. FIG. 38C is a top view of a transistor 111. A cross section in the direction of dashed-dotted line L1-L2 in FIG. 38C is illustrated in FIG. 38D. A cross section in the direction of dashed-dotted line L3-L4 in FIG. 38C is illustrated in FIG. 39A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 38E:
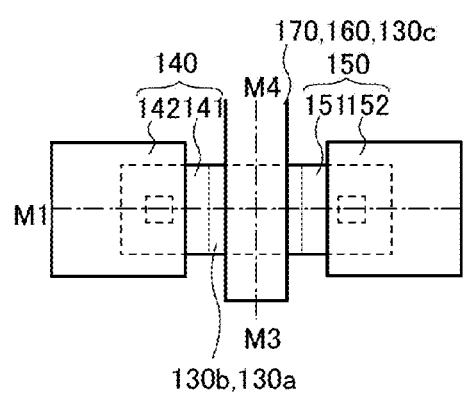
Figure 38F:
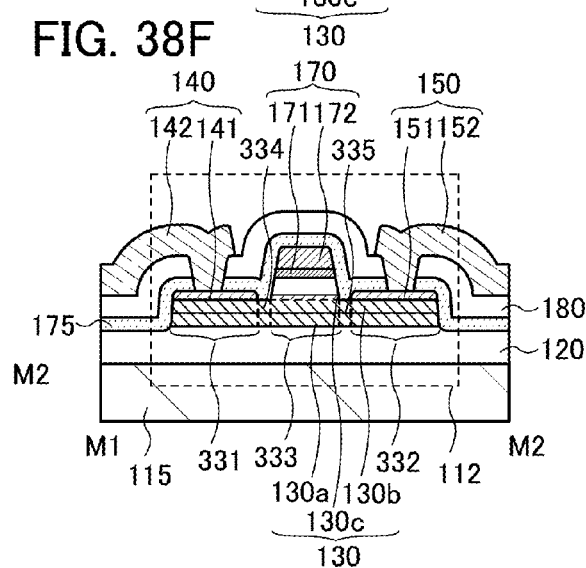

The transistor in one embodiment of the present invention may have a structure illustrated in FIGS. 38E and 38F. FIG. 38E is a top view of a transistor 112. A cross section in the direction of dashed-dotted line M1-M2 in FIG. 38E is illustrated in FIG. 38F. A cross section in the direction of dashed-dotted line M3-M4 in FIG. 38E is illustrated in FIG. 39A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 39C:
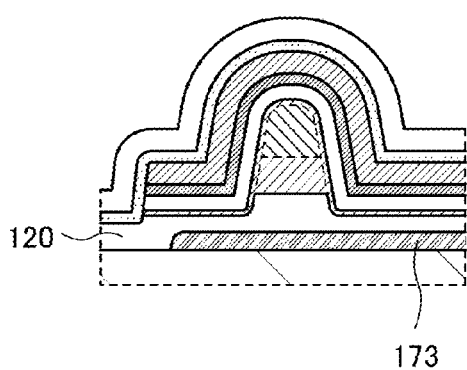
Figure 39D:
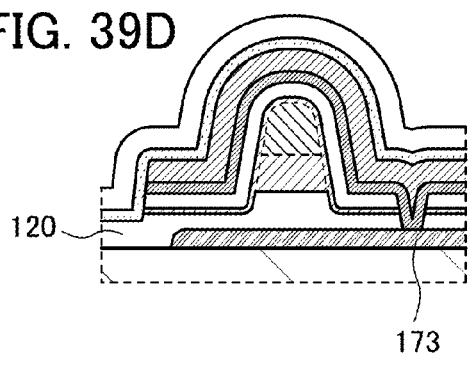
Figure 40A:
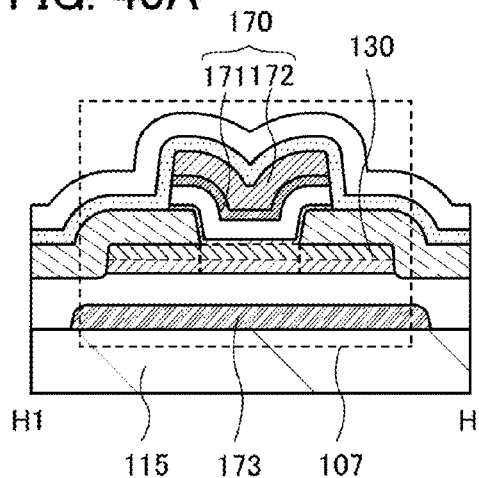
FIGS. 40A to 40F each illustrate a cross section of a transistor in a channel length direction.
Figure 40B:
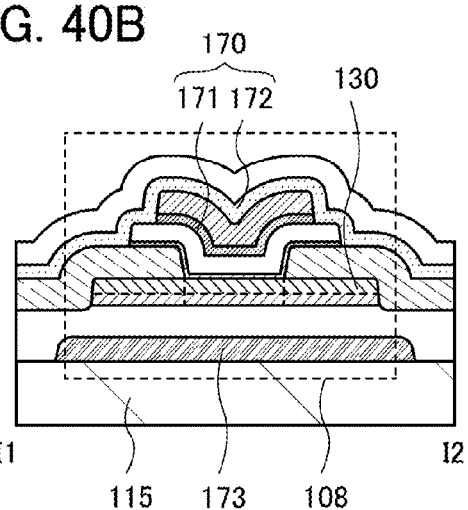
Figure 40C:
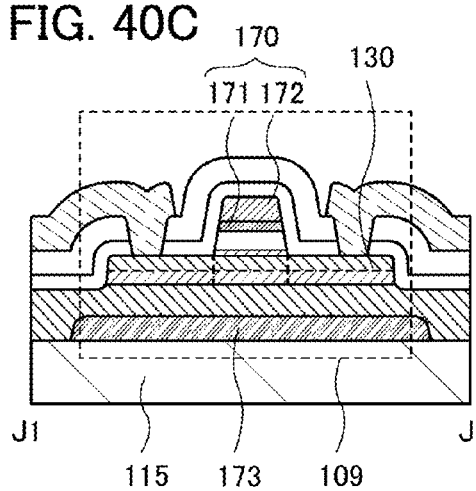
Figure 40D:
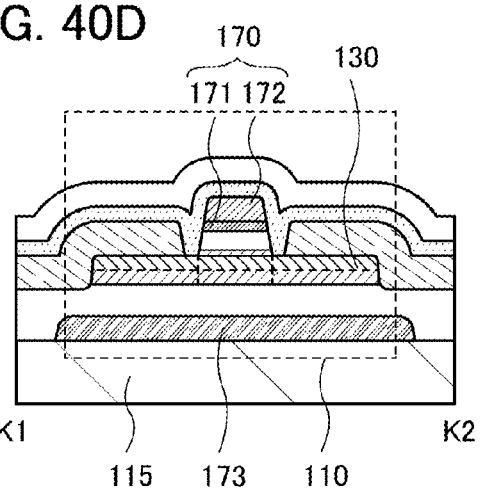
Figure 40E:
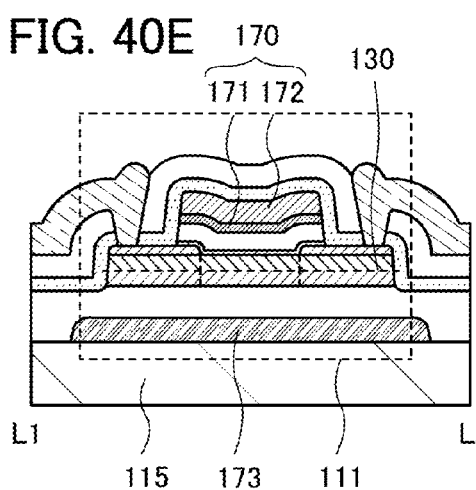
Figure 40F:
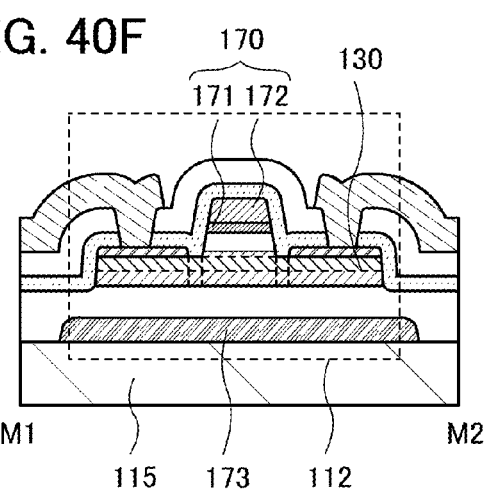

The transistor in one embodiment of the present invention may include the conductive layer 173 between the oxide semiconductor layer 130 and the substrate 115 as illustrated in cross-sectional views in the channel length direction in FIGS. 40A to 40F and cross-sectional views in the channel width direction in FIGS. 39C and 39D. When the conductive layer is used as a second gate electrode layer (back gate), the on-state current can be increased or the threshold voltage can be controlled. In the cross-sectional views in FIGS. 40A to 40F, the width of the conductive layer 173 may be shorter than that of the oxide semiconductor layer 130. Moreover, the width of the conductive layer 173 may be shorter than that of the conductive layer 170.

The transistor in one embodiment of the present invention may have a structure illustrated in FIGS. 41A and 41B. FIG. 41A is a top view and FIG. 41B is a cross-sectional view taken along dashed-dotted line N1-N2 and dashed-dotted line N3-N4 in FIG. 41A. Note that for simplification of the drawing, some components are not illustrated in the top view in FIG. 41A.

A transistor 113 illustrated in FIGS. 41A and 41B includes the substrate 115, the insulating layer 120 over the substrate 115, the oxide semiconductor layer 130 (the oxide semiconductor layers 130a to 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in an insulating layer 190 over the transistor 113 and reaches the oxide semiconductor layers 130a and 130b and the insulating layer 120.

The transistor 113 has a smaller region in which a conductor serving as a source or drain electrode overlaps with a conductor serving as a gate electrode than the other transistors described above; thus, the parasitic capacitance in the transistor 113 can be reduced. Therefore, the transistor 113 is preferable as a component of a circuit for which a high-speed operation is needed. As illustrated in FIG. 41B, a top surface of the transistor 113 is preferably planarized by a chemical mechanical polishing (CMP) method or the like, but is not necessarily planarized.

Figure 42A:
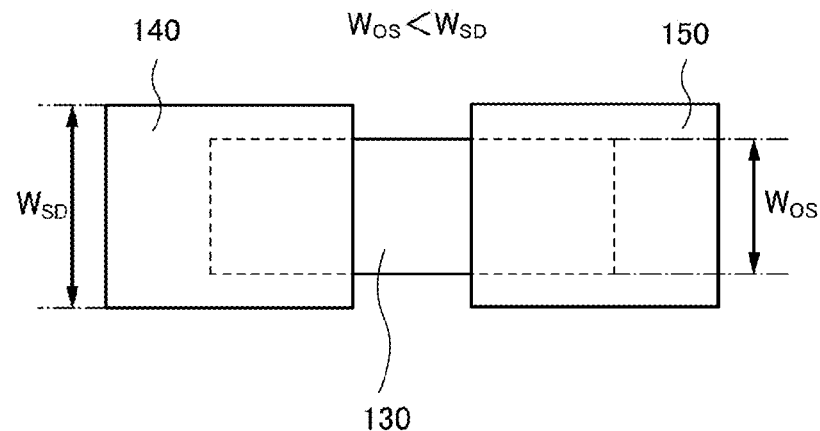
FIGS. 42A to 42C are top views each illustrating a transistor.
Figure 42B:
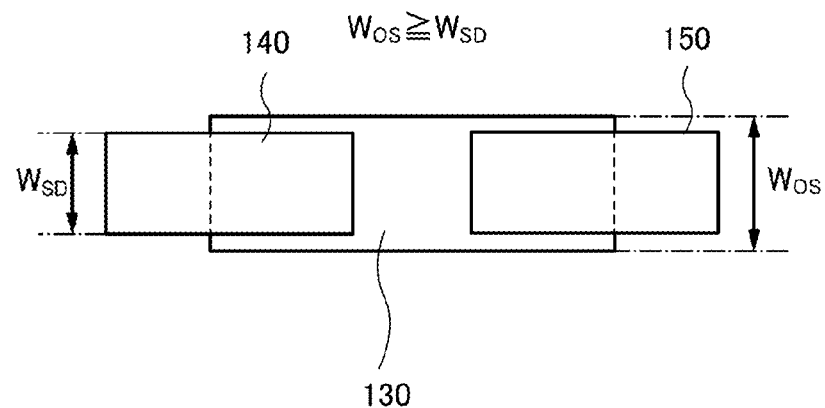
Figure 42C:
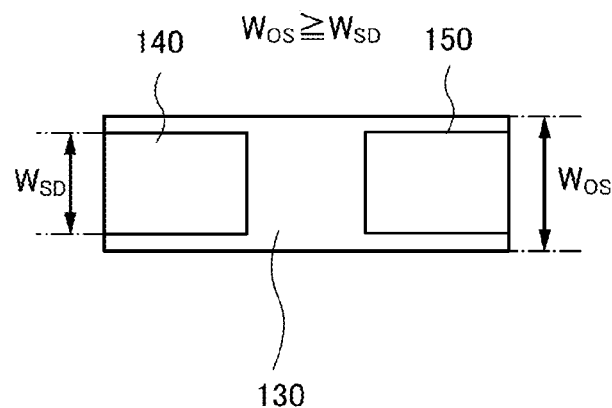

As shown in the top views in FIGS. 42A and 42B (showing only the oxide semiconductor layer 130 and the conductive layers 140 and 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 42C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 3

In this embodiment, components of the transistors described in Embodiment 2 will be described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layers 130a and 130b described in this embodiment are sequentially stacked from the insulating layer 120 side is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layers 130a and 130c can be regarded as having a region serving as an insulator or a semi-insulator.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 or more times, preferably 2 or more times and further preferably 3 or more times as large as that in the oxide semiconductor layer 130b. Any of the above metal elements is strongly bonded to oxygen and thus has a function of suppressing generation of an oxygen vacancy in the oxide semiconductor layers. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

When each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn that is $x_1:y_1:z_1$, the oxide semiconductor layer 130b has an atomic ratio of In to M and Zn that is $x_2:y_2:z_2$, and the oxide semiconductor layer 130c has an atomic ratio of In to M and Zn that is $x_3:y_3:z_3$, each of $y_1/x_1$ and $y_3/x_3$ is preferably larger than $y_2/x_2$. Each of $y_1/x_1$ and $y_3/x_3$ is 1.5 or more times, preferably 2 or more times and further preferably 3 or more times, as large as $y_2/x_2$. At this time, when $y_2$ is greater than or equal to $x_2$ in the oxide semiconductor layer 130b, the transistor can have stable electrical characteristics. However, when $y_2$ is 3 or more times as large as X2, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, and further preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, and further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, and further preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, and further preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, and further preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1 \times 10^{19}/cm^3$, lower than $1 \times 10^{15}/cm^3$, lower than $1 \times 10^{13}/cm^3$, or lower than $1 \times 10^{8}/cm^3$, and higher than or equal to $1 \times 10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$, and is higher than or equal to $1 \times 10^{17}$ atoms/cm$^3$. In addition, the oxide semiconductor layer is controlled to have a region in which the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$, and is higher than or equal to $5 \times 10^{16}$ atoms/cm$^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1 \times 10^{19}$ atoms/cm$^3$, preferably lower than $5 \times 10^{18}$ atoms/cm$^3$, and is higher than or equal to $1 \times 10^{18}$ atoms/cm$^3$. Furthermore, the oxide semiconductor layer is controlled to have a region in which the concentration of carbon is lower than $1 \times 10^{19}$ atoms/cm$^3$, preferably lower than $5 \times 10^{18}$ atoms/cm$^3$ and further preferably lower than $1 \times 10^{18}$ atoms/cm$^3$, and is higher than or equal to $6 \times 10^{17}$ atoms/cm$^3$.

As described above, a transistor in which a highly purified oxide semiconductor layer is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimum changes continuously within the oxide semiconductor layers 130a to 130c. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also continuous junction (here, in particular, a well structure having a U shape in which the conduction band minimum is continuously changed between the layers (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, 1:9:6, or 1:10:1 or a Ga—Zn oxide whose atomic ratio of Ga to Zn is 10:1 can be used for the oxide semiconductor layers 130a and 130c, and an In—Ga—Zn oxide whose atomic ratio of In to Ga and Zn is 1:1:1, 2:1:3, 5:5:6, 3:1:2, 4:2:3, or 4:2:4.1 can be used for the oxide semiconductor layer 130b. In the case where the oxide semiconductor layers 130a to 130c are formed using the above-described oxides as sputtering targets, the atomic ratios of the oxide semiconductor layers are not necessarily consistent with those of their respective sputtering targets and may vary from those of the sputtering targets within a range of ±40%.

The oxide semiconductor layer 130b of the oxide semiconductor layer 130 serves as a well, so that a channel is formed in the oxide semiconductor layer 130b. Since the conduction band minimum is continuously changed, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film that releases ammonia more than nitrogen oxide in TDS; the amount of released ammonia is typically greater than or equal to $1\times10^{18}/\text{cm}^3$ and less than or equal to $5\times10^{19}/\text{cm}^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas that is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor layer, e.g., an In—Ga—Zn—O layer is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas that is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 4

A structure of an oxide semiconductor layer that can be used in one embodiment of the present invention will be described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor.

Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 43A:
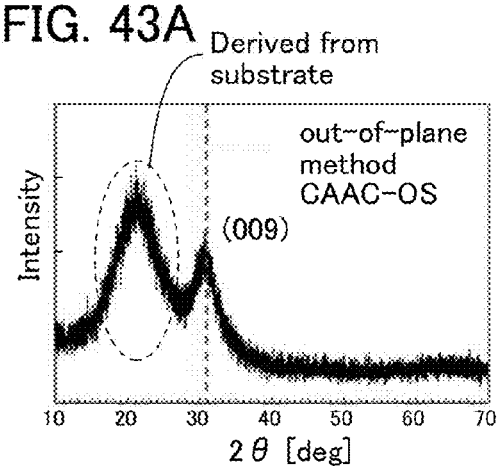
FIGS. 43A to 43E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 43A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 43B:
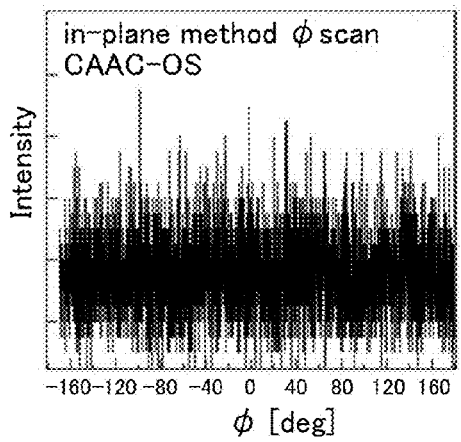
Figure 43C:
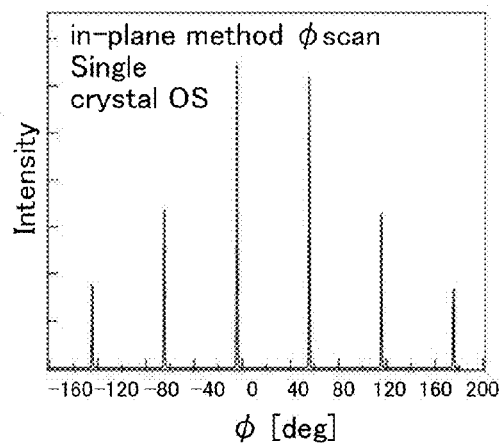

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 43B, a peak is not clearly observed. In contrast, in the case where single crystal InGaZnO$_4$ is subjected to φ scan with 2θ fixed at around 56°, as shown in FIG. 43C, six peaks that are derived from crystal planes equivalent to the (110) plane are observed. Accordingly, the structural analysis using XRD shows that the directions of a-axes and b-axes are irregularly oriented in the CAAC-OS.

Figure 43D:
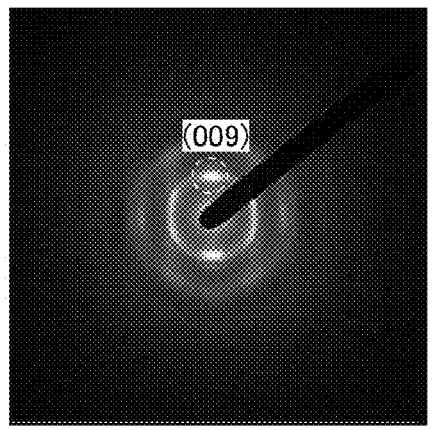
Figure 43E:
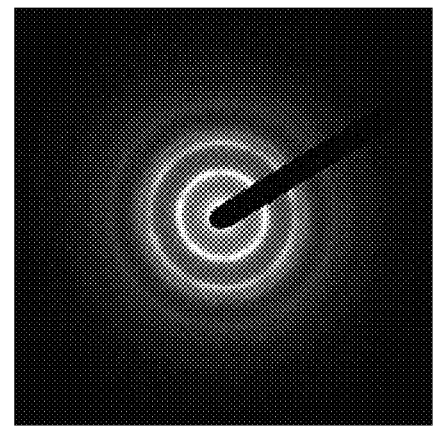

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 43D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 43E shows a diffraction pattern obtained in such a manner that an electron beam with a probe diameter of 300 nm is incident on the same sample in a direction perpendicular to the sample surface. As shown in FIG. 43E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 43E is considered to be derived from the (010) plane, the (100) plane, and the like of the InGaZnO$_4$ crystal. The second ring in FIG. 43E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 44A:
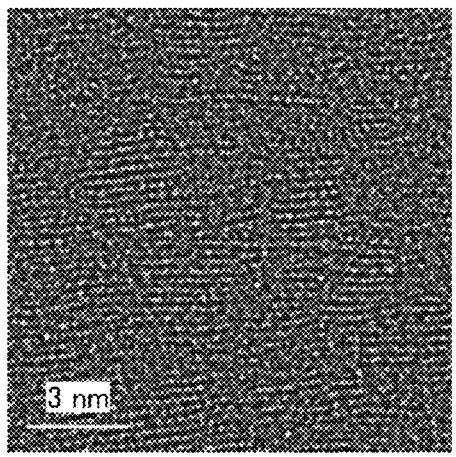
FIGS. 44A to 44E show a cross-sectional TEM image and plan-view TEM images of a CAAC-OS and images obtained through analysis thereof.

FIG. 44A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 44A shows pellets in which metal atoms are arranged in a layered manner. FIG. 44A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 44B:
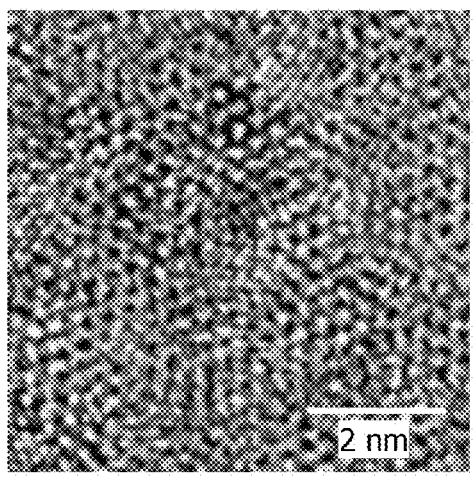
Figure 44C:
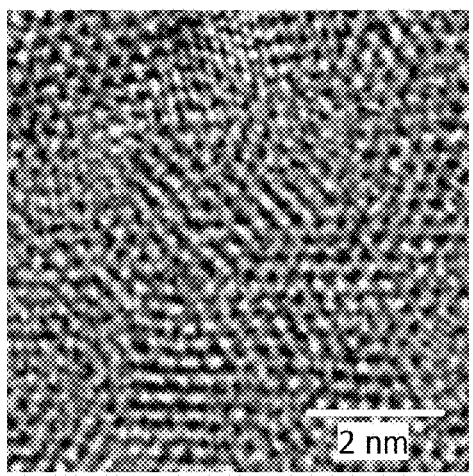
Figure 44D:
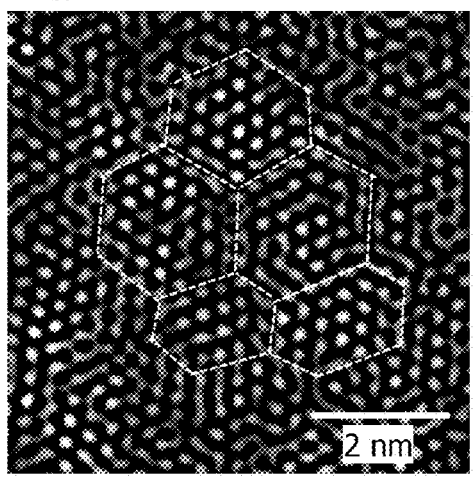
Figure 44E:
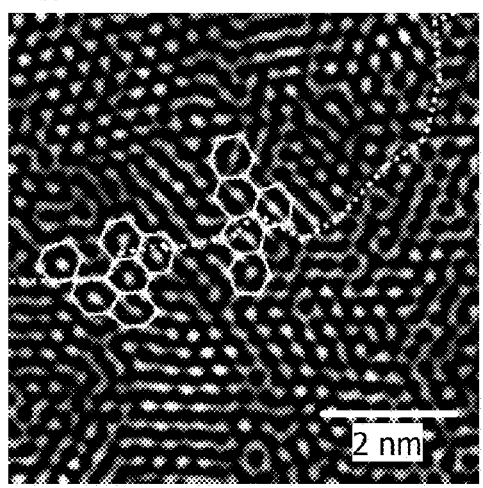

FIGS. 44B and 44C show Cs-corrected high-resolution TEM images of a plane of the CAAC-OS observed from a direction substantially perpendicular to the sample surface. FIGS. 44D and 44E are images obtained through image processing of FIGS. 44B and 44C. The method of image processing is as follows. The image in FIG. 44B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 44D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 44E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in an oxide semiconductor might serve as carrier traps or carrier generation sources, for example. For example, oxygen vacancies in an oxide semiconductor might serve as carrier traps or serve as carrier generation sources when hydrogen is captured therein.

A CAAC-OS having small amounts of impurities and oxygen vacancies is an oxide semiconductor with a low carrier density (specifically, lower than $8\times10^{11}/cm^3$, preferably lower than $1\times10^{11}/cm^3$, and further preferably lower than $1\times10^{10}/cm^3$, and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, a CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 45A:
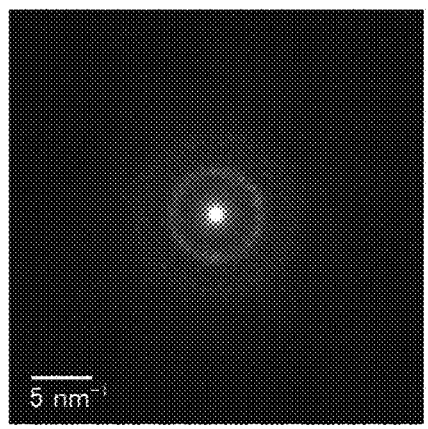
FIGS. 45A to 45D show electron diffraction patterns and a cross-sectional TEM image of an nc-OS.
Figure 45B:
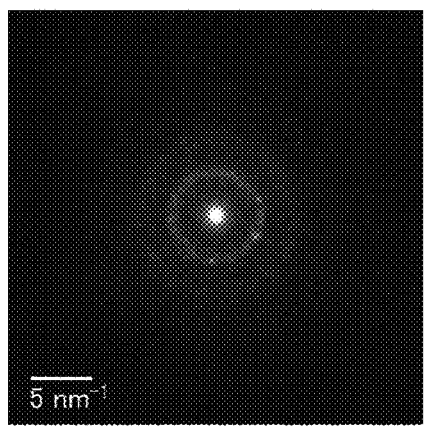

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 45A is observed. FIG. 45B shows a diffraction pattern (a nanobeam electron diffraction pattern) obtained when an electron beam with a probe diameter of 1 nm is incident on the same sample. As shown in FIG. 45B, a plurality of spots are observed in a ring-like region. In other words, ordering in an nc-OS is not observed with an electron beam with a probe diameter of 50 nm but is observed with an electron beam with a probe diameter of 1 nm.

Figure 45C:
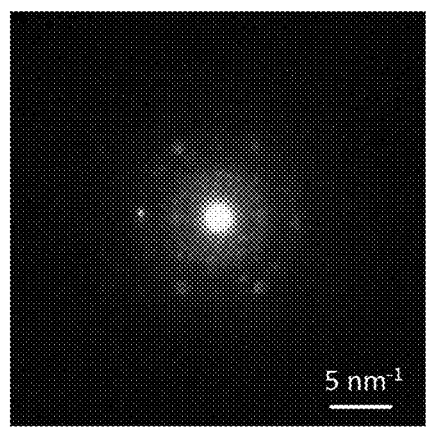

Furthermore, an electron diffraction pattern in which spots are arranged in an approximately hexagonal shape is observed in some cases as shown in FIG. 45C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 45D:
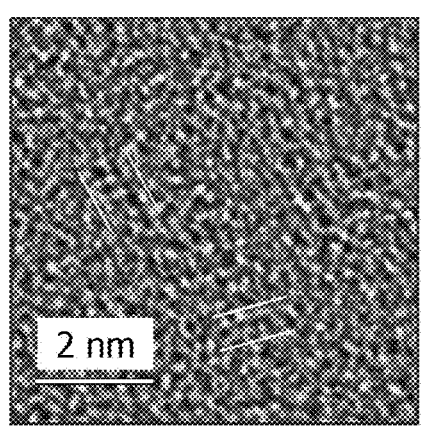

FIG. 45D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 45D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS has a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

FIGS. 46A and 46B are high-resolution cross-sectional TEM images of an a-like OS. FIG. 46A is the high-resolution cross-sectional TEM image of the a-like OS at the start of the electron irradiation. FIG. 46B is the high-resolution cross-sectional TEM image of the a-like OS after the electron (e$^-$) irradiation at $4.3\times10^8$ e$^-$/nm$^2$. FIGS. 46A and 46B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 47:
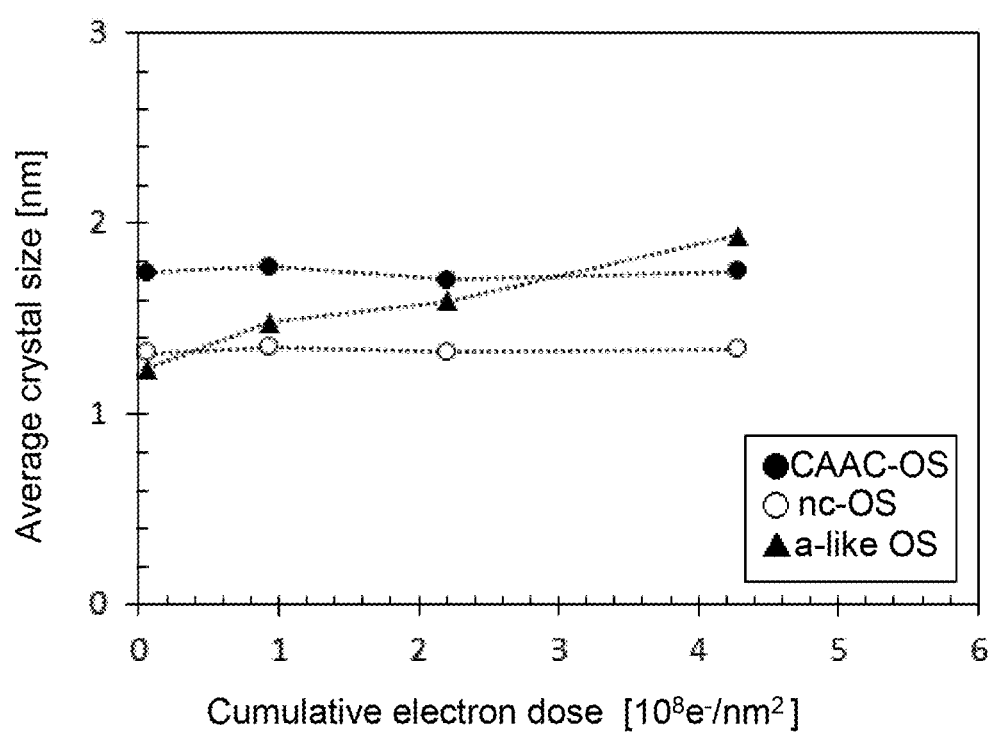
FIG. 47 shows a change of crystal parts of an In—Ga—Zn oxide owing to electron irradiation.

FIG. 47 shows change in the average size of crystal parts (at 22 points to 30 points) in each sample. Note that the crystal part size corresponds to the length of a lattice fringe. FIG. 47 indicates that the crystal part size in the a-like OS increases with an increase in the cumulative electron dose in obtaining TEM images, for example. As shown in FIG. 47, a crystal part of approximately 1.2 nm (also referred to as an initial nucleus) at the start of TEM observation grows to a size of approximately 1.9 nm at a cumulative electron (e$^-$) dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. As shown in FIG. 47, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7\times10^5$ e$^-$/(nm$^2$·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 5

In this embodiment, examples of a package and a module each including an image sensor chip will be described. For the image sensor chip, the structure of an imaging device of one embodiment of the present invention can be used.

Figure 48A:
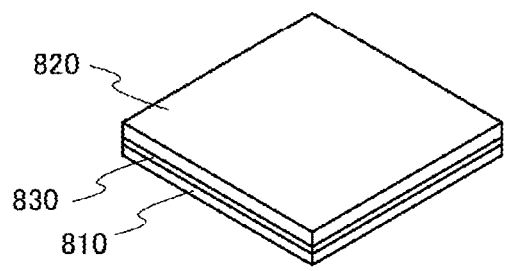
FIGS. 48A to 48D are perspective views and a cross-sectional view of a package including an imaging device.

FIG. 48A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 48B:
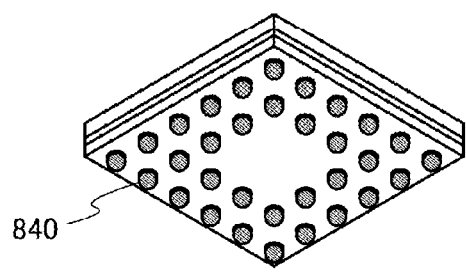

FIG. 48B is an external perspective view showing the bottom surface side of the package. On the bottom surface of the package, ball grid array (BGA) including solder balls as bumps 840 is formed. Although BGA is employed here, land grid array (LGA), pin grid array (PGA), or the like may be alternatively employed.

Figure 48C:
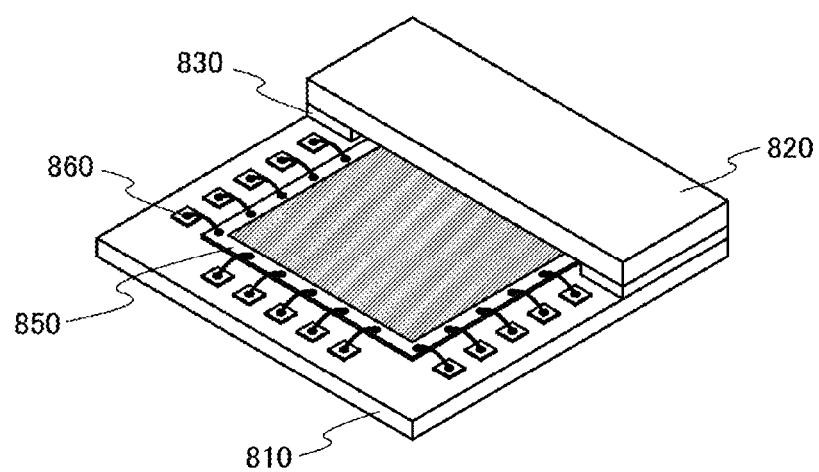
Figure 48D:
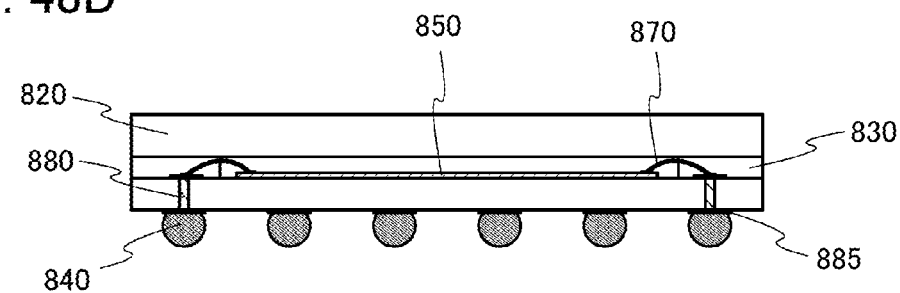

FIG. 48C is a perspective view of the package, in which the cover glass 820 and the adhesive 830 are partly illustrated. FIG. 48D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 49A:
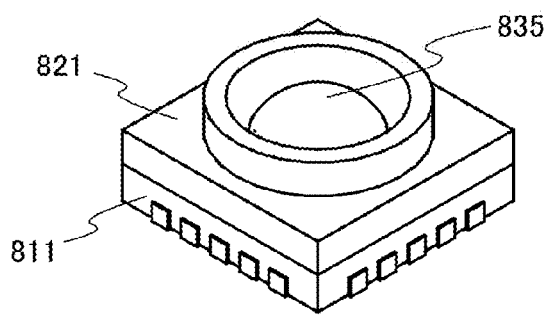
FIGS. 49A to 49D are perspective views and a cross-sectional view of a package including an imaging device.

FIG. 49A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal converter circuit, and the like of an imaging device is provided between the package substrate 811 and the image sensor chip 851. Thus, a system in package (SiP) is formed.

Figure 49B:
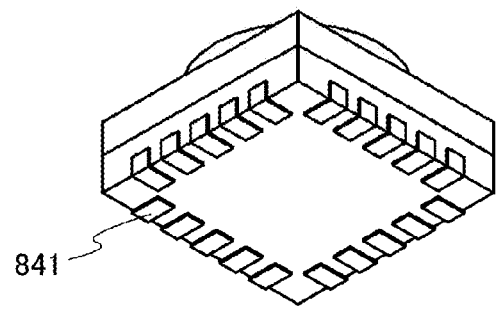

FIG. 49B is an external perspective view showing the bottom surface side of the camera module. On the bottom surface and four side surfaces of the package substrate 811, mounting lands 841 are provided; this structure can be called a quad flat no-lead package (QFN). Although QFN is employed here, quad flat package (QFP), the above BGA, or the like may be alternatively employed.

Figure 49C:
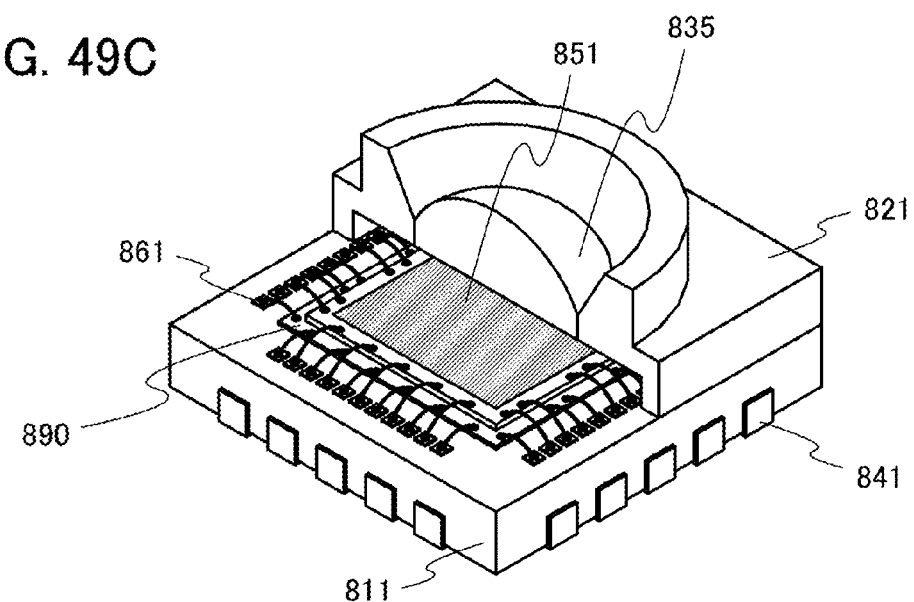
Figure 49D:
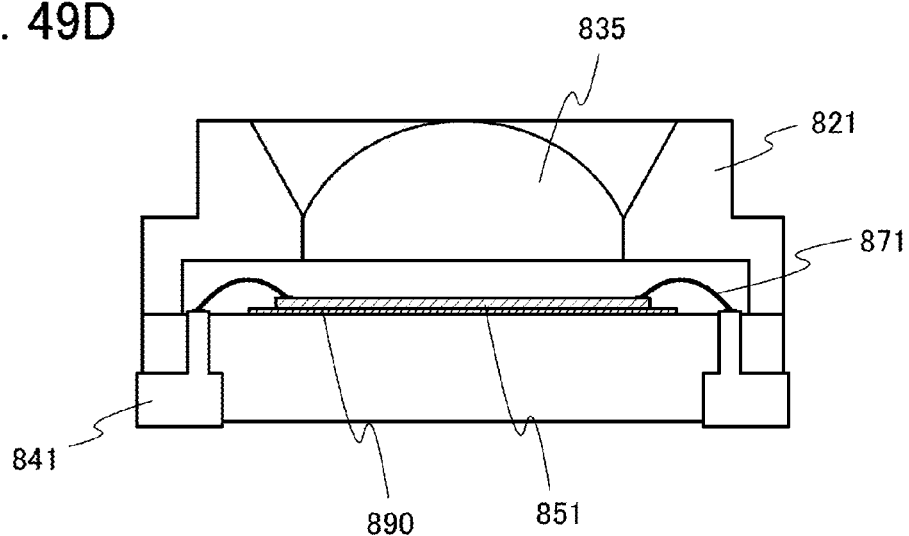

FIG. 49C is a perspective view of the module, in which the lens cover 821 and the lens 835 are partly illustrated. FIG. 49D is a cross-sectional view of the camera module. The lands 841 are partly used as electrode pads 861. The electrode pads 861 are electrically connected to electrodes of the image sensor chip 851 and the IC chip 890 through wires 871.

The image sensor chip can be easily mounted on a printed circuit board or the like by being provided in the package having the above structure, and can be incorporated into a variety of semiconductor devices or a variety of electronic devices.

The structures described in this embodiment can be used in appropriate combination with any of the structures described in the other embodiments.

Embodiment 6

Examples of an electronic device that can use the imaging device of one embodiment of the present invention or a semiconductor device including the imaging device include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 50A to 50F illustrate specific examples of these electronic devices.

Figure 50A:
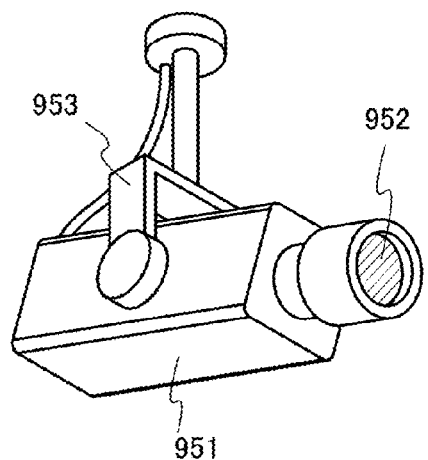
FIGS. 50A to 50F illustrate electronic devices.

FIG. 50A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 50B:
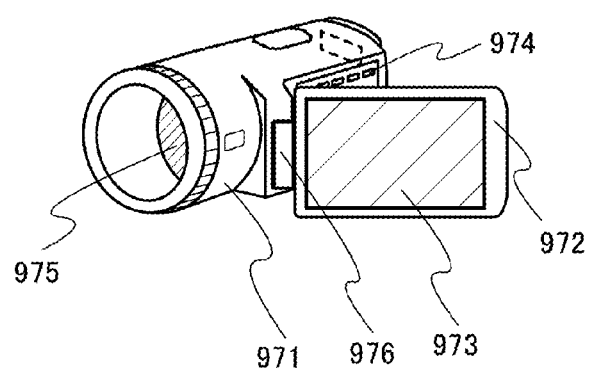

FIG. 50B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 50C:
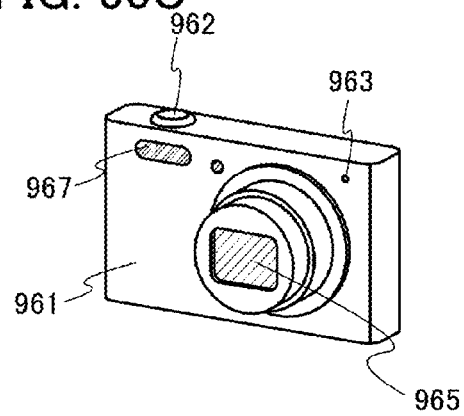

FIG. 50C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 50D:
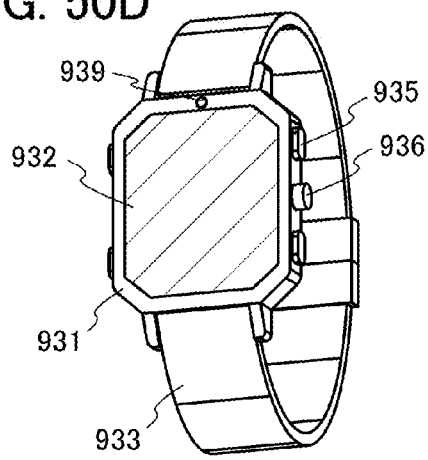

FIG. 50D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 50E:
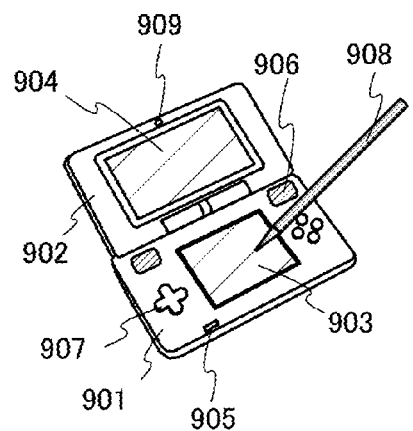

FIG. 50E illustrates a portable game machine, which includes housings 901 and 902, display portions 903 and 904, a microphone 905, speakers 906, an operation key 907, a stylus 908, a camera 909, and the like. Although the portable game machine in FIG. 50E has the two display portions 903 and 904, the number of display portions included in a portable game machine is not limited to this. The imaging device of one embodiment of the present invention can be included as one component in the portable game machine for obtaining an image.

Figure 50F:
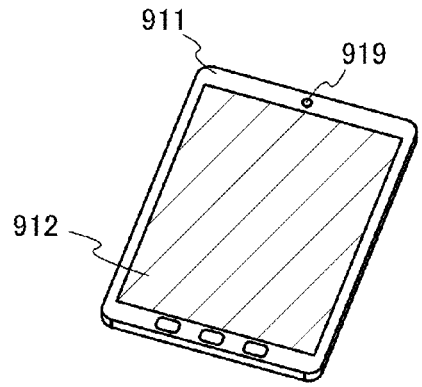

FIG. 50F illustrates a portable data terminal, which includes a housing 911, a display portion 912, a camera 919, and the like. A touch panel function of the display portion 912 enables input and output of information. The imaging device of one embodiment of the present invention can be included as one component for obtaining an image in the portable data terminal.

This embodiment can be combined with any of the other embodiments in this specification as appropriate.

This application is based on Japanese Patent Application serial No. 2015-153120 filed with Japan Patent Office on Aug. 3, 2015, the entire contents of which are hereby incorporated by reference.

What is claimed is:

1. An imaging device comprising:
   a pixel;
   a first circuit;
   a second circuit; and
   a third circuit,
   wherein the pixel is electrically connected to the first circuit,
   wherein the first circuit is electrically connected to the second circuit,
   wherein the second circuit is electrically connected to the third circuit,
   wherein the pixel is configured to output a first potential held in a charge accumulation portion,
   wherein the pixel is configured to output a second potential held in the charge accumulation portion,
   wherein the first potential corresponds to difference data between imaging data of a first frame and imaging data of a second frame,
   wherein the second potential corresponds to data when the charge accumulation portion is initialized,
   wherein the first circuit is configured to output a third potential that is obtained by adding an absolute value of a difference between the first potential and the second potential to a reference potential, or subtracting the absolute value from the reference potential,
   wherein the second circuit is configured to convert the third potential into n (n is a natural number of 1 or more)-bit first digital data,
   wherein the second circuit is configured to convert a magnitude of the third potential with respect to the reference potential into 1-bit second digital data,
   wherein the second circuit is configured to output n+1-bit digital data that is a combination of the first digital data and the second digital data, and
   wherein the third circuit is configured to store the n+1-bit digital data by compression.

2. The imaging device according to claim 1,
   wherein the pixel comprising:
   a first transistor;
   a second transistor;
   a third transistor;
   a fourth transistor;
   a fifth transistor;
   a first capacitor;
   a second capacitor;
   a third capacitor; and
   a photoelectric conversion element,
   wherein one electrode of the photoelectric conversion element is electrically connected to one of a source and a drain of the first transistor,
   wherein the other of the source and the drain of the first transistor is electrically connected to one of a source and a drain of the second transistor, wherein the other of the source and the drain of the first transistor is electrically connected to one electrode of the first capacitor, wherein the other of the source and the drain of the first transistor is electrically connected to one electrode of the second capacitor, wherein the other electrode of the second capacitor is electrically connected to one of a source and a drain of the third transistor, wherein the other electrode of the second capacitor is electrically connected to a gate electrode of the fourth transistor, wherein the other electrode of the second capacitor is electrically connected to one electrode of the third capacitor, and wherein one of a source and a drain of the fourth transistor is electrically connected to one of a source and a drain of the fifth transistor.

3. The imaging device according to claim 2, wherein each of the first to third transistors contains an oxide semiconductor in a region where a channel is formed, and wherein the oxide semiconductor contains In, Zn, and M (M is Al, Ti, Ga, Sn, Y, Zr, La, Ce, Nd, or Hf).

4. The imaging device according to claim 1, wherein the first circuit comprising:

a sixth transistor;

a seventh transistor;

a fourth capacitor; and a fifth capacitor, wherein one of a source and a drain of the sixth transistor is electrically connected to one of a source and a drain of the seventh transistor, wherein the one of the source and the drain of the sixth transistor is electrically connected to one electrode of the fourth capacitor, wherein the other of the source and the drain of the seventh transistor is electrically connected to one electrode of the fifth capacitor, and wherein the other electrode of the fourth capacitor is electrically connected to the pixel.

5. The imaging device according to claim 1, wherein the second circuit comprising:

a first comparator circuit comprising a first input terminal, a second input terminal, and a first output terminal;

a second comparator circuit comprising a third input terminal, a fourth input terminal, and a second output terminal;

an OR circuit comprising a fifth input terminal, a sixth input terminal, and a third output terminal;

a first latch circuit comprising a seventh input terminal, an eighth input terminal, and a fourth output terminal;

a second latch circuit comprising a ninth input terminal, a tenth input terminal, and a fifth output terminal;

a counter circuit comprising an eleventh input terminal, a twelfth input terminal, and n sixth output terminals;

a first wiring being capable of can supplying a first reference potential;

a second wiring being capable of supplying a second reference potential;

a third wiring being capable of supplying a clock signal; and first to (n+1)-th (n is a natural number of 1 or more) buffer circuits, wherein the first input terminal is electrically connected to the first circuit, wherein the second input terminal is electrically connected to the first wiring, wherein the third input terminal is electrically connected to the second wiring, wherein the fourth input terminal is electrically connected to the first circuit, wherein the first output terminal is electrically connected to the fifth input terminal, wherein the first output terminal is electrically connected to the seventh input terminal, wherein the second output terminal is electrically connected to the sixth input terminal, wherein the eighth input terminal is electrically connected to the third wiring, wherein the fourth output terminal is electrically connected to the ninth input terminal, wherein the tenth input terminal is electrically connected to the third output terminal, wherein the fifth output terminal is electrically connected to an input terminal of the (n+1)-th buffer circuit, wherein the eleventh input terminal is electrically connected to the third output terminal, wherein the twelfth input terminal is electrically connected to the third wiring, and wherein the n sixth output terminals are electrically connected to respective input terminals of the first to n-th buffer circuits.

6. The imaging device according to claim 1, wherein the third circuit comprising:

a memory element array;

a fourth circuit;

a fifth circuit;

a sixth circuit;

a seventh circuit;

an eighth circuit;

a ninth circuit;

a tenth circuit;

an eleventh circuit;

a twelfth circuit;

a thirteenth circuit;

a fourteenth circuit; and a fifteenth circuit, wherein the fourth circuit is configured to perform an encoding process on input digital data, wherein the fifth circuit is configured to temporarily store encoded digital data, wherein the sixth circuit is configured to divide digital data of plural bits to 1-bit digital data, wherein the seventh circuit is configured as a writing row decoder, wherein the eighth circuit is configured as a writing column decoder, wherein the ninth circuit is configured as a reading row decoder, wherein the tenth circuit is configured as a reading column decoder, wherein the eleventh circuit is configured to control a writing address of the memory element array, wherein the twelfth circuit is configured to control a reading address of the memory element array, wherein the thirteenth circuit is configured to calculate digital data corresponding to a difference between an address specified by the fourth circuit and an address specified by the fifth circuit, wherein the fourteenth circuit is configured to convert the digital data into analog data, and wherein the fifteenth circuit is configured to generate a clock signal having a different frequency based on the analog data.

7. The imaging device according to claim 1, wherein digital data stored in the third circuit is subjected to Run-length compression or Huffman compression.

8. The imaging device according to claim 2, wherein a photoelectric conversion layer of the photoelectric conversion element includes selenium or a compound containing selenium.

9. A module comprising the imaging device according to claim 1 and a lens.

10. An electronic device comprising the imaging device according to claim 1 and a display device.

11. An imaging device comprising:
a pixel comprising:
a first transistor;
a second transistor;
a third transistor;
a fourth transistor;
a fifth transistor;
a first capacitor;
a second capacitor;
a third capacitor; and
a photoelectric conversion element, and
a first circuit comprising:
a sixth transistor;
a seventh transistor;
a fourth capacitor; and
a fifth capacitor,
wherein one electrode of the photoelectric conversion element is electrically connected to one of a source and a drain of the first transistor,
wherein the other of the source and the drain of the first transistor is electrically connected to one of a source and a drain of the second transistor,
wherein the other of the source and the drain of the first transistor is electrically connected to one electrode of the first capacitor,
wherein the other of the source and the drain of the first transistor is electrically connected to one electrode of the second capacitor,
wherein the other electrode of the second capacitor is electrically connected to one of a source and a drain of the third transistor,
wherein the other electrode of the second capacitor is electrically connected to a gate electrode of the fourth transistor,
wherein the other electrode of the second capacitor is electrically connected to one electrode of the third capacitor,
wherein one of a source and a drain of the fourth transistor is electrically connected to one of a source and a drain of the fifth transistor,
wherein one of a source and a drain of the sixth transistor is electrically connected to one of a source and a drain of the seventh transistor,
wherein the one of the source and the drain of the sixth transistor is electrically connected to one electrode of the fourth capacitor,
wherein the other of the source and the drain of the seventh transistor is electrically connected to one electrode of the fifth capacitor, and
wherein the other electrode of the fourth capacitor is electrically connected to the pixel.

12. The imaging device according to claim 11,
wherein each of the first to third transistors contains an oxide semiconductor in a region where a channel is formed, and
wherein the oxide semiconductor contains In, Zn, and M (M is Al, Ti, Ga, Sn, Y, Zr, La, Ce, Nd, or Hf).

13. The imaging device according to claim 11, wherein a photoelectric conversion layer of the photoelectric conversion element includes selenium or a compound containing selenium.

14. A module comprising the imaging device according to claim 11 and a lens.

15. An electronic device comprising the imaging device according to claim 11 and a display device.

16. An imaging device comprising:
a pixel comprising:
a first transistor;
a second transistor;
a third transistor;
a fourth transistor;
a fifth transistor;
a first capacitor;
a second capacitor;
a third capacitor; and
a photoelectric conversion element, and
a second circuit comprising:
a first comparator circuit comprising a first input terminal, a second input terminal, and a first output terminal;
a second comparator circuit comprising a third input terminal, a fourth input terminal, and a second output terminal;
an OR circuit comprising a fifth input terminal, a sixth input terminal, and a third output terminal;
a first latch circuit comprising a seventh input terminal, an eighth input terminal, and a fourth output terminal;
a second latch circuit comprising a ninth input terminal, a tenth input terminal, and a fifth output terminal;
a counter circuit comprising an eleventh input terminal, a twelfth input terminal, and n sixth output terminals;
a first wiring being capable of can supplying a first reference potential;
a second wiring being capable of supplying a second reference potential;
a third wiring being capable of supplying a clock signal; and
first to (n+1)-th (n is a natural number of 1 or more) buffer circuits,
wherein one electrode of the photoelectric conversion element is electrically connected to one of a source and a drain of the first transistor,
wherein the other of the source and the drain of the first transistor is electrically connected to one of a source and a drain of the second transistor,
wherein the other of the source and the drain of the first transistor is electrically connected to one electrode of the first capacitor,
wherein the other of the source and the drain of the first transistor is electrically connected to one electrode of the second capacitor,
wherein the other electrode of the second capacitor is electrically connected to one of a source and a drain of the third transistor,
wherein the other electrode of the second capacitor is electrically connected to a gate electrode of the fourth transistor, wherein the other electrode of the second capacitor is electrically connected to one electrode of the third capacitor, and wherein one of a source and a drain of the fourth transistor is electrically connected to one of a source and a drain of the fifth transistor, wherein the first input terminal is electrically connected to the other of the source and the drain of the fifth transistor, wherein the second input terminal is electrically connected to the first wiring, wherein the third input terminal is electrically connected to the second wiring, wherein the fourth input terminal is electrically connected to the other of the source and the drain of the fifth transistor, wherein the first output terminal is electrically connected to the fifth input terminal, wherein the first output terminal is electrically connected to the seventh input terminal, wherein the second output terminal is electrically connected to the sixth input terminal, wherein the eighth input terminal is electrically connected to the third wiring, wherein the fourth output terminal is electrically connected to the ninth input terminal, wherein the tenth input terminal is electrically connected to the third output terminal, wherein the fifth output terminal is electrically connected to an input terminal of the (n+1)-th buffer circuit, wherein the eleventh input terminal is electrically connected to the third output terminal, wherein the twelfth input terminal is electrically connected to the third wiring, and wherein the n sixth output terminals are electrically connected to respective input terminals of the first to n-th buffer circuits.

17. The imaging device according to claim 16, wherein each of the first to third transistors contains an oxide semiconductor in a region where a channel is formed, and wherein the oxide semiconductor contains In, Zn, and M (M is Al, Ti, Ga, Sn, Y, Zr, La, Ce, Nd, or Hf).

18. The imaging device according to claim 16, wherein a photoelectric conversion layer of the photoelectric conversion element includes selenium or a compound containing selenium.

19. A module comprising the imaging device according to claim 16 and a lens.

20. An electronic device comprising the imaging device according to claim 16 and a display device.

* * * * *